(12) United States Patent
Nakahata et al.

(10) Patent No.: US 6,417,534 B2
(45) Date of Patent: *Jul. 9, 2002

(54) SEMICONDUCTOR DEVICE AND METHOD OF FABRICATING THE SAME

(75) Inventors: Takumi Nakahata; Satoshi Yamakawa; Yoshihiko Toyoda, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/158,605

(22) Filed: Sep. 23, 1998

(30) Foreign Application Priority Data

Sep. 26, 1997 (JP) ............................................. 9-262433
Feb. 20, 1998 (JP) ........................................... 10-038958

(51) Int. Cl.[7] .............................................. H01L 27/108
(52) U.S. Cl. ......................................... 257/306; 257/754
(58) Field of Search ................................. 257/296, 306, 257/754, 752, 753, 755, 756, 757

(56) References Cited

U.S. PATENT DOCUMENTS

| 5,717,250 A | * | 2/1998 | Schuele et al. | ............ 257/754 |
| 5,986,299 A | | 11/1999 | Nakamura et al. | .......... 257/296 |
| 6,005,268 A | | 12/1999 | Parekh et al. | ............... 257/296 |
| 6,031,288 A | | 2/2000 | Todorobaru et al. | ........ 257/754 |
| 6,150,689 A | * | 11/2000 | Narui et al. | ................ 257/306 |

OTHER PUBLICATIONS

US 5,932,901, 08/1999, Itabashi et al. (withdrawn)
"SiO2/SiSN4 High Selection Ratio in SAC Etching", Morio, Monthly Semiconductor World, Nov. 1995, pp. 83–85. Accompanied by English Comment.
"A 0.23 μm2 Double Self–Aligned Contact Cell for Gibabit DRAMs With a Ge–Added Vertical Epitaxial Si Pad", H. Koga et al., IEDM Tech. Dig., D589 (1996).

* cited by examiner

Primary Examiner—Sara Crane
(74) Attorney, Agent, or Firm—McDermott, Will & Emery

(57) ABSTRACT

A polysilicon film, a titanium silicide film and a titanium nitride film are formed in a storage node contact hole of a memory cell region, while a polysilicon film, a titanium silicide film and a titanium nitride film are formed in a bit line contact hole. In a peripheral circuit region, a peripheral circuit contact hole is formed in a silicon oxide film, and another peripheral circuit contact hole is formed in an interlayer insulation film and a silicon oxide film. Thus obtained are a semiconductor device reducing a leakage current, suppressing an electrical short and attaining a high-speed operation while readily forming each contact hole and a method of fabricating the same.

12 Claims, 49 Drawing Sheets

FIG. 64        PRIOR ART
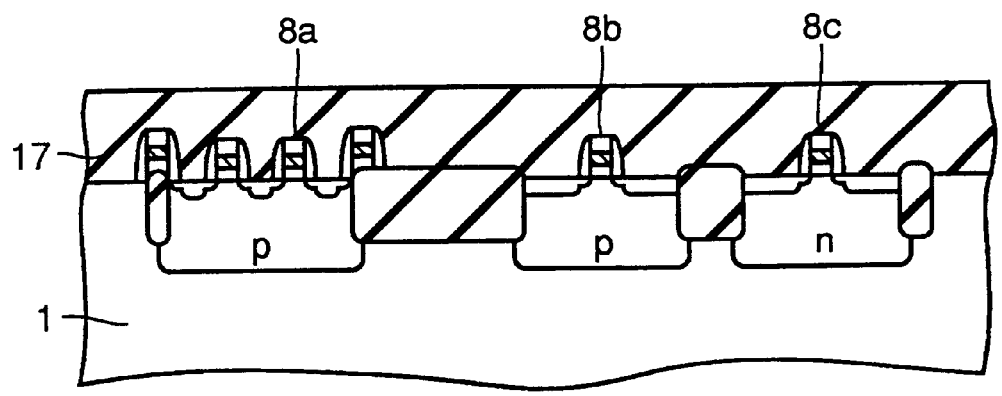
FIG. 65        PRIOR ART
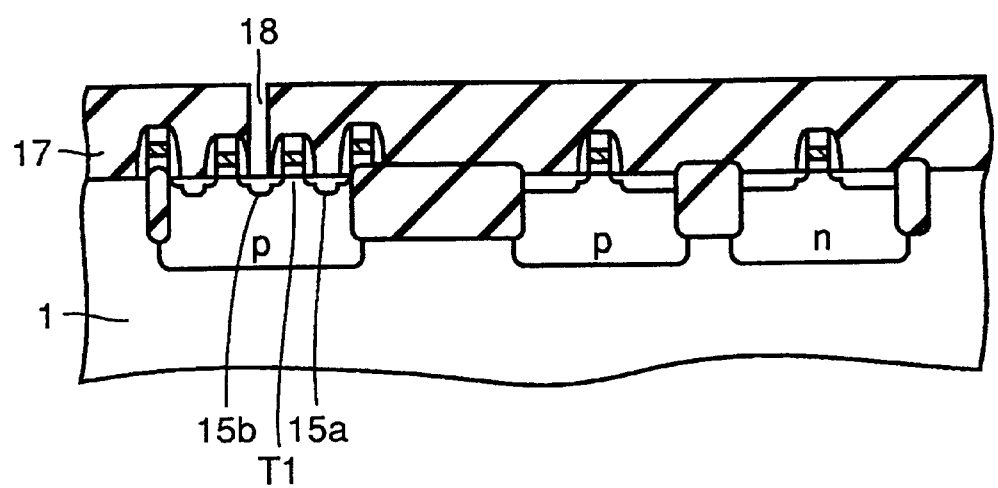

SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly, it relates to a semiconductor device which reduces a leakage current and improves its operating speed while electrically connecting an element of a memory cell region with that of a peripheral circuit region in an excellent state and a method of fabricating the same.

2. Description of the Prior Art

First, a method of fabricating a first exemplary conventional dynamic random access memory (hereinafter referred to as a DRAM), i.e., an exemplary conventional semiconductor device, is now described with reference to FIGS. 54 to 78.

Referring to FIG. 54, element isolation oxide films 2a and 2b are formed on prescribed regions of a silicon substrate 1 by trench isolation, for forming a memory cell region 1a and a peripheral circuit region 1b.

Referring to FIG. 55, boron is injected into the memory cell region 1a and a first area of the peripheral circuit region 1b, for forming p-type wells 3a and 3b respectively.

Referring to FIG. 56, phosphorus is injected into a second area of the peripheral circuit region 1b, for forming an n-type well 4.

Referring to FIG. 57, a gate oxide film 5 is formed on the silicon substrate 1 by thermal oxidation or the like. A polysilicon film and a tungsten silicide film 6 are formed on the gate oxide film 5. A silicon oxide film 7 is formed on the tungsten silicide film 6. Thereafter gate electrode portions 8a, 8b and 8c are formed by photolithography and etching.

Referring to FIG. 58, the n-type well 4 is covered with a photoresist pattern 48a and thereafter phosphorus is injected by ion implantation, for forming n$^-$ source/drain regions 9a, 9b, 9c and 9d. Thereafter the photoresist pattern 48a is removed.

Referring to FIG. 59, the p-type wells 3a and 3b are covered with a photoresist pattern 48b and thereafter boron is injected by ion implantation, for forming p$^-$ source/drain regions 10a and 10b. Thereafter the photoresist pattern 48b is removed.

Referring to FIG. 60, a silicon oxide film 11 is formed on the silicon substrate 1, to cover the gate electrode portions 8a, 8b and 8c.

Referring to FIG. 61, the silicon oxide film 11 is anisotropically etched for forming sidewall oxide films 12 on both side surfaces of the gate electrode portions 8a, 8b and 8c respectively.

Referring to FIG. 62, a photoresist film 48c is formed to cover the n-type well 4. Thereafter the photoresist film 48c is employed as a mask for injecting phosphorus by ion implantation, thereby forming n$^+$ source/drain regions 13a, 13b, 13c and 13d. Thus formed is a MOS transistor T1 of an LDD structure including n-type source/drain regions 15a and 15b and the gate electrode portion 8a. Further formed is a MOS transistor T2 of an LDD structure including n-type source/drain regions 15c and 15d and the gate electrode portion 8b. Thereafter the photoresist film 48c is removed.

Referring to FIG. 63, a photoresist film 48d is formed to cover the p-type wells 3a and 3b. Thereafter the photoresist film 48d is employed as a mask for injecting boron by ion implantation, thereby forming p$^+$ source/drain regions 14a and 14b. Thus formed is a MOS transistor T3 including p-type source/drain regions 16a and 16b and the gate electrode portion 8c. Thereafter the photoresist film 48d is removed.

Referring to FIG. 64, a silicon oxide film 17 is formed on the silicon substrate 1 to cover the gate electrode portions 8a, 8b and 8c.

Referring to FIG. 65, a bit line contact hole 18 exposing a surface of the n-type source/drain region 15b is formed in the silicon oxide film 17.

Referring to FIG. 66, a polysilicon film 40 is buried in the bit line contact hole 18.

Referring to FIG. 67, a bit line 25 electrically connected to the polysilicon film 40 is formed on the silicon oxide film 17.

Referring to FIG. 68, a silicon oxide film 26 is formed on the silicon oxide film 17, to cover the bit line 25.

Referring to FIG. 69, a storage node contact hole 41a exposing a surface of the n-type source/drain region 15a is formed in the silicon oxide films 17 and 26.

Referring to FIG. 70, a polysilicon film 42 is buried in the storage node contact hole 41a.

Referring to FIG. 71, a metal film of ruthenium or platinum is formed on the silicon oxide film 26, and a storage node 28a is formed by prescribed photolithography and etching.

Referring to FIG. 72, a thin film of a high dielectric constant and a metal film of ruthenium or platinum are successively formed on the storage node 28a. Thereafter a capacitor dielectric film 28b and a cell plate 28c are formed by prescribed photolithography and etching. The storage node 28a, the capacitor dielectric film 28b and the cell plate 28c form a capacitor 28.

Referring to FIG. 73, an interlayer insulation film 29 is formed on the silicon oxide film 26, to cover the capacitor 28.

Referring to FIG. 74, peripheral circuit contact holes 43a and 43b exposing surfaces of the n-type source/drain regions 15d and 15c are formed in the interlayer insulation film 29 and the silicon oxide films 17 and 26. Further, peripheral contact holes 43c and 43d are formed to expose surfaces of the p-type source/drain regions 16a and 16b. At the same time, a cell plate contact hole 30 is formed to expose a surface of the cell plate 28c of the capacitor 28.

Referring to FIG. 75, a titanium film 45 and a titanium nitride film 47a are formed in the cell plate contact hole 30 by sputtering or the like. Further, titanium films 22c, 22d, 22e and 22f and titanium nitride films 47b, 47c, 47d and 47e are formed in the peripheral circuit contact holes 43a, 43b, 43c and 43d respectively. FIG. 76 shows a portion around the n-type source/drain region 15d and the p-type source/drain region 16b in this step in an enlarged manner.

Thereafter heat treatment is performed to react the titanium films 22c, 22d, 22e and 22f with silicon contained in the n-type source/drain regions 15a, 15b, 15c and 15d and the p-type source/drain regions 16a and 16b, for forming titanium silicide films 24c, 24d, 24e and 24f. FIG. 77 shows the portion around the n-type source/drain region 15d and the p-type source/drain region 16b in this step.

Referring to FIG. 78, an aluminum copper film is formed on the interlayer insulation film 29, and metal wires 33 are formed by prescribed photolithography and etching. Thereafter an interlayer insulation film (not shown) and a passivation film (not shown) are formed to cover the metal wires 33, thereby completing the DRAM.

A method of fabricating a second exemplary conventional DRAM is now described with reference to FIGS. 79 to 86. After a step similar to that shown in FIG. 63 described with reference to the first prior art, a silicon nitride film 56 is formed on a semiconductor substrate 1 to cover gate electrode portions 8a, 8b and 8c, as shown in FIG. 79.

Referring to FIG. 80, a part of the silicon nitride film 56 formed on a peripheral circuit region 1b is removed. A silicon oxide film 17 is formed to cover the silicon nitride film 56 and the gate electrode portions 8b and 8c. A photoresist film 48g is formed on the silicon oxide film 17. This photoresist film 48g is employed as a mask for anisotropically etching the silicon oxide film 17, thereby forming an opening 62 exposing a surface of the silicon nitride film 56.

Referring to FIG. 81, the photoresist film 48g is employed as a mask to anisotropically etch the silicon nitride film 56, for forming a bit line contact hole 18c exposing a surface of an n-type source/drain region 15b. Thereafter the photoresist film 48g is removed. Referring to FIG. 82, a polysilicon film 40 is formed to fill up the bit line contact hole 18c. A bit line 25 electrically connected to the polysilicon film 40 is formed on the silicon oxide film 17.

Referring to FIG. 83, a silicon nitride film (not shown) is formed on the silicon oxide film 17. Prescribed etching is performed on the silicon nitride film, to leave a silicon nitride film 57a only on surfaces of the bit line 25. Referring to FIG. 84, a silicon oxide film 26 is formed on the silicon oxide film 17, to cover the silicon nitride film 57a. A photoresist film 48h is formed on the silicon oxide film 26. The photoresist film 48h is employed as a mask to anisotropically etch the silicon oxide films 26 and 16, for forming an opening 63 exposing a surface of the silicon nitride film 56.

Referring to FIG. 85, the silicon nitride film 56 is further anisotropically etched through the photoresist film 48h serving as a mask, thereby forming a storage node contact hole 41a exposing a surface of an n-type source/drain region 15a. Thereafter steps similar to those of the first prior art shown in FIGS. 70 to 78 are carried out, thereby obtaining the DRAM having a structure shown in FIG. 86.

In the memory cell region 1a of the DRAM according to the first or second prior art formed in the aforementioned manner, the storage node 28a of the capacitor 28 is electrically connected with the n-type source/drain region 15a of the MOS transistor T1 through the polysilicon film 42 buried in the storage node contact hole 41a. Further, the bit line 25 is electrically connected with the n-type source/drain region 15b of the MOS transistor T1 through the polysilicon film 40 buried in the bit line contact hole 18.

In the peripheral circuit region 1b, on the other hand, the wiring layers 33 are electrically connected with the n-type source/drain regions 15c and 15d of the MOS transistor T2 through the titanium silicide films 24c and 24d and the titanium nitride films 47b and 47c buried in the peripheral circuit contact holes 43a and 43b respectively. Further, the wiring layers 33 are electrically connected with the p-type source/drain regions 16a and 16b of the MOS transistor T3 through the titanium silicide films 24e and 24f and the titanium nitride films 47d and 47e buried in the peripheral circuit contact holes 43c and 43d respectively.

The reason for this is as follows: If a titanium nitride film and a titanium silicide film are formed in the storage node contact hole 41a of the memory cell region 1a, silicon contained in the source/drain region 15a is consumed in formation of the titanium silicide film, to result in an increased leakage current from the source/drain region 15a to the silicon substrate 1. If polysilicon films are formed in the peripheral circuit contact holes 43a, 43b, 43c and 43d of the peripheral circuit region 1b, on the other hand, the electrical resistance is so increased that no high-speed operation can be attained.

Thus, the polysilicon film 42 is formed in the storage node contact hole 41a in the memory cell region 1a, in order to reduce the leakage current. In the peripheral circuit region 1b, on the other hand, the titanium films 22c, 22d, 22e and 22f and the titanium nitride films 47b, 47c, 47d and 47e are formed in the peripheral circuit contact holes 43a, 43b, 43c and 43d respectively, in order to attain a high-speed operation rather than reduction leakage currents.

However, the DRAM according to each of the first prior art and the second prior art has the following problems: Due to increased storage capacity of the DRAM, refinement so progresses that it is estimated that the hole diameter of the bit line contact hole 18 or the storage node contact hole 41a of the memory cell region 1a is about 0.08 μm in a 1-Gbit DRAM, for example. It is also estimated that the depths of the bit line contact hole 18 and the storage node contact hole 41a are about 0.5 μm and about 0.8 μm respectively.

When the polysilicon films 40 and 42 are formed in the bit line contact hole 18 and the storage node contact hole 41a respectively, the electrical resistance thereof is increased in inverse proportion to the sectional areas of the contact holes 18 and 41a. It is conceivable that the operating speed of a memory cell in the memory cell region 1a cannot be increased as a result and it is difficult to attain a higher operating speed of the DRAM.

If titanium silicide films and titanium nitride films are formed in the storage node contact hole 41a and the bit line contact hole 18 of the memory cell region 1a in order to solve this problem, silicon contained in the n-type source/drain regions 15a and 15b is consumed in formation of the titanium silicide films, as described above. It is supposed that leakage currents flowing from the n-type source/drain regions 15a and 15b to the silicon substrate 1 are consequently increased.

On the other hand, it is estimated that the hole diameter and the depth of the peripheral circuit contact holes 43a, 43b, 43c and 43d in the peripheral circuit region 1b are about 0.15 μm and about 1.0 μm respectively. Thus, it is estimated that the aspect ratio of the hole diameter to the depth of the peripheral circuit contact holes 43a, 43b, 43c and 43d exceeds 6. Consequently, it is conceivably difficult to form the peripheral circuit contact holes 43a, 43b, 43c and 43d having a high aspect ratio in the interlayer insulation film 29 and the silicon oxide films 17 and 26.

When the cell plate contact hole 30 and the peripheral circuit contact holes 43a, 43b, 43c and 43d are simultaneously formed in the memory cell region 1a and the peripheral circuit region 1b respectively, further, the cell plate 28c is damaged by etching after its surface is exposed and before the surfaces of the n-type source/drain regions 15c and 15d and the p-type source/drain regions 16a and 16b are exposed. Thus, the cell plate contact hole 30 may be formed to pass through the cell plate 28c. In this case, it is conceivable that the capacitor 28 is electrically connected with the MOS transistors T2 and T3 of the peripheral circuit region 1b in an inferior state.

In the DRAM according to the second prior art, further, the following two problems are supposed in addition to the aforementioned problems: FIG. 87 illustrates the plane structure under the silicon nitride film 56 in the steps of forming the bit line contact hole 18c shown in FIGS. 80 and 81. FIGS. 80 and 81 show a section taken along the line L3—L3 in FIG. 87 in particular. Referring to FIG. 87, the opening 62 is formed to be located on a substantially central position of the n-type source/drain region 15b, in particular.

If the photoresist film 48g is misaligned in photolithography, however, some opening 62a may be formed over a part of the gate electrode 8a. In this case, etching must be further continued after a portion of the silicon nitride film 56 located on a shoulder portion of the gate electrode 8a is exposed to remove the silicon oxide film 17a in order to form the opening 62a, as shown in FIG. 88. FIG. 88 is a sectional view taken along the line L4—L4 in FIG. 87.

Particularly in a 1-Gbit DRAM, it is necessary to form a fine bit line contact hole having a large aspect ratio, as hereinabove described. In formation of the opening 62a in the actual process, therefore, gas ions for etching must indispensably be introduced into a deep portion of the opening 62a as shown by arrows, by setting an alternating voltage applied to the semiconductor substrate 1 at a relatively high level in an etching device.

In this case, however, it is supposed that the already exposed portion of the silicon nitride film 56 is eroded by the etching while the silicon oxide film 17a is removed, to expose the sidewall oxide film 12 as well as the polysilicon film 6 of the gate electrode portion 8a. If the bit line 25 is connected to the n-type source/drain region 15b of the MOS transistor T1 through the polysilicon film 40 buried in the bit line contact hole 18 in this case, the electrical connection is so inferiorly performed that the bit line 25 and the gate electrode 8a may be shorted depending on the degree of the etching. It is supposed that the MOS transistor T1 abnormally operates as a result.

A further problem is now described. FIG. 89 illustrates the plane structure under the bit line 25 in the step shown in FIG. 84. The section shown in FIG. 84 is taken along the line L5—L5 in FIG. 89. Referring to FIG. 89, the opening 63 is formed to be located on a substantially central position of the n-type source/drain region 15a in particular.

If the photoresist film 48h is misaligned in photolithography, however, some opening 63a may be formed over a part of the bit line 25. In this case, etching must be further continued after a portion of the silicon nitride film 57a formed on the surfaces of the bit line 25 is exposed to remove the silicon oxide films 26 and 17, as shown in FIG. 90. Therefore, it is supposed that the already exposed portion of the silicon nitride film 57a is eroded by excessive etching before the silicon oxide film 17 is removed in formation of the opening 63a, to expose the surfaces of the bit line 25. It is also supposed that the storage node 28a is electrically shorted with the bit line 25 through the polysilicon film 42 buried in the storage node contact hole 41a. It is further supposed that no desired operating characteristics of the DRAM are attained as a result. FIG. 90 shows a section taken along the line L6—L6 in FIG. 89.

SUMMARY OF THE INVENTION

The present invention has been proposed in order to solve the aforementioned supposable problems, and an object thereof is to provide a semiconductor device which reduces a leakage current, suppresses an electrical short and attains a high-speed operation while readily forming each contact hole and electrically connecting elements of a memory cell region and a peripheral circuit region with each other in an excellent state. Another object of the present invention is to provide a method of fabricating such a semiconductor device.

The semiconductor device according to the present invention comprises a semiconductor substrate, a first region, a first impurity region, a first conductor layer, a second conductor layer, a third conductor layer, a first insulator layer and a first conductor region. The semiconductor substrate has a major surface. The first region is formed on the major surface of the semiconductor substrate. The first impurity region is formed on a surface of the first region. The first conductor layer is formed on a surface of the first impurity region. The second conductor layer is formed on the first conductor layer. The third conductor layer is formed on the second conductor layer. The first insulator layer is formed on the semiconductor substrate to enclose the first to third conductor layers. The first conductor region is formed on the first insulator layer, and electrically connected with the third conductor layer. The first conductor layer contains silicon. The second conductor layer contains a compound of silicon and a prescribed metal. The third conductor layer contains the prescribed metal or a compound of this metal.

According to this structure, the first conductor region and the first impurity region are electrically connected with each other through the first to third conductor layers. Particularly when the second conductor layer is formed by heat treatment, the metal consumes the silicon contained in the first conductor layer. Thus, the first impurity region can be prevented from being influenced by the heat treatment. Consequently, a leakage current flowing from the first conductor region to the semiconductor substrate through the first impurity region is reduced. The second and third conductor layers contain the metal or the compound of the metal, whereby the electrical resistance between the first conductor region and the first impurity region can be reduced. Consequently, the operating speed of the semiconductor device is improved.

According to a first preferred aspect of the inventive semiconductor device, the first insulator layer has a first contact hole exposing a surface of the first conductor layer, and the second and third conductor layers are formed in the first contact hole.

In this case, etching ends on an upper surface of the first conductor layer in formation of the first contact hole, to be inhibited from damaging the region under the first conductor layer.

According to a second preferred aspect of the present invention, the semiconductor device further includes a pair of source/drain regions which are provided on the major surface of the first region at a space and a gate electrode which is formed on a region of the semiconductor substrate held between the source/drain regions with a gate insulator film interposed, the first one of the pair of source/drain regions includes the first impurity region, and the first conductor layer is formed in the vicinity of the gate electrode to partially cover the gate electrode while being electrically insulated from the gate electrode.

In this case, etching ends on the upper surface of the first conductor layer in formation of the first contact hole, to be inhibited from influencing the gate electrode. Consequently, the electrical insulation between the first conductor region and the gate electrode is improved, and the semiconductor device attains excellent electrical connection between the first conductor region and the source/drain regions.

According to a third preferred aspect of the present invention, the semiconductor device further includes a second impurity region which is formed on a major surface of the first region at a space from the first impurity region, a fourth conductor layer containing silicon which is formed on a surface of the second impurity region, a first protective layer which is formed to cover a surface of the first conductor region, and a second insulator layer which is formed on the first insulator layer to cover the first protective layer. The first and second insulator layers have a second contact hole exposing a surface of the fourth conductor layer. The semiconductor device further includes a fifth conductor layer, containing a compound of silicon and the prescribed metal, which is formed in the second contact hole and electrically connected with the fourth conductor layer, a sixth conductor layer, containing the prescribed metal or a compound of this metal, which is formed on the fifth conductor layer in the second contact hole, and a second conductor region which is formed on the second insulator layer and electrically connected with the sixth conductor layer.

In this case, the depth of the second contact hole is reduced by a value corresponding to the thickness of the fourth conductor layer to reduce the aspect ratio of the second contact hole as compared with the case of forming a contact hole directly exposing the surface of the second impurity region in formation of the second contact hole in the first and second insulator layers for electrically connecting the second conductor region and the second impurity region with each other. Even if the first conductor region is exposed due to misalignment or the like in formation of the second contact hole, therefore, the surface of the first conductor region can be inhibited from exposure resulting from excessive etching of the first protective layer. Consequently, the first and second conductor regions can be prevented from an electrical short by the fifth and sixth conductor layers formed in the second contact hole.

According to a fourth preferred aspect of the inventive semiconductor device, the second one of the pair of source/drain regions includes the second impurity region, and the gate electrode is formed on a region held between the first and second impurity regions.

In this case, a MOS transistor is so formed that the first and second conductor regions are connected to the first and second ones of the pair of source/drain regions respectively. This MOS transistor is electrically connected with the first and second conductor regions in an excellent state. Consequently, a semiconductor device including a MOS transistor which is prevented from an electrical short is obtained.

According to a fifth preferred aspect of the inventive semiconductor device, the first protective layer is a silicon nitride film, and the second insulator layer is a silicon oxide film.

In this case, the silicon oxide film can be readily selectively etched while substantially leaving the silicon nitride film in formation of the second contact hole. Thus, the surface of the first conductor region can be effectively inhibited from exposure.

According to a sixth preferred aspect of the present invention, the semiconductor device further includes a second region which is formed on the major surface of the semiconductor substrate and electrically insulated from the first region, a third impurity region which is formed on a surface of the second region, and a third insulator layer which is formed on the second insulator layer to cover the first and second regions. The first and second insulator layers have a third contact hole exposing a surface of the third impurity region. The third insulator layer has a fourth contact hole communicating with the third contact hole. The third insulator layer has a fifth contact hole exposing a surface of the second conductor region. The semiconductor device further includes a first columnar conductor which is formed in the third contact hole and electrically connected with the third impurity region, a second columnar conductor which is formed in the fourth contact hole and electrically connected with the first columnar conductor, a third columnar conductor which is formed in the fifth contact hole, a first wiring layer which is electrically connected with the second columnar conductor and formed on the third insulator layer, and a second wiring layer which is electrically connected with the third columnar conductor and formed on the third insulator layer.

In this case, the third columnar conductor electrically connects the first wiring layer on the first region with the second conductor region. The first and second columnar conductors electrically connect the second wiring layer on the second region with the third impurity region. The first columnar conductor is formed in the third contact hole. The second columnar conductor is formed in the fourth contact hole. The third columnar conductor is formed in the fifth contact hole. The third contact hole has a depth corresponding to the thickness of the first and second insulator layers, and the fourth contact hole has a depth corresponding to the thickness of the third insulator layer. As compared with the case of forming contact holes having depths corresponding to the thicknesses of the first to third insulator layers, therefore, the depths of the third and fourth contact holes are further reduced to reduce the aspect ratios respectively. Thus, the third and fourth contact holes are further readily formed and inhibited from defective opening, whereby the electrical connection between the second wiring layer and the third impurity region is improved. In simultaneous formation of the fourth and fifth contact holes, the exposed part of the surface of the second conductor region is exposed to etching gas for a time corresponding to that up to exposure of a surface of the first columnar conductor on the bottom of the fourth contact hole. As compared with the case of forming a contact hole directly exposing the surface of the third impurity region, therefore, the time for exposing the exposed part to the etching gas is reduced. Thus, the fifth contact hole can be prevented from partially passing through the second conductor region due to excessive etching of the second conductor region. Consequently, the first wiring layer is electrically connected with the second conductor region in an excellent state.

According to a seventh preferred aspect of the inventive semiconductor device, the first and second wiring layers are formed by the same layer.

In this case, the electrical connection between the second conductor region of the first region and the third impurity region of the second region is improved.

According to an eighth preferred aspect of the present invention, the semiconductor device further includes a relay conductor, larger in sectional area than the first columnar conductor, which is formed on the second insulator layer to intervene between the first and second columnar conductors.

In this case, the depth of the fourth contact hole is reduced by a value corresponding to the thickness of the relay conductor. Thus, the aspect ratio of the fourth contact hole is further reduced, so that the fourth contact hole can be readily formed. Further, the relay conductor has a larger sectional area than the first columnar conductor, whereby a surface of the relay conductor can be reliably exposed even if misalignment is caused in photolithography in formation of the fourth contact hole. Thus, the electrical connection between the second wiring layer and the third impurity region is further improved.

According to a ninth preferred aspect of the inventive semiconductor device, the relay conductor is formed by the same layer as the second conductor layer.

In this case, the relay conductor can be simultaneously formed in formation of the second conductor region, with no requirement for an additional step for forming the relay conductor.

According to a tenth preferred aspect of the inventive semiconductor device, the first region includes a plurality of element forming regions and an element isolation region for electrically insulating the element forming regions from each other, the gate electrode includes a first gate electrode portion extending on each element forming region and a second gate electrode portion, which is connected with the first gate electrode, extending on the element isolation region, and the semiconductor device further includes a second protective layer which is formed under the first insulator layer to cover the second gate electrode portion.

In this case, an opening having a relatively large opening area can be formed in the first insulator layer located in each element forming region. In other words, an opening having a reduced aspect ratio can be formed. Thus, a part of the second protective layer, which is formed to cover the gate electrode at first, covering the first gate electrode portion in the element forming region in particular is excessively etched so that only the second protective layer is exposed on the bottom of the opening without exposing the first gate electrode portion. When the exposed part of the second protective layer is thereafter removed, the surfaces of the first and second impurity regions are exposed substantially with no etching of the first gate electrode portion extending on each element forming region. The remaining part of the second protective layer covering the second gate electrode portion extending on the element isolation region is left unremoved. Thus, an opening for forming each element forming region can be readily formed in the first insulator layer without substantially etching the first gate electrode portion.

According to an eleventh preferred aspect of the inventive semiconductor device, the second protective layer is a silicon nitride film, and the first insulator layer is a silicon oxide film.

In this case, the silicon oxide film can be readily selectively etched while substantially leaving the silicon nitride film.

According to a twelfth preferred aspect of the present invention, the semiconductor device further includes a third region which is formed on the major surface of the semiconductor substrate and electrically insulated from the first region, a fourth impurity region which is formed on a surface of the third region, and a fourth insulator layer which is formed on the first insulator layer to cover the first and third regions. The first insulator layer has a sixth contact hole exposing a surface of the fourth impurity region. The fourth insulator layer has a seventh contact hole communicating with the sixth contact hole. The fourth insulator layer also has an eighth contact hole exposing the surface of the first conductor region. The semiconductor device further includes a fourth columnar conductor which is formed in the sixth contact hole and electrically connected with the fourth impurity region, a fifth columnar conductor which is formed in the seventh contact hole and electrically connected with the fourth columnar conductor, a sixth columnar conductor which is formed in the eighth contact hole, and a third wiring layer which is electrically connected with the fifth and sixth columnar conductors and formed on the fourth insulator layer.

In this case, the sixth columnar conductor electrically connects the third wiring layer on the first region with the first conductor region. The fourth and fifth columnar conductors electrically connect the third wiring layer on the third region with the fourth impurity region. The fourth columnar conductor is formed in the sixth contact hole. The fifth columnar conductor is formed in the seventh contact hole. The sixth columnar conductor is formed in the eighth contact hole. The sixth and seventh contact holes have depths corresponding to the thicknesses of the first and fourth insulator layers respectively. As compared with the case of forming a contact hole having a depth corresponding to the total thickness of the first and fourth insulator layers, therefore, the depths of the sixth and seventh contact holes are further reduced and the aspect ratios thereof are also reduced respectively. Thus, the sixth and seventh contact holes can be further readily formed and inhibited from defective opening, whereby the electrical connection between the third wiring layer and the fourth impurity region is improved. In simultaneous formation of the seventh and eighth contact holes, the exposed part of the surface of the first conductor region is exposed to etching gas for a time corresponding to that up to exposure of the surface of the fourth columnar conductor on the bottom of the seventh contact hole. As compared with the case of forming a contact hole directly exposing the surface of the fourth impurity region, therefore, the time for exposing the exposed part to the etching gas is reduced. Thus, the eighth contact hole can be prevented from partially passing through the first conductor region due to excessive etching of the first conductor region. Consequently, the first conductor region is electrically connected with the fourth impurity region in an excellent state through the third wiring layer.

According to a thirteenth preferred aspect of the inventive semiconductor device, the semiconductor substrate is a single-crystalline silicon substrate, and the first conductor layer contains silicon or a silicon-germanium alloy.

In this case, the first conductor layer can be readily formed on a prescribed region of the semiconductor substrate in self alignment.

According to a fourteenth preferred aspect of the inventive semiconductor device, the prescribed metal includes any metal selected from a group consisting of titanium, cobalt, zirconium and hafnium.

In this case, the silicon contained in the first conductor layer and the metal readily cause silicide reaction in formation of the second conductor layer. Thus, metal silicide is readily formed.

The method of fabricating a semiconductor device according to the present invention comprises the following steps: A first impurity region is formed on a major surface of a semiconductor substrate. A first conductor layer containing silicon is formed on a surface of the first impurity region. A conductive material layer containing a prescribed metal is formed on the first conductor layer and heat-treated, thereby forming a second conductor layer containing a compound of the silicon contained in the first conductor layer and the prescribed metal. A third conductor layer containing a metal or a compound of this metal is formed on the second conductor layer. A first insulator layer is formed on the semiconductor substrate to enclose the first to third conductor layers. A first conductor region electrically connected to the third conductor layer is formed on the first insulator layer.

According to this method, the metal reacts with the silicon contained in the first conductor layer to form metal silicide in formation of the second conductor layer by the heat treatment. Thus, the first impurity region is inhibited from being influenced by the heat treatment. Consequently, a leakage current flowing from the first conductor region to the semiconductor substrate through the first impurity region is suppressed. Further, the second conductor layer containing the metal or the compound of the metal and the third conductor layer reduce the electrical resistance between the first conductor region and the first impurity region. Consequently, a semiconductor device suppressing a leakage current and attaining improvement of its operating speed etc. can be readily fabricated.

According to a first preferred aspect of the inventive method of fabricating a semiconductor device, the steps of forming the second and third conductor layers include steps of forming a first contact hole exposing a surface of the first conductor layer in the first insulator layer and forming the second and third conductor layers in the first contact hole.

In this case, etching ends on an upper surface of the first conductor layer in formation of the first contact hole, to be inhibited from damaging the region under the first conductor layer. As compared with the case of forming a contact hole exposing a surface of the first impurity region, the depth of the first contact hole can be reduced by a value corresponding to the thickness of the first conductor layer and the aspect ratio thereof is also reduced. Consequently, the first contact hole can be readily formed.

According to a second preferred aspect of the present invention, the method of fabricating a semiconductor device further includes steps of forming a gate electrode on the major surface of the semiconductor substrate with a gate insulator film interposed and forming a pair of source/drain regions on the major surface of the semiconductor substrate both sides of the gate electrode, the step of forming the source/drain regions includes the step of forming the first impurity region, and the step of forming the first conductor layer includes a step of forming the same in the vicinity of the gate electrode to partially cover the gate electrode while being electrically insulated from the gate electrode.

In this case, etching ends on the upper surface of the first conductor layer in formation of the first contact hole, to be inhibited from influencing the gate electrode. Thus, the electrical connection between the first conductor region and the source/drain regions can be improved.

According to a third preferred aspect of the present invention, the method of fabricating a semiconductor device further includes steps of forming a second impurity region on the major surface of the semiconductor substrate at a space from the first impurity region and forming a fourth conductor layer containing silicon on the second impurity region in advance of the step of forming the first insulator layer. The method further includes steps of forming a first protective layer on the surface of the first conductor region, forming a second insulator layer on the first insulator layer to cover the first protective layer, forming a second contact hole exposing a surface of the fourth conductor layer in the first and second insulator layers, forming a conductive material layer containing a prescribed metal in the second contact hole and simultaneously heat-treating the same thereby forming a fifth conductor layer containing a compound of the silicon contained in the fourth conductor layer and the aforementioned prescribed metal, forming a sixth conductor layer containing a metal or a compound of this metal on the fifth conductor layer in the second contact hole, and forming a second conductor region electrically connected with the sixth conductor layer on the second insulator layer.

In this case, the depth of the second contact hole is reduced by a value corresponding to the thickness of the fourth conductor layer and the aspect ratio thereof is also reduced in formation of the second contact hole in the first and second insulator layers as compared with the case of forming a contact hole directly exposing the surface of the second impurity region. Thus, the second contact hole can be formed in a shorter time. Even if the first conductor region is exposed due to misalignment or the like in formation of the second contact hole, therefore, the surface of the first conductor region can be inhibited from exposure resulting from excessive etching of the first protective layer. Consequently, the first and second conductor regions can be prevented from an electrical short by the fifth and sixth conductor layers formed in the second contact hole.

According to a fourth preferred aspect of the inventive method of fabricating a semiconductor device, the step of forming the pair of source/drain regions includes the steps of forming the first and second impurity regions, and the step of forming the gate electrode includes a step of forming the same on a region of the semiconductor substrate held between the first and second impurity regions.

In this case, a MOS transistor is so formed that the first and second conductor regions are connected to the first and second ones of the pair of source/drain regions respectively. Further, the first and second conductor regions can be prevented from an electrical short.

According to a fifth preferred aspect of the inventive method of fabricating a semiconductor device, a silicon nitride film is employed as the first protective layer, and a silicon oxide film is employed as the second insulator layer.

In this case, the silicon oxide film can be readily selectively etched while substantially leaving the silicon nitride film in formation of the second contact hole. Thus, the surface of the first conductor region can be effectively inhibited from exposure.

According to a sixth preferred aspect of the present invention, the method of fabricating a semiconductor device further includes steps of forming a first region including the first and second impurity regions, forming a second region which is electrically insulated from the first region on the major surface of the semiconductor substrate, and forming a third impurity region on a major surface of the second region in advance of the step of forming the first insulator layer. The method further includes steps of forming a third contact hole exposing a surface of the third impurity region in the first and second insulator layers, forming a first columnar conductor in the third contact hole, forming a third insulator layer on the second insulator layer to cover surfaces of the second conductor region and the first columnar conductor, forming fourth and fifth contact holes exposing surfaces of the first columnar conductor and the second conductor region respectively in the third insulator layer, forming a second columnar conductor in the fourth contact hole, forming a third columnar conductor in the fifth contact hole, and forming first and second wiring layers which are electrically connected with the third and second columnar conductors respectively on the third insulator layer in advance of the step of forming the first insulator layer.

In this case, the third and fourth contact holes have depths corresponding to the thickness of the first and second insulator layers and that of the third insulator layer respectively. As compared with the case of forming a contact hole directly exposing a surface of the third impurity region in the first to third insulator layers, therefore, the aspect ratios of the third and fourth contact holes are reduced respectively.

Thus, the third and fourth contact holes can be readily formed respectively. Consequently, the third and fourth contact holes are inhibited from defective opening, and the electrical connection between the second wiring layer and the third impurity region is improved. In simultaneous formation of the fourth and fifth contact holes, the part of the surface of the second conductor region exposed on the bottom of the fifth contact hole is thereafter exposed to etching gas for a time corresponding to that up to exposure of the surface of the first columnar conductor on the bottom of the fourth contact hole. As compared with the case of forming a contact hole directly exposing the surface of the third impurity region, therefore, the time for exposing the exposed part to the etching gas is reduced. Thus, the fifth contact hole can be inhibited from partially passing through the second conductor region due to excessive etching of the second conductor region. Consequently, the electrical connection between the first wiring layer and the second conductor region is improved.

According to a seventh preferred aspect of the present invention, the method of fabricating a semiconductor device further includes a step of forming a relay conductor, which is electrically connected with the first columnar conductor, having a larger sectional area than the first columnar conductor on the second insulator layer between the steps of forming the first and second columnar conductors.

In this case, the depth of the fourth contact hole is reduced by a value corresponding to the thickness of the relay conductor. Thus, the aspect ratio of the fourth contact hole is further reduced, so that the fourth contact hole can be further readily opened. Further, the relay conductor has a larger sectional area than the first columnar conductor, whereby its surface can be reliably exposed even if misalignment is caused in photolithography in formation of the fourth contact hole. Thus, the electrical connection between the second wiring layer and the third impurity region is further improved.

According to an eighth preferred aspect of the inventive method of fabricating a semiconductor device, the step of forming the relay conductor is carried out simultaneously with the step of forming the second conductor region.

In this case, the relay conductor can be readily formed simultaneously with formation of the second conductor region, with no requirement for an additional step for forming the relay conductor.

According to a ninth preferred aspect of the present invention, the method of fabricating a semiconductor device further includes steps of forming a plurality of element forming regions and an element isolation region electrically insulating the element forming regions from each other in the first region, forming a first gate electrode portion extending on each element forming region and a second gate electrode, which is connected with the first gate electrode portion, extending on the element isolation region as the gate electrode, and forming a second protective layer to cover the gate electrode in advance of the step of forming the first insulator layer. The method further includes steps of forming an opening exposing a surface of the second protective layer on the first insulator layer located on each element forming region including a portion on the first gate electrode portion and exposing a surface of the element forming region including the first gate electrode portion by removing the exposed part of the second protective layer.

In this case, an opening having a relatively large opening area can be formed in the first insulator layer located in the element forming region. In other words, an opening having a reduced aspect ratio can be formed. Thus, a part of the second protective layer, which is formed to cover the gate electrode at first, covering the first gate electrode portion in the element forming region in particular is excessively etched so that only the second protective layer is exposed on the bottom of the opening without exposing the first gate electrode portion. When the exposed part of the second protective layer is thereafter removed, the surfaces of the first and second impurity regions are exposed substantially with no etching of the first gate electrode portion extending on each element forming region. The remaining part of the second protective layer covering the second gate electrode portion extending on the element isolation region is left unremoved. Thus, the electrical isolation between insulation the first and second conductor regions formed on the element forming region and the gate electrode is improved, and the electrical connection between the source/drain regions of the MOS transistor and the first and second conductor regions is also improved.

According to a tenth preferred aspect of the inventive method of fabricating a semiconductor device, a silicon nitride film is employed as the second protective layer, and a silicon oxide film is employed as the first insulator layer.

In this case, the silicon oxide film can be readily selectively removed while substantially leaving the silicon nitride film.

According to an eleventh preferred aspect of the inventive method of fabricating a semiconductor device, a silicon substrate is employed as the semiconductor substrate, and the step of forming the first conductor layer includes a step of forming a layer of silicon or a silicon-germanium alloy.

In this case, the first conductor layer can be readily formed on a prescribed region of the semiconductor substrate in self alignment. Further, contact resistance between the first conductor layer and the semiconductor substrate can be reduced.

According to a twelfth preferred aspect of the inventive method of fabricating a semiconductor device, a metal selected from a group consisting of titanium, cobalt, zirconium and hafnium is employed as the metal.

In this case, the silicon contained in the first conductor layer and the metal readily cause silicide reaction in formation of the second conductor layer, to readily form metal silicide.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 64 is a cross sectional view showing a step carried out after that shown in FIG. 63;

FIG. 65 is a cross sectional view showing a step carried out after that shown in FIG. 64;

DESCRIPTION OF THE PREFERRED EMBODIMENTS

Embodiment 1

Figure 1:
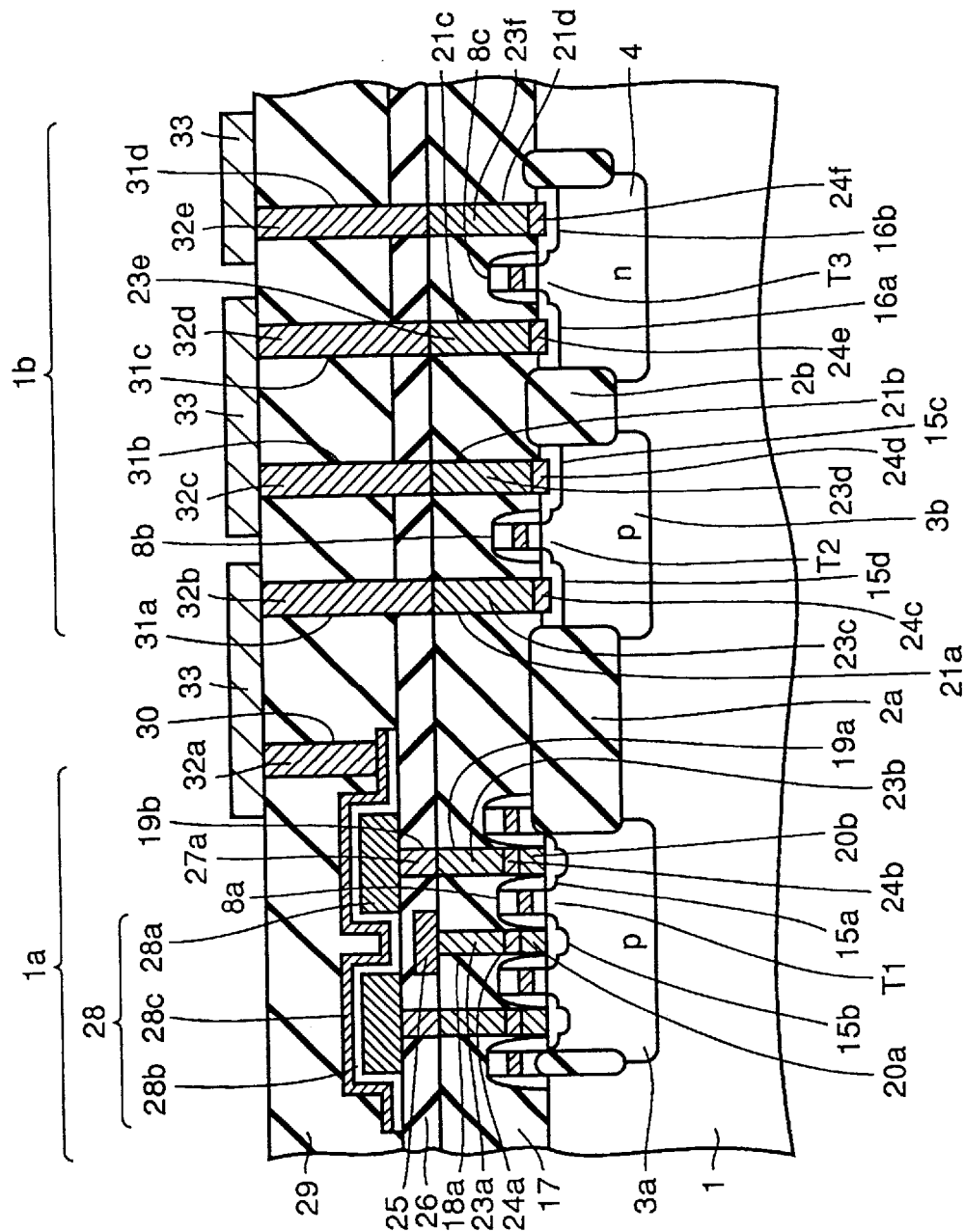
FIG. 1 is a cross sectional view showing a DRAM according to an embodiment 1 of the present invention.

A DRAM according to an embodiment 1 of the present invention is now described with reference to FIG. 1. Referring to FIG. 1, a memory cell region 1a serving as a first region and a peripheral circuit region 1b serving as a second or third region, which are electrically insulated from each other by an element isolation oxide film 2a, are formed on a silicon substrate 1. A p-type well 3a is formed in the memory cell region 1a. A p-type well 3b and an n-type well 4, which are electrically insulated from each other by an element isolation oxide film 2b, is formed in the peripheral circuit region 1b.

A pair of n-type source/drain regions 15a and 15b are formed in the p-type well 3a at a prescribed space. A gate electrode portion 8a is formed on a region held between the pair of n-type source/drain regions 15a and 15b with a gate oxide film interposed. The pair of n-type source/drain regions 15a and 15b and the gate electrode portion 8a form an n-channel MOS transistor T1. Sidewall oxide films are formed on both side surfaces of the gate electrode portion 8a.

A pair of n-type source/drain regions 15c and 15d are formed in the p-type well 3b at a prescribed space. A gate electrode portion 8b is formed on a region held between the pair of n-type source/drain regions 15c and 15d with a gate oxide film interposed. The pair of n-type source/drain regions 15c and 15d and the gate electrode portion 8b form an n-channel MOS transistor T2.

A pair of p-type source/drain regions 16a and 16b are formed in the n-type well 4 at a prescribed space. A gate electrode portion 8c is formed on a region held between the pair of p-type source/drain regions 16a and 16b with a gate oxide film interposed. The pair of p-type source/drain regions 16a and 16b and the gate electrode portion 8c form a p-channel MOS transistor T3.

A silicon oxide film 17 is formed on the silicon substrate 1 to cover the MOS transistors T1, T2 and T3. A bit line contact hole 18a, a storage node contact hole 19a and peripheral circuit contact holes 21a, 21b, 21c and 21d are formed in the silicon oxide film 17. Conductor layers are formed in the bit line contact hole 18a and the storage node contact hole 19a respectively.

Namely, a polysilicon film 20a, a titanium silicide film 24a and a titanium nitride film 23a serving as first, second and third conductor layers respectively are formed in the bit line contact hole 18a. On the other hand, a polysilicon film 20b, a titanium silicide film 24b and a titanium nitride film 23b serving as first, second and third conductor layers respectively are formed in the storage node contact hole 19a.

Titanium silicide films 24c, 24d, 24e and 24f and titanium nitride films 23c, 23d, 23e and 23f are formed in the peripheral circuit contact holes 21a, 21b, 21c and 21d respectively. A bit line 25 serving as a first conductor region is formed on the silicon oxide film 17. A silicon oxide film 26 is formed on the silicon oxide film 17, to cover the bit line 25. A storage node contact hole 19b is formed in the silicon oxide film 26. A titanium nitride film 27a is formed in the storage node contact hole 19b.

A storage node 28a is formed on the silicon oxide film 26. A cell plate 28c is formed on the storage node 28a with a capacitor dielectric film 28b interposed. The storage node 28a, the capacitor dielectric film 28b and the cell plate 28c form a capacitor 28 serving as a first or second conductor region. An interlayer insulation film 29 is formed on the silicon oxide film 26, to cover the capacitor 28.

A cell plate contact hole 30 serving as a fifth or eighth contact hole exposing a surface of the cell plate 28c is formed in the interlayer insulation film 29. Further, peripheral circuit contact holes 31a, 31b, 31c and 31d are formed to expose surfaces of the titanium nitride films 23c, 23d, 23e and 23f respectively.

A titanium nitride film 32a is formed in the cell plate contact hole 30. Titanium nitride films 32b, 32c, 32d and 32e are formed in the peripheral circuit contact holes 31a, 31b, 31c and 31d respectively. Metal wires 33 serving as first, second and third wiring layers are formed on the interlayer insulation film 29.

In the aforementioned DRAM, the titanium silicide films 24a and 24b in the bit line contact hole 18a and the storage node contact hole 19a are formed by reacting titanium and silicon by heat treatment, as described later. At this time, the polysilicon films 20a and 20b are present between the n-type source/drain regions 15a and 15b and the titanium. Thus, the titanium reacts with the silicon contained in the polysilicon films 20a and 20b, and can be prevented from reacting with the silicon contained in the n-type source/drain regions 15a and 15b. Consequently, leakage currents leaking from the n-type source/drain regions 15a and 15b to the semiconductor substrate 1 can be reduced.

Further, the titanium nitride films 23a, 23b and 27a are also formed in the bit line contact hole 18a and the storage node contact holes 19a and 19b respectively. Thus, the electrical resistance between the bit line 25 and the n-type source/drain region 15b and that between the storage node 28a of the capacitor 28 and the n-type source/drain region 15a are reduced. Consequently, the memory cell region 1a attains a high-speed operation, and the speed of the overall DRAM including the peripheral circuit region 1b is improved.

As contact holes in the peripheral circuit region 1b, the peripheral circuit contact holes 21a, 21b, 21c and 21d are formed in the silicon oxide film 17 and the peripheral circuit contact holes 31a, 31b, 31c and 31d are formed in the interlayer insulation film 29 and the silicon oxide film 26. As compared with the case of forming contact holes in the interlayer insulation film 29 and the silicon oxide films 17 and 26 through a single step, therefore, the aspect ratios of the respective peripheral circuit contact holes 21a to 21d and 31a to 31d are further reduced so that the peripheral circuit contact holes 21a to 21d and 31a to 31d can be readily formed.

When the cell plate contact hole 30 and the peripheral circuit contact holes 31a, 31b, 31c and 31d are simultaneously formed, a surface of the cell plate 28c is exposed on the bottom of the cell plate contact hole 30 in advance. The exposed surface of the cell plate 28c is exposed to plasma for a time corresponding to that required for etching up to exposure of surfaces of the titanium nitride films 23c, 23d, 23e and 23f buried in the peripheral circuit contact holes 21a, 21b, 21c and 21d. As compared with the case of forming contact holes exposing surfaces of the n- and p-type source/drain regions 15a, 15b, 16a and 16b, therefore, the time for exposing the cell plate 28c to the plasma is reduced. Thus, the cell plate 28c can be prevented from being damaged by the etching, or the cell plate contact hole 30 can be prevented from passing through the cell plate 28c.

Consequently, the electrical connection between an element such as the capacitor 28 formed on the memory cell region 1a and elements such as the MOS transistors T2 and T3 formed in the peripheral circuit region 1b is improved.

While the polysilicon films 20a and 20b are formed in the bit line contact hole 18a and the storage node contact hole 19a as first conductor layers respectively in this embodiment, a similar effect can be attained by forming films of epitaxial silicon or an epitaxial silicon-germanium alloy in place of the polysilicon films 20a and 20b.

Further, the metal reacting with the silicon to readily form a silicide compound may be prepared from cobalt, zirconium or hafnium, in place of titanium.

Embodiment 2

As an embodiment 2 of the present invention, an exemplary method of fabricating the DRAM according to the embodiment 1 of the present invention is now described with reference to FIGS. 2 to 17.

Figure 2:
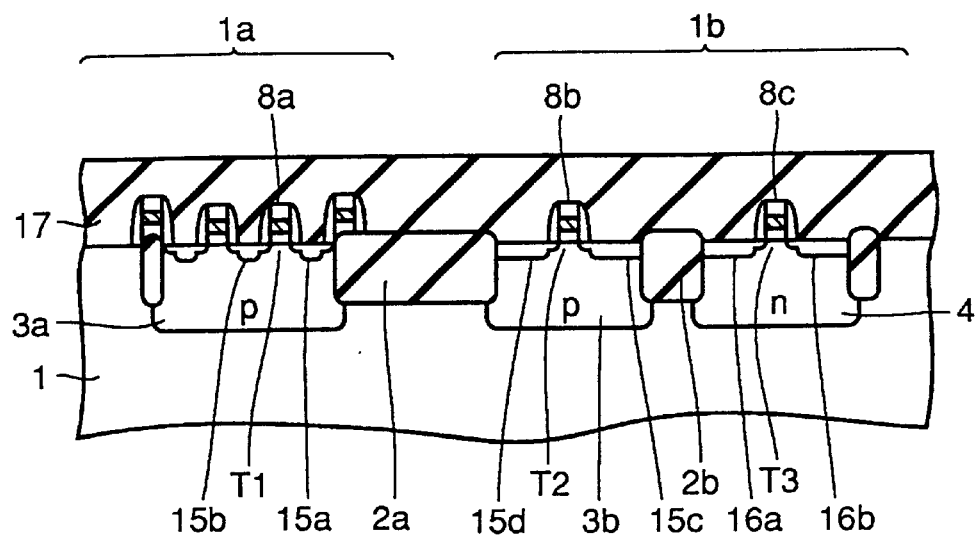
FIG. 2 is a cross sectional view showing a step in a method of fabricating a DRAM according to an embodiment 2 of the present invention.

Steps up to that shown in FIG. 2 are similar to those of the prior art shown in FIGS. 54 to 64, and hence redundant description is omitted.

Figure 3:
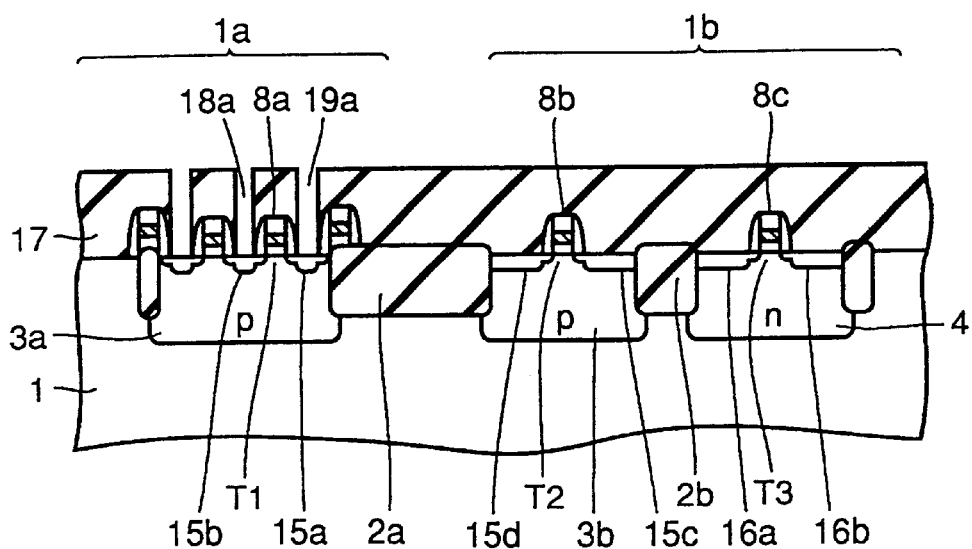
FIG. 3 is a cross sectional view showing a step carried out after that shown in FIG. 2 in the embodiment 2 of the present invention.

Referring to FIG. 3, a storage node contact hole 19a and a bit line contact hole 18a exposing surfaces of the n-type source/drain regions 15a and 15b respectively are formed in a silicon oxide film 17.

Figure 4:
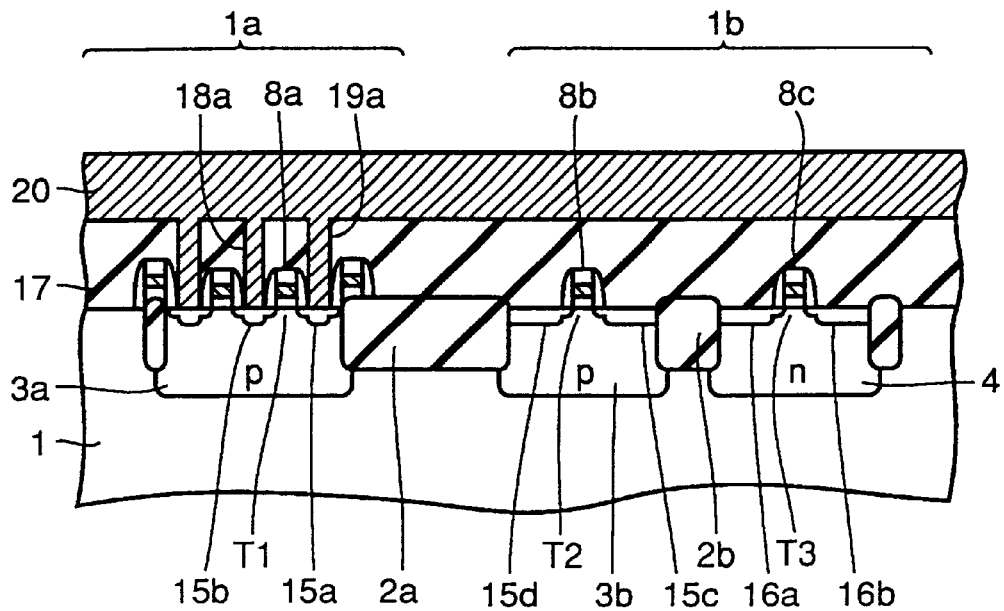
FIG. 4 is a cross sectional view showing a step carried out after that shown in FIG. 3 in the embodiment 2 of the present invention.

Referring to FIG. 4, a polysilicon film 20 is formed on the silicon oxide film 17 to fill up the storage node contact hole 19a and the bit line contact hole 18a.

Figure 5:
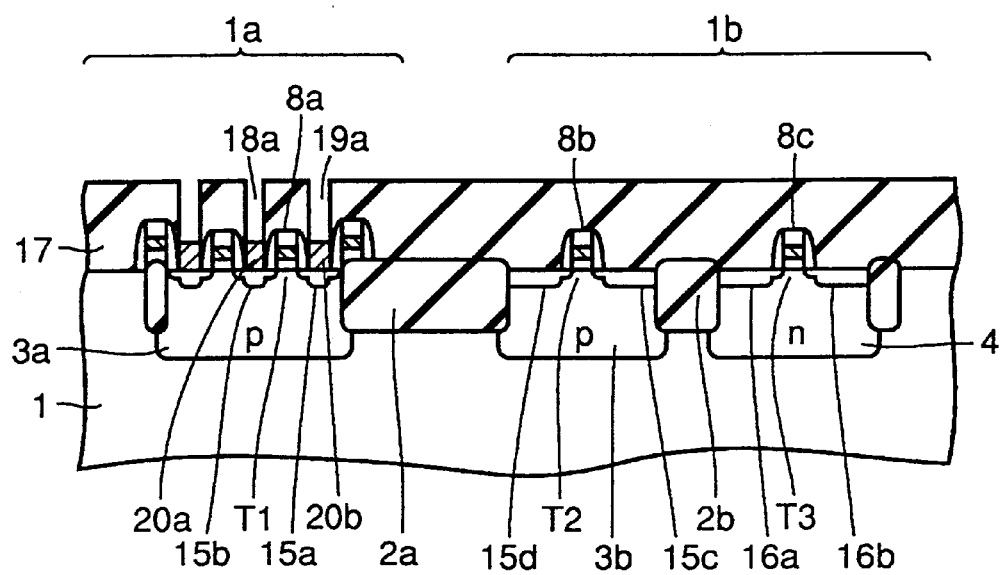
FIG. 5 is a cross sectional view showing a step carried out after that shown in FIG. 4 in the embodiment 2 of the present invention.

Referring to FIG. 5, the polysilicon film 20 is so etched as to leave polysilicon films 20a and 20b only in the vicinity of the bottoms of the bit line contact hole 18a and the storage node contact hole 19a respectively. At this time, the polysilicon films 20a and 20b are preferably 50 to 200 nm in thickness. The thickness of the polysilicon films 20a and 20b can be readily controlled by adjusting the etching time for the polysilicon film 20.

Figure 6:
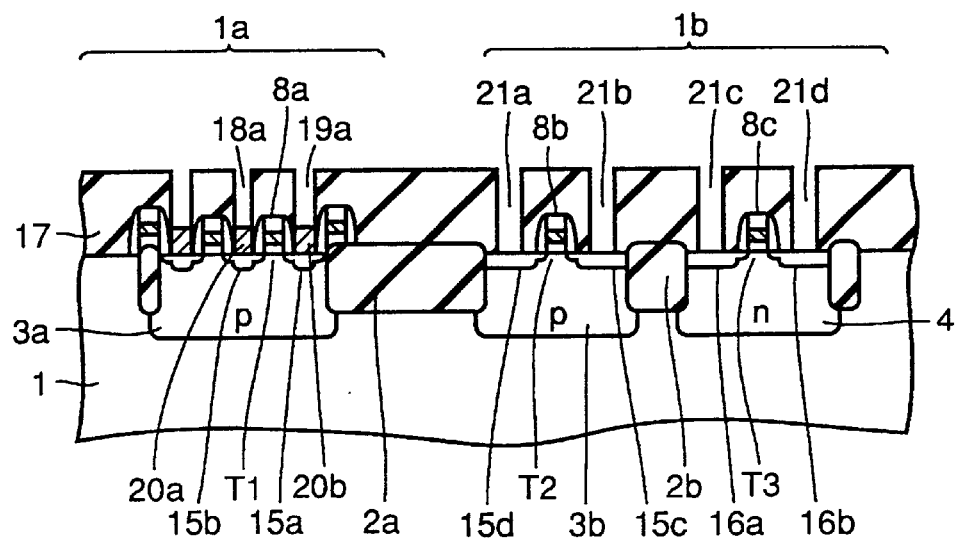
FIG. 6 is a cross sectional view showing a step carried out after that shown in FIG. 5 in the embodiment 2 of the present invention.

Referring to FIG. 6, a prescribed photoresist film (not shown) is formed on the silicon oxide film 17 and employed as a mask for forming peripheral circuit contact holes 21a and 21b exposing surfaces of n-type source/drain regions 15d and 15c respectively in the silicon oxide film 17, while forming peripheral contact holes 21c and 21d exposing surfaces of p-type source/drain regions 16a and 16b respectively.

Figure 7:
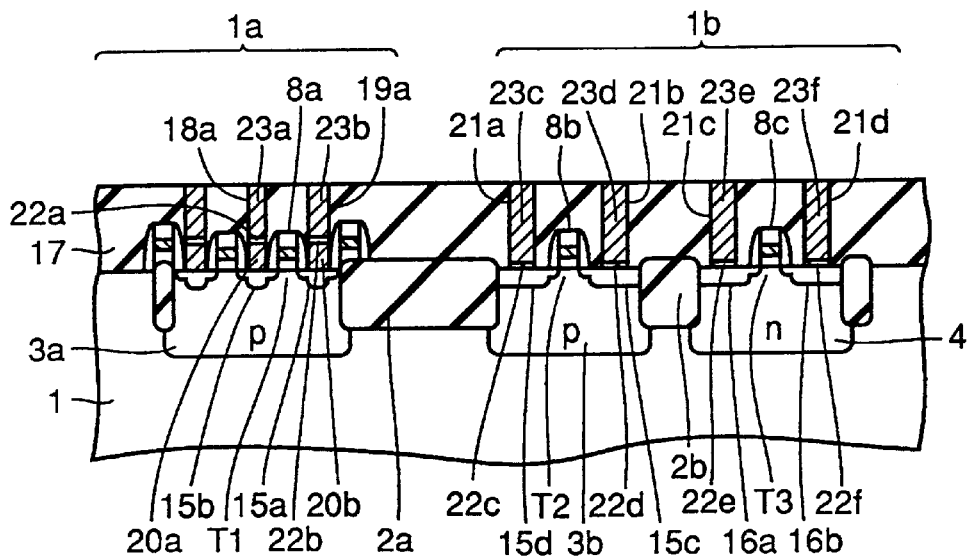
FIG. 7 is a cross sectional view showing a step carried out after that shown in FIG. 6 in the embodiment 2 of the present invention.

Referring to FIG. 7, a titanium film is formed on the silicon oxide film 17 by sputtering or the like. At this time, titanium films 22a and 22b are formed on the polysilicon films 20a and 20b in the bit line contact hole 18a and the storage node contact hole 19a respectively. Titanium films 22c, 22d, 22e and 22f are formed on the n-type source/drain regions 15d and 15c and the p-type source/drain regions 16a and 16b exposed on the bottoms of the peripheral circuit contact holes 21a, 21b, 21c and 21d respectively. Referring to FIG. 7, the titanium film formed on the silicon oxide film 17 and side surfaces of the bit line contact hole 18a is omitted.

Figure 8:
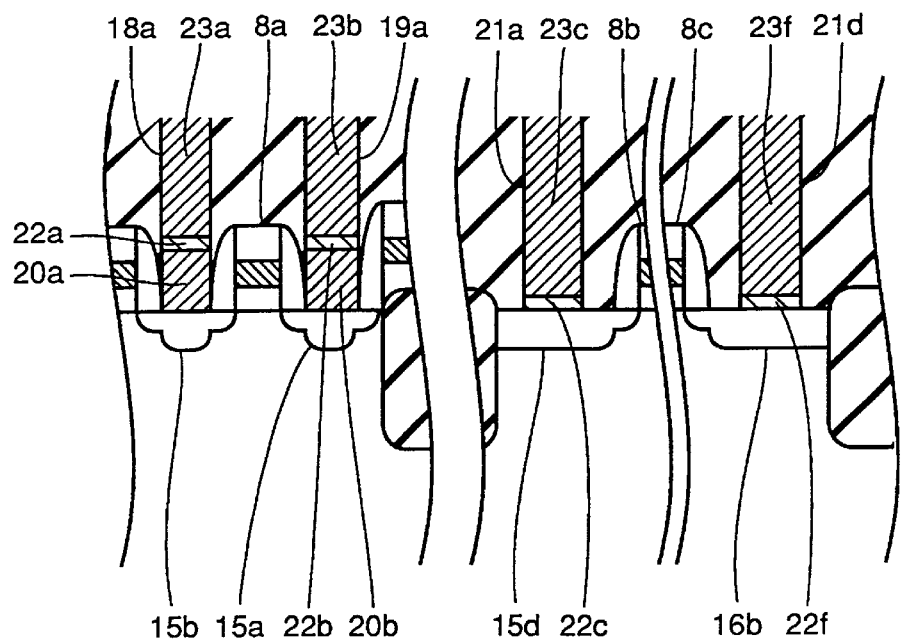
FIG. 8 is a partially enlarged cross sectional view of the step shown in FIG. 7 in the embodiment 2 of the present invention.

Thereafter titanium nitride films are formed on the titanium films 22a to 22f. At this time, titanium nitride films 23a, 23b, 23c, 23d, 23e and 23f are formed on the titanium films 22a, 22b, 22c, 22d, 22e and 22f respectively. FIG. 8 is a partially enlarged view showing the bit line contact hole 18a, the storage node contact hole 19a and the peripheral circuit contact holes 21a and 21d in this step.

Figure 9:
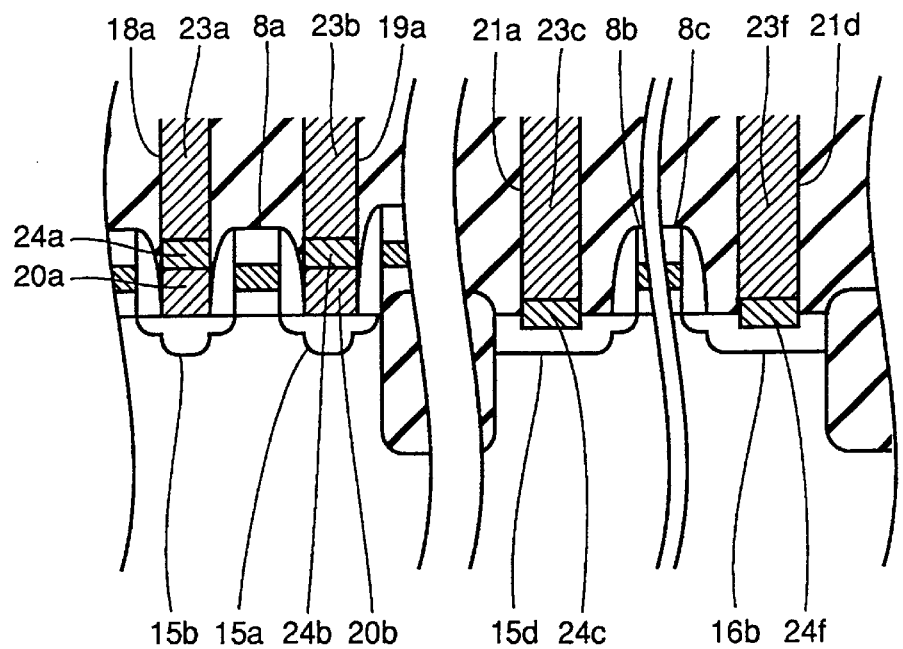
FIG. 9 is a partially enlarged cross sectional view showing a step carried out after that shown in FIG. 8 in the embodiment 2 of the present invention.

Referring to FIG. 9, heat treatment is performed in a nitrogen atmosphere at a temperature of 600 to 800° C. for 30 to 60 seconds to react the titanium films 22a and 22b with the polysilicon films 20a and 20b, thereby forming titanium silicide films 24a and 24b while reacting the titanium films 22c and 22f with the silicon contained in the n-type source/drain region 15d and the p-type source/drain region 16b respectively thereby forming titanium silicide films 24c and 24f. At this time, titanium silicide films 24d and 24e are also formed on the bottoms of the peripheral circuit contact holes 21b and 21c respectively.

While the titanium film 23a and the like are left only in the interior of the bit line contact hole 18a and the like in the step shown in FIG. 7, the titanium nitride film 23a and the like may be left by performing etching after the heat treatment in the step shown in FIG. 9.

Figure 10:
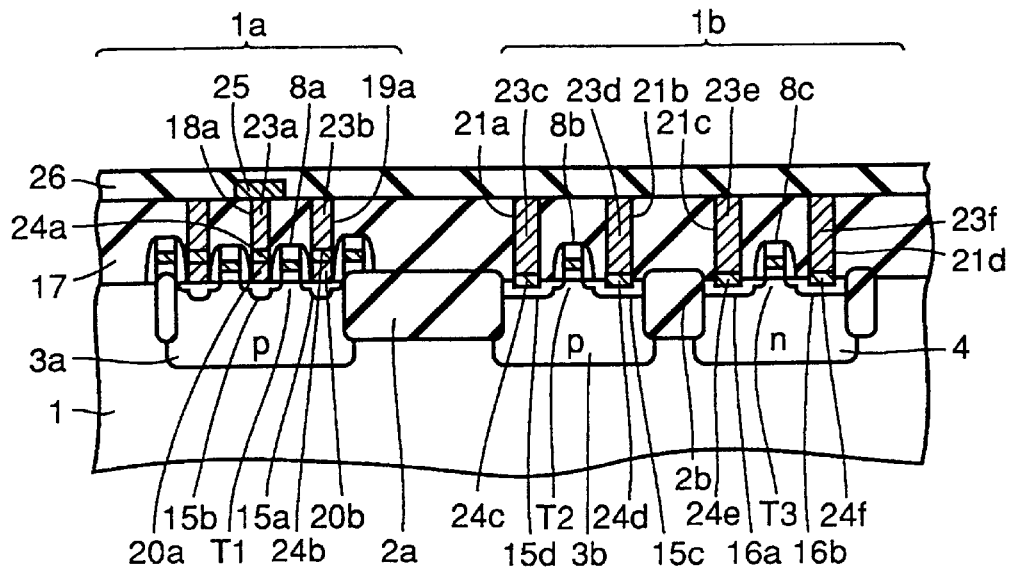
FIG. 10 is a cross sectional view showing a step carried out after that shown in FIG. 9 in the embodiment 2 of the present invention.

Referring to FIG. 10, a bit line 25 which is electrically connected with the titanium nitride film 23a is formed. A silicon oxide film 26 is formed on the silicon oxide film 17 to cover the bit line 25.

Figure 11:
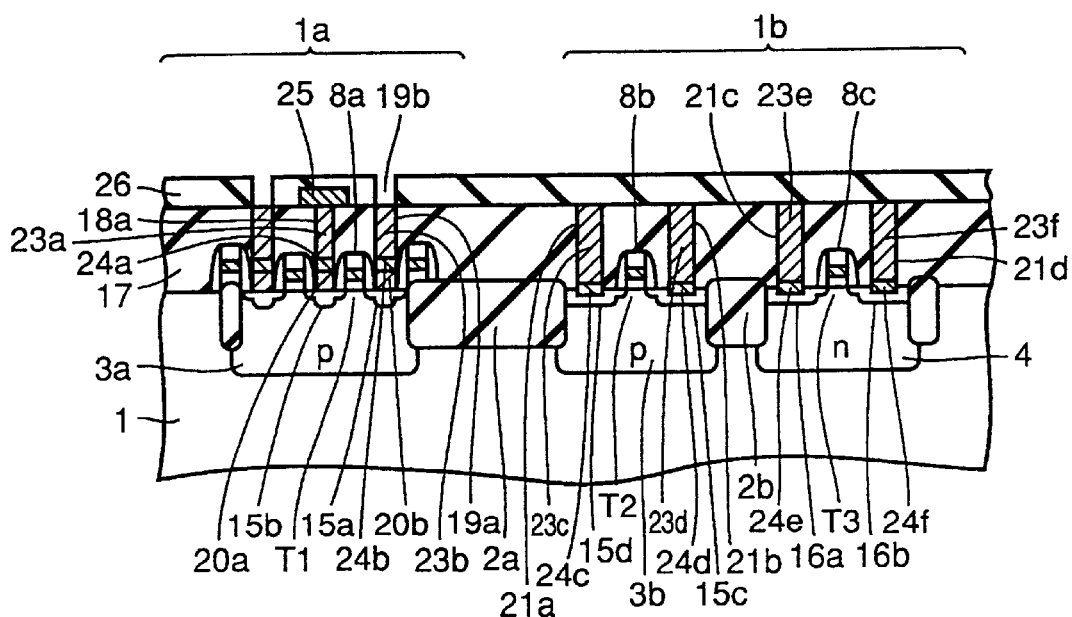
FIG. 11 is a cross sectional view showing a step carried out after that shown in FIG. 10 in the embodiment 2 of the present invention.

Referring to FIG. 11, a storage node contact hole 19b exposing a surface of the titanium nitride film 23b is formed in the silicon oxide film 26.

Figure 12:
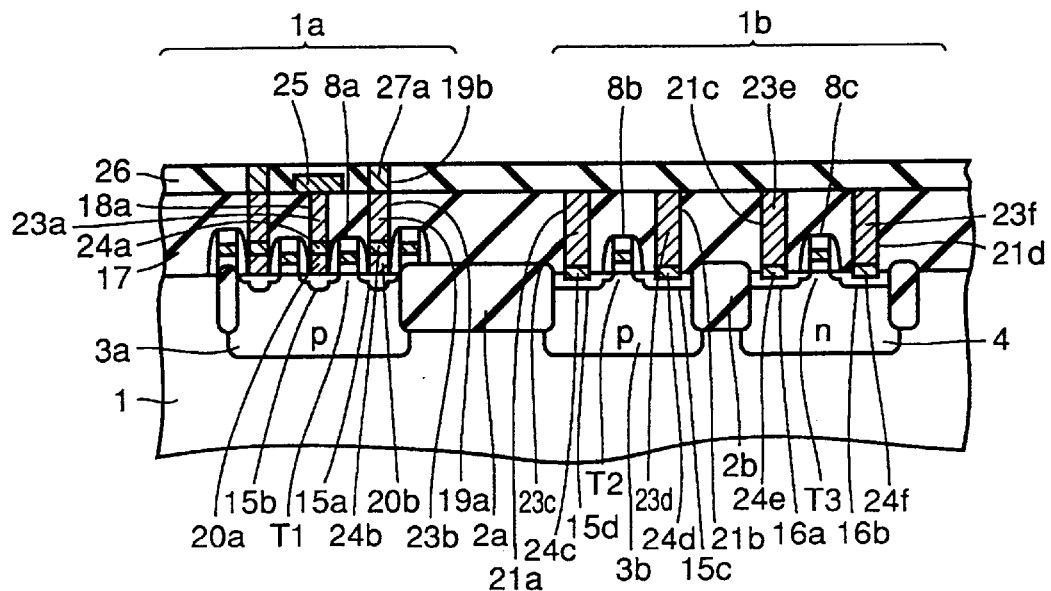
FIG. 12 is a cross sectional view showing a step carried out after that shown in FIG. 11 in the embodiment 2 of the present invention.

Referring to FIG. 12, a titanium nitride film 27a is buried in the storage node contact hole 19b.

Figure 13:
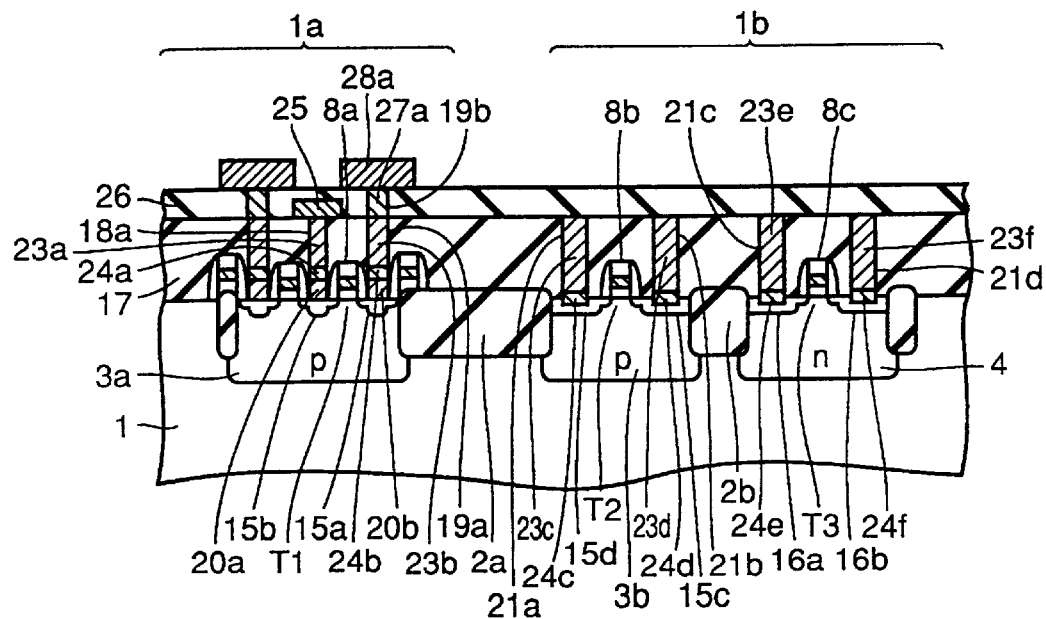
FIG. 13 is a cross sectional view showing a step carried out after that shown in FIG. 12 in the embodiment 2 of the present invention.

Referring to FIG. 13, a metal film of ruthenium or platinum is formed on the silicon oxide film 26, and a storage node 28a which is electrically connected to the titanium nitride film 27a is formed by prescribed photolithography and etching.

Figure 14:
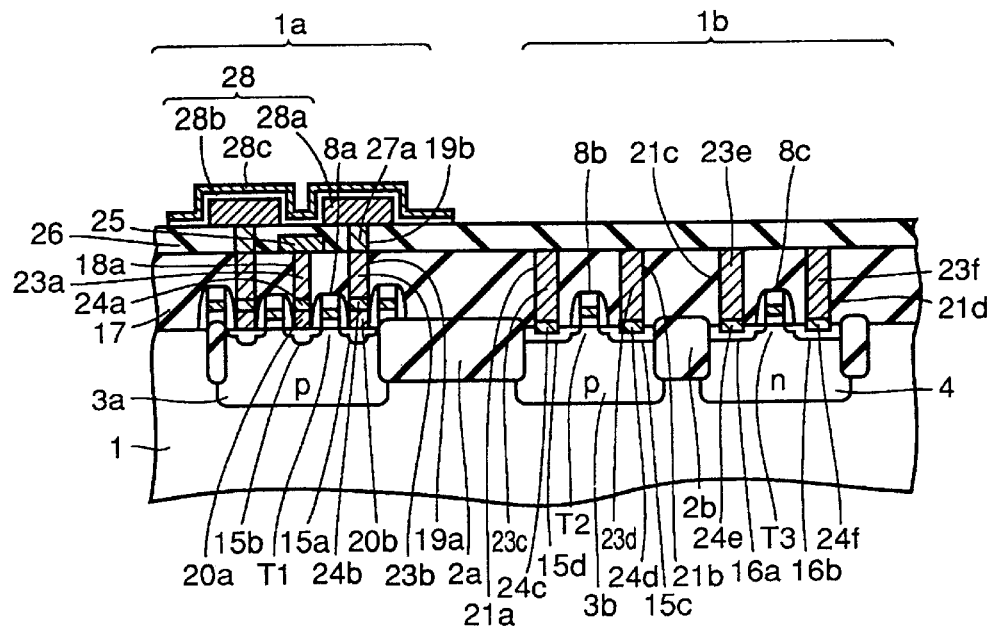
FIG. 14 is a cross sectional view showing a step carried out after that shown in FIG. 13 in the embodiment 2 of the present invention.

Referring to FIG. 14, a thin film of a high dielectric constant and a metal film of ruthenium or platinum are successively formed on the storage node 28a. Thereafter a capacitor dielectric film 28b and a cell plate 28c are formed by prescribed photolithography and etching. The storage node 28a, the capacitor dielectric film 28b and the cell plate 28c form a capacitor 28.

Figure 15:
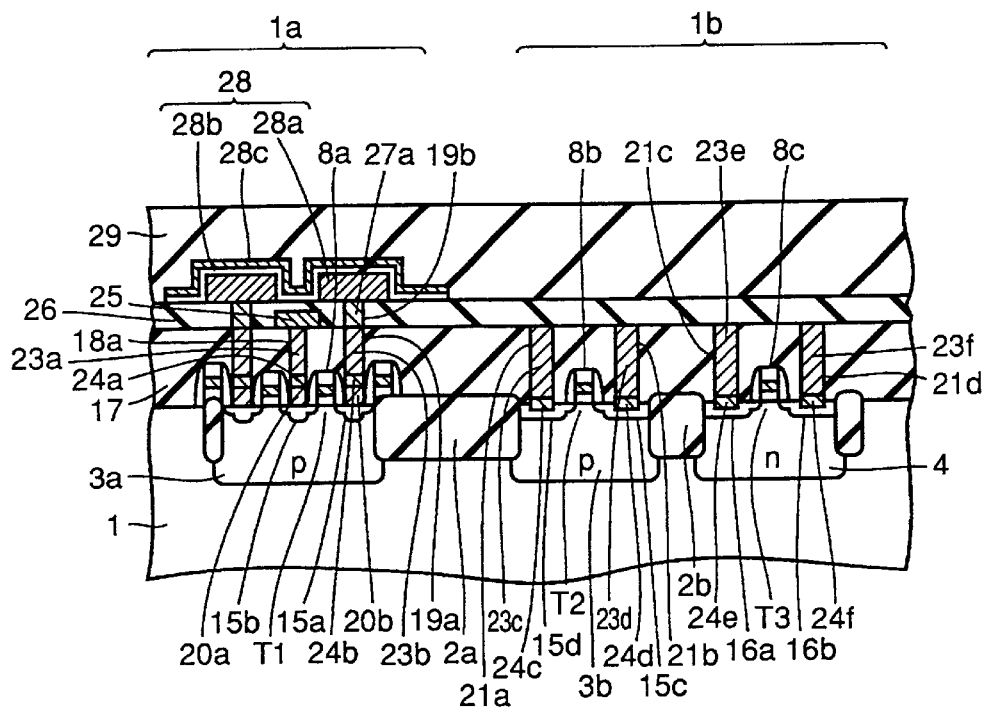
FIG. 15 is a cross sectional view showing a step carried out after that shown in FIG. 14 in the embodiment 2 of the present invention.

Referring to FIG. 15, an interlayer insulation film 29 is formed on the silicon oxide film 26, to cover the capacitor 28.

Figure 16:
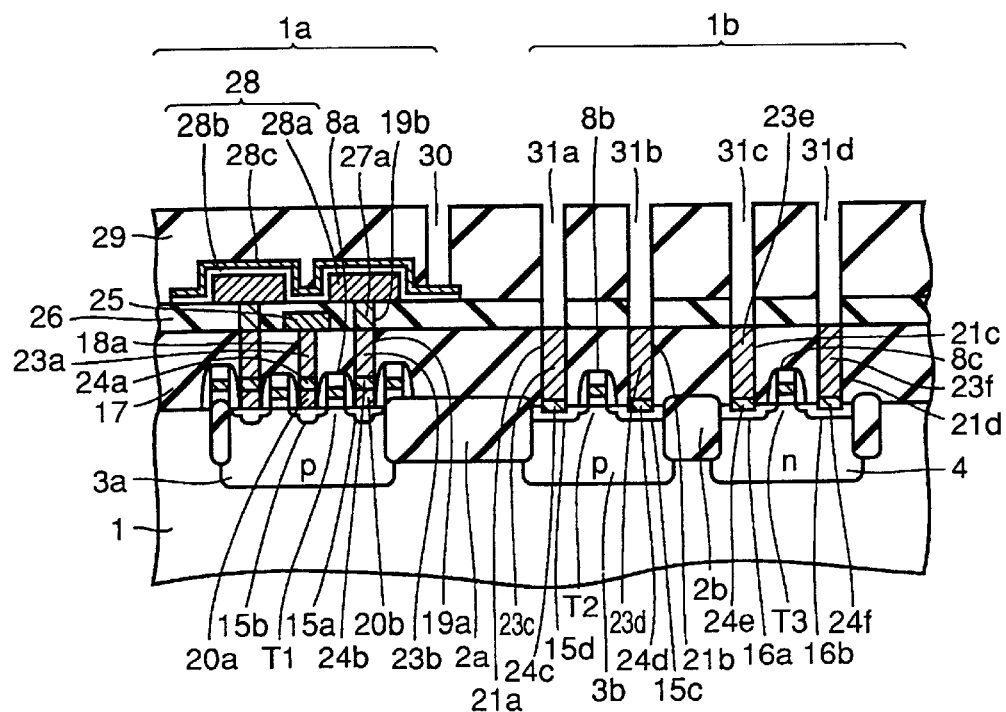
FIG. 16 is a cross sectional view showing a step carried out after that shown in FIG. 15 in the embodiment 2 of the present invention.

Referring to FIG. 16, peripheral circuit contact holes 31a, 31b, 31c and 31d exposing surfaces of the titanium nitride films 23c, 23d, 23e and 23f respectively are formed in the interlayer insulation film 29 and the silicon oxide film 26. At the same time, a cell plate contact hole 30 exposing a surface of the cell plate 28c of the capacitor 28 is formed in the interlayer insulation film 29.

Figure 17:
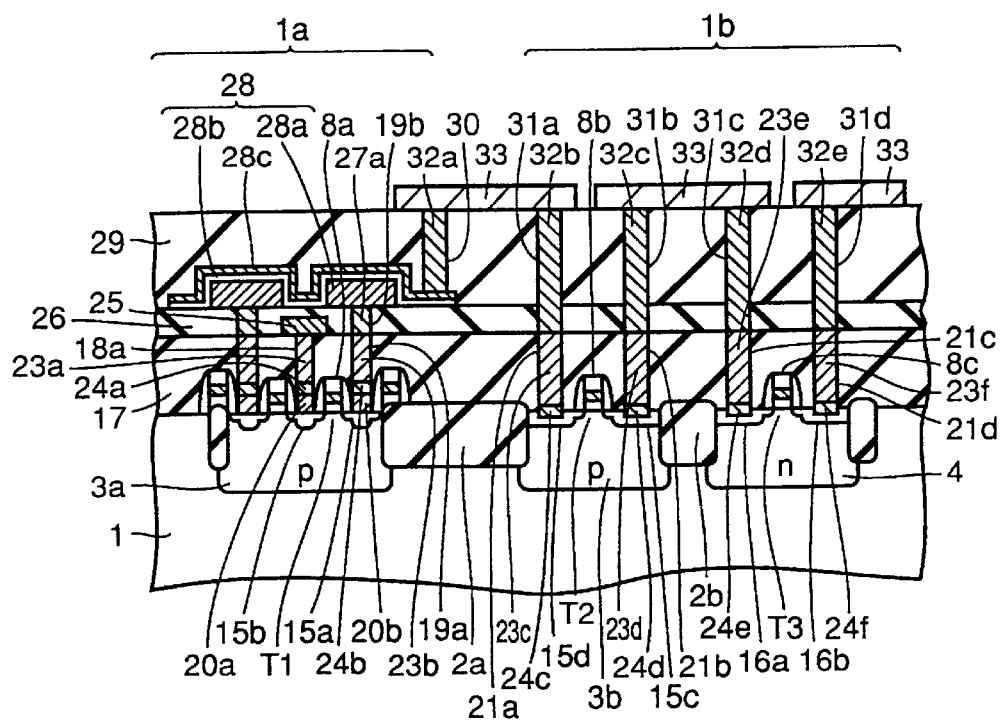
FIG. 17 is a cross sectional view showing a step carried out after that shown in FIG. 16 in the embodiment 2 of the present invention.

Referring to FIG. 17, a titanium nitride film 32a is formed in the cell plate contact hole 30 by sputtering or the like. Further, titanium nitride films 32b, 32c, 32d and 32e are formed in the peripheral circuit contact holes 31a, 31b, 31c and 31d respectively. Then, an aluminum copper film is formed on the interlayer insulation film 29, and metal wires 33 are formed by prescribed photolithography and etching. Thereafter an interlayer insulation film (not shown) and a passivation film (not shown) are formed to cover the metal wires 33, thereby completing the DRAM.

According to this fabrication method, the titanium silicide films 24a and 24b are formed in the bit line contact hole 18a and the storage node contact hole 19a respectively by reacting titanium with silicon by the heat treatment. At this time, the titanium reacts with the silicon contained in the polysilicon films 20a and 20b, to be capable of being prevented from reacting with the silicon contained in the n-type source/drain regions 15a and 15b. Consequently, leakage currents leaking from the n-type source/drain regions 15a and 15b to the semiconductor substrate 1 can be reduced.

Further, the peripheral circuit contact holes 21a, 21b, 21c and 21d are formed in the silicon oxide film 17, while the peripheral circuit contact holes 31a, 31b, 31c and 31d are formed in the interlayer insulation film 29 and the silicon oxide film 26. As compared with the case of forming peripheral circuit contact holes in the interlayer insulation film 29 and the silicon oxide films 17 and 26 through a single step, therefore, the aspect ratios of the peripheral circuit contact holes 21a to 21d and 31a to 31d are so reduced that the peripheral circuit contact holes 21a to 21d and 31a to 31d can be readily opened.

When the cell plate contact hole 30 and the peripheral circuit contact holes 21a, 21b, 21c and 21d are simultaneously formed, the surface of the cell plate 28c is exposed on the bottom of the cell plate contact hole 30 in advance. The exposed surface of the cell plate 28c is exposed to plasma for a time corresponding to that required for etching up to exposure of the surfaces of the titanium nitride films 23c, 23d, 23e and 23e which are buried in the peripheral circuit contact holes 21a, 21b, 21c and 21d respectively. As compared with the case of forming contact holes exposing the surfaces of the n- and p-type source/drain regions 15a, 15b, 16a and 16b, therefore, the time for exposing the surface of the cell plate 28c to the plasma is reduced. Thus, the cell plate 28c can be prevented from damage resulting from the etching or the cell plate contact hole 30 can be prevented from passing through the cell plate 28c.

Consequently, electrical connection between an element such as the capacitor 28 formed in the memory cell region 1a and elements such as the MOS transistors T2 and T3 formed in the peripheral circuit region 1b is improved.

While the polysilicon films 20a and 20b are formed on the bottoms of the bit line contact hole 18a and the storage node contact hole 19a respectively, epitaxial silicon films may be formed in place of the polysilicon films 20a and 20b. In this case, the silicon substrate 1 is exposed to an atmosphere of monosilane gas or disilane gas under a temperature of 500 to 550° C., to form amorphous silicon. Thereafter heat treatment is performed in a nitrogen atmosphere at a temperature of 550 to 650° C. for 2 to 5 hours, for forming the epitaxial silicon films by solid-phase growth of the amorphous silicon.

In the step shown in FIG. 4, films of epitaxial silicon or an epitaxial silicon-germanium alloy may be selectively formed only on the bottoms of the bit line contact hole 18a and the storage node contact hole 19 by selective epitaxy. Also in this case, the n-type source/drain regions 15a and 15b are inhibited from being influenced by the heat treatment, and an effect similar to that described with reference to the embodiment 1 can be attained.

Embodiment 3

Figure 18:
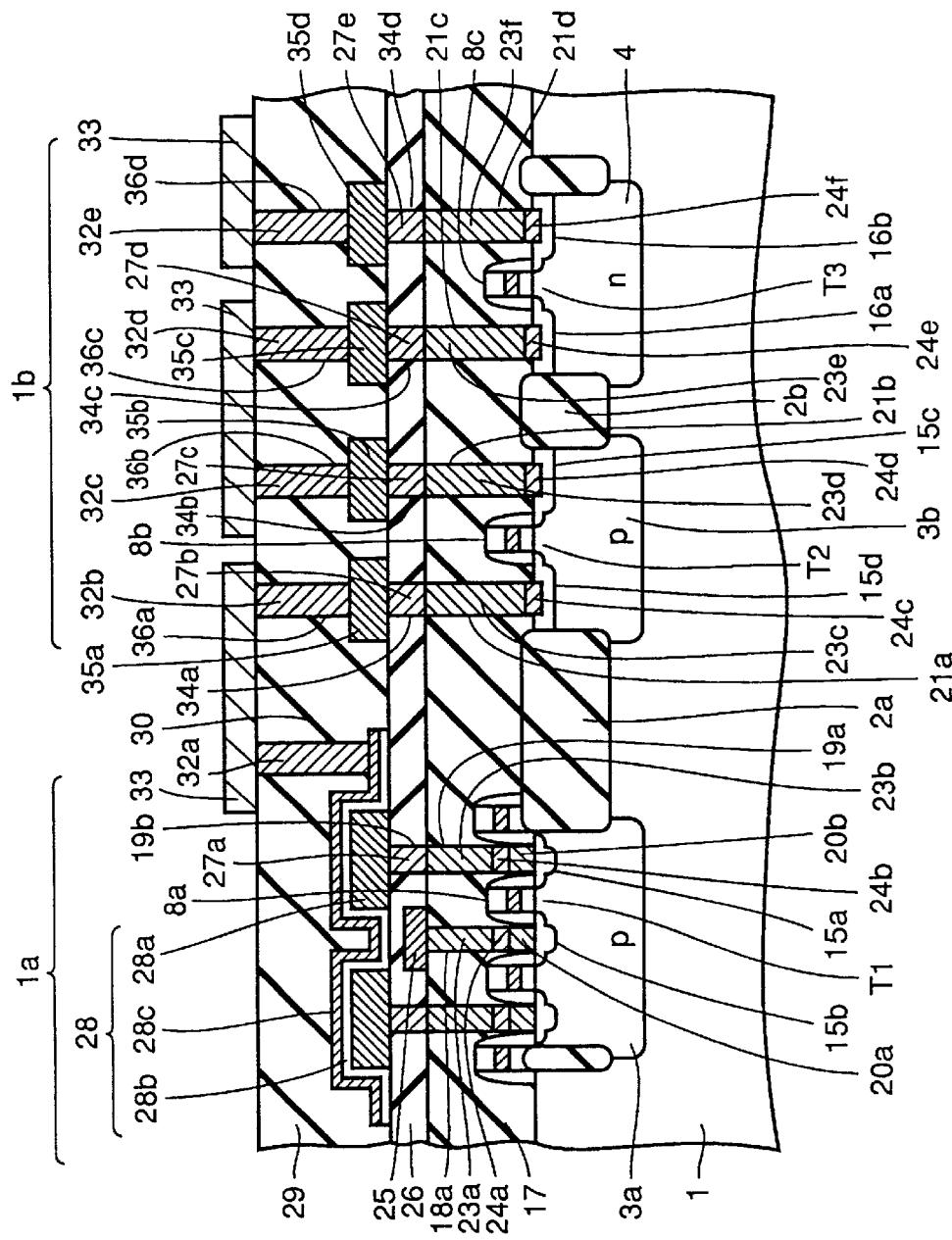
FIG. 18 is a cross sectional view showing a DRAM according to an embodiment 3 of the present invention.

A DRAM according to an embodiment 3 of the present invention is now described with reference to FIG. 18. Referring to FIG. 18, peripheral circuit contact holes 21a, 21b, 21c and 21d are formed in a silicon oxide film 17 in a peripheral circuit region 1b, and peripheral circuit contact holes 34a, 34b, 34c and 34d are formed in a silicon oxide film 26. Conductors 35a, 35b, 35c and 35d serving as relay conductors are formed on the silicon oxide film 26. The conductors 35a, 35b, 35c and 35d are formed by the same films as a metal film of ruthenium or platinum which is formed on the silicon oxide film 26 for forming a storage node 28a of a capacitor 28.

Peripheral circuit contact holes 36a, 36b, 36c and 36d are formed in an interlayer insulation film 29 to expose surfaces of the conductors 35a, 35b, 35c and 35d respectively. The remaining structure of the DRAM shown in FIG. 18 is identical to that of the DRAM shown in FIG. 1 described with reference to the embodiment 1, and hence members identical to those in FIG. 1 are denoted by the same reference numerals, to omit redundant description.

In addition to an effect of reducing leakage currents, the aforementioned DRAM attains the following effect in fabrication: Particularly in the peripheral circuit contact holes 36a, 36b, 36c and 36d, the depth thereof is reduced by a value corresponding to the thickness of the conductors 35a, 35b, 35c and 35d. As compared with the structure shown in FIG. 1 described with reference to the embodiment 1, therefore, the aspect ratio of the peripheral circuit contact holes 36a, 36b, 36c and 36d is further reduced. Consequently, the peripheral circuit contact holes 36a, 36b, 36c and 36d can be further readily opened.

When a cell plate contact hole 30 and the peripheral circuit contact holes 36a, 36b, 36c and 36d are simultaneously formed, surfaces of the conductors 35a, 35b, 35c and 35d are exposed in advance of that of a cell plate 28c. Thus, damage of the cell plate 28c resulting from etching is remarkably reduced, and the cell plate contact hole 30 can be inhibited from passing through the cell plate 28c.

Consequently, electrical connection between an element such as the capacitor 28 formed in a memory cell region 1a and elements such as MOS transistors T2 and T3 formed in the peripheral circuit region 1b is improved.

Embodiment 4

As an embodiment 4 of the present invention, an exemplary method of fabricating the DRAM according to the embodiment 3 is now described with reference to FIGS. 19 to 26.

Figure 19:
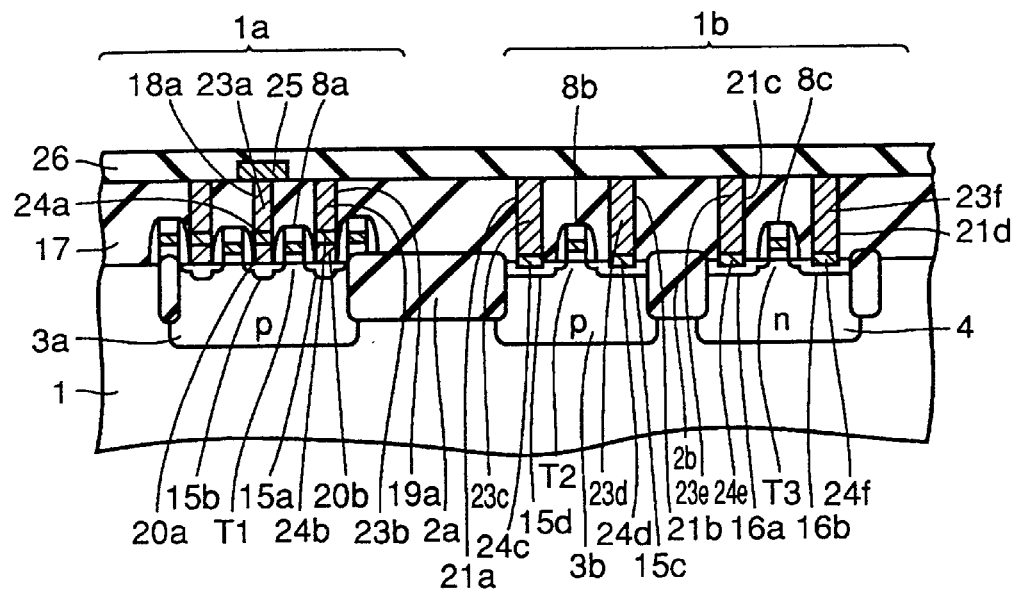
FIG. 19 is a cross sectional view showing a step in a method of fabricating a DRAM according to an embodiment 4 of the present invention.

Steps up to that shown in FIG. 19 are similar to those of the embodiment 2 up to the step shown in FIG. 10, and hence redundant description is omitted.

Figure 20:
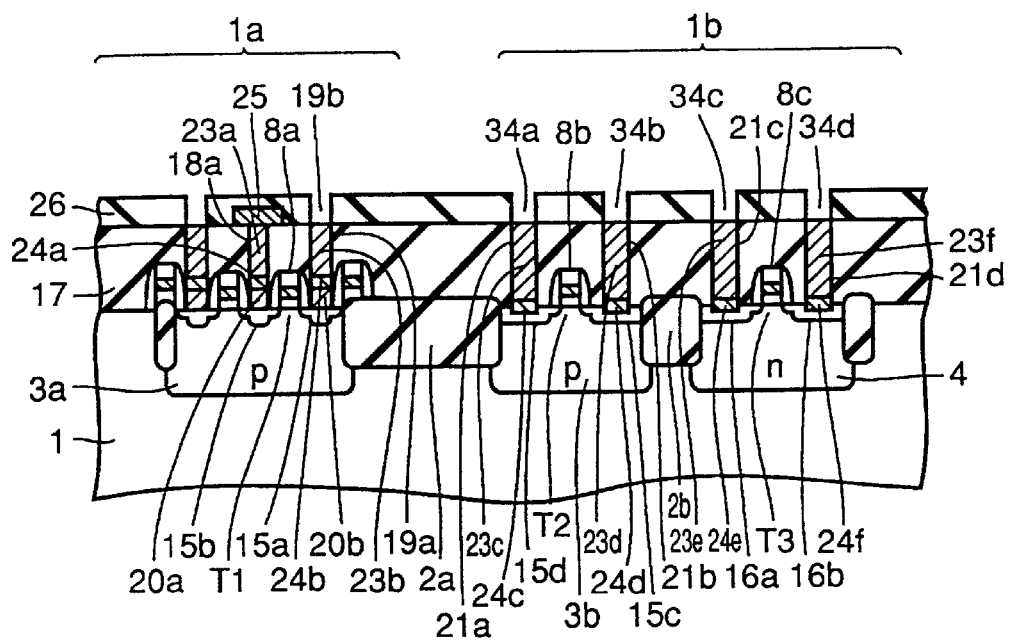
FIG. 20 is a cross sectional view showing a step carried out after that shown in FIG. 19 in the embodiment 4 of the present invention.

Referring to FIG. 20, a storage node contact hole 19b exposing a surface of a titanium nitride film 23b is formed in a silicon oxide film 26, while peripheral circuit contact holes 34a, 34b, 34c and 34d are formed to expose surfaces of titanium nitride films 23c, 23d, 23e and 23f respectively.

Figure 21:
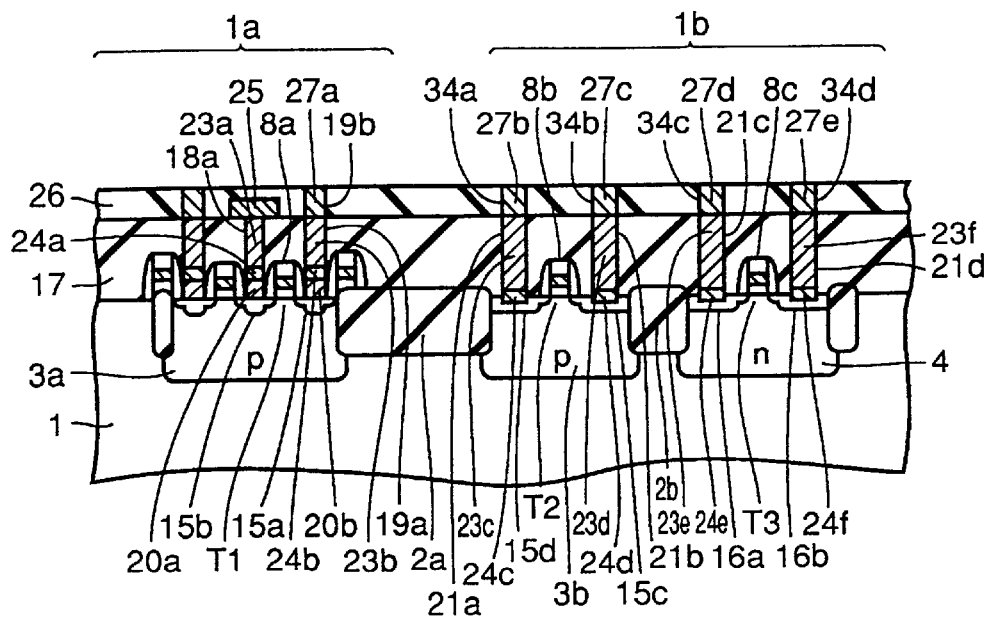
FIG. 21 is a cross sectional view showing a step carried out after that shown in FIG. 20 in the embodiment 4 of the present invention.

Referring to FIG. 21, a titanium nitride film 27a is formed in the storage node contact hole 19b. Titanium nitride films 27b, 27c, 27d and 27e are formed in the peripheral circuit contact holes 34a, 34b, 34c and 34d respectively.

Figure 22:
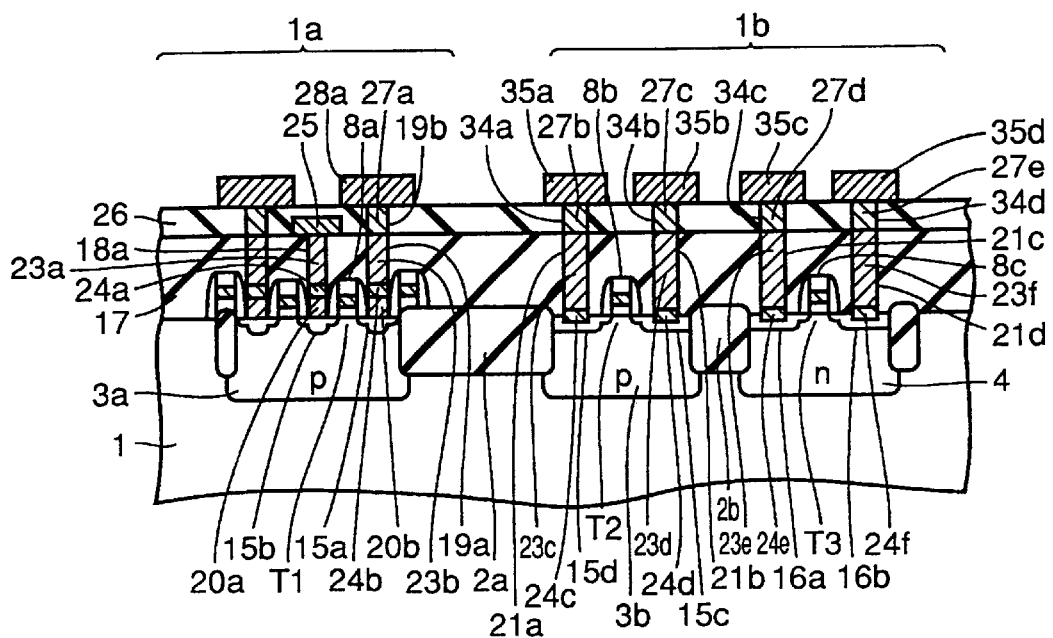
FIG. 22 is a cross sectional view showing a step carried out after that shown in FIG. 21 in the embodiment 4 of the present invention.

Referring to FIG. 22, a metal film of ruthenium or platinum is formed on the silicon oxide film 26, and a storage node 28a is formed by prescribed photolithography and etching. At the same time, conductors 35a, 35b, 35c and 35d are formed on the titanium nitride films 27b, 27c, 27d and 27e respectively.

Figure 23:
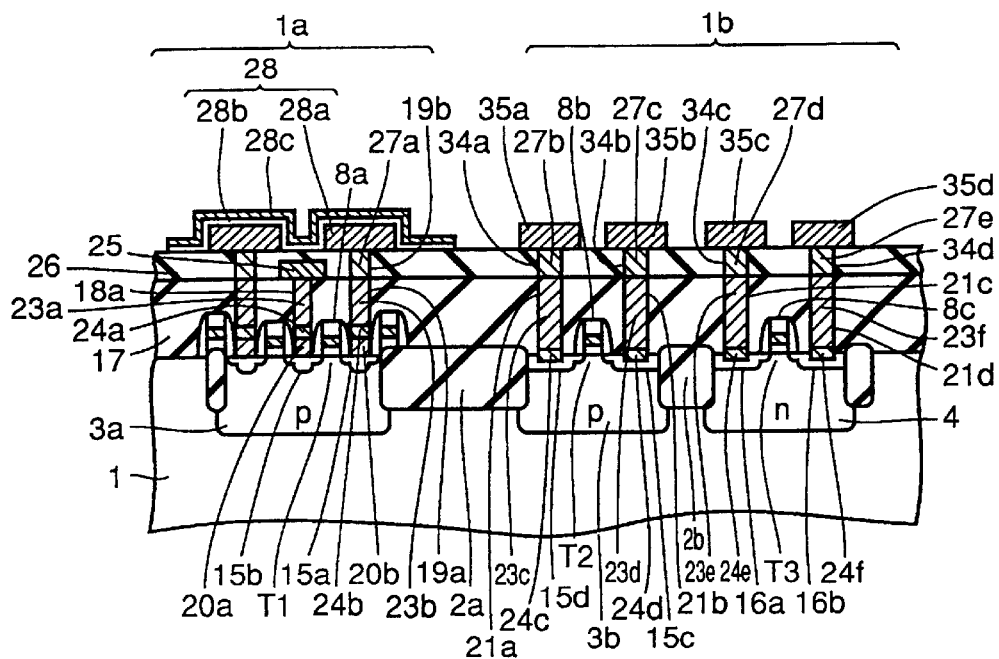
FIG. 23 is a cross sectional view showing a step carried out after that shown in FIG. 22 in the embodiment 4 of the present invention.

Referring to FIG. 23, a thin film of a high dielectric constant and a metal film of ruthenium or platinum are successively formed on the storage node 28a. Thereafter a capacitor dielectric film 28b and a cell plate 28c are formed by prescribed photolithography and etching. The storage node 28a, the capacitor dielectric film 28b and the cell plate 28c form a capacitor 28.

Figure 24:
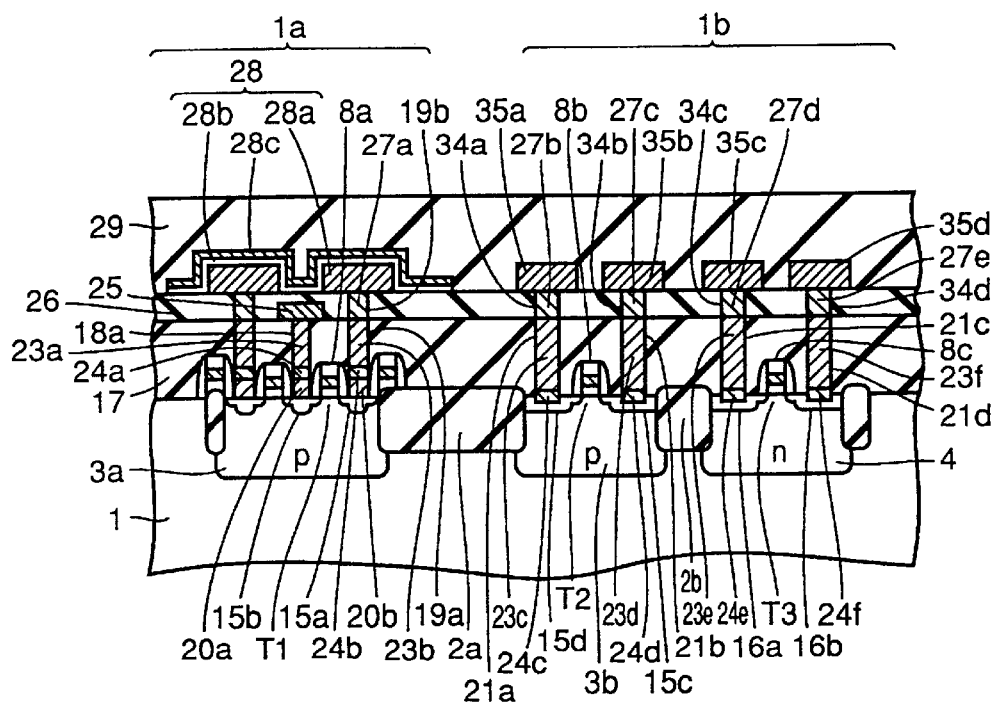
FIG. 24 is a cross sectional view showing a step carried out after that shown in FIG. 23 in the embodiment 4 of the present invention.

Referring to FIG. 24, an interlayer insulation film 29 is formed on the silicon oxide film 26, to cover the capacitor 28 and the conductors 35a, 35b, 35c and 35d.

Figure 25:
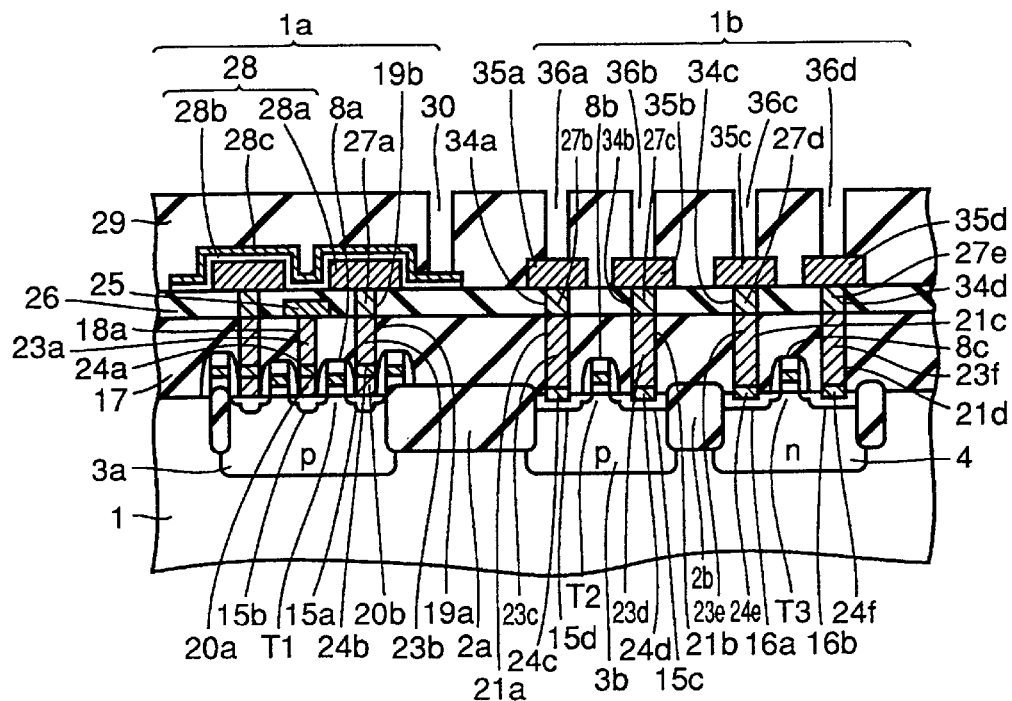
FIG. 25 is a cross sectional view showing a step carried out after that shown in FIG. 24 in the embodiment 4 of the present invention.

Referring to FIG. 25, a cell plate contact hole 30 exposing a surface of the cell plate 28c is formed in the interlayer insulation film 29. At the same time, peripheral circuit contact holes 36a, 36b, 36c and 36d are formed to expose surfaces of the conductors 35a, 35b, 35c and 35d respectively.

Figure 26:
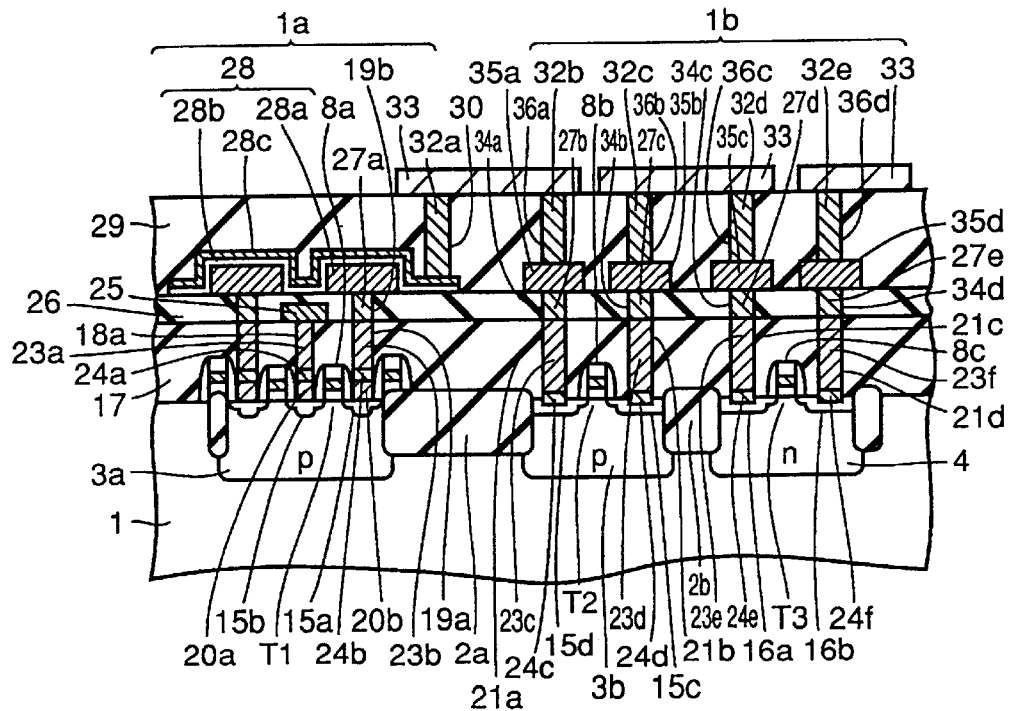
FIG. 26 is a cross sectional view showing a step carried out after that shown in FIG. 25 in the embodiment 4 of the present invention.

Referring to FIG. 26, a titanium nitride film 32a is formed in the cell plate contact hole 30 by sputtering or the like. Further, titanium nitride films 32b, 32c, 32d and 32e are formed in the peripheral circuit contact holes 36a, 36b, 36c and 36d respectively. Thereafter an aluminum copper film is formed on the interlayer insulation film 29. Metal wires 33 are formed by prescribed photolithography and etching. Thereafter an interlayer insulation film (not shown) and a passivation film (not shown) are formed to cover the metal wires 33, thereby completing the DRAM.

In addition to an effect of reducing leakage currents, this fabrication method attains the following effect: Particularly in the peripheral circuit contact holes 36a, 36b, 36c and 36d, the depth thereof is reduced by a value corresponding to the thickness of the conductors 35a, 35b, 35c and 35d. As compared with the DRAM shown in FIG. 1 described with reference to the embodiment 1, therefore, the aspect ratio of the peripheral circuit contact holes 36a, 36b, 36c and 36d is further reduced. Consequently, the peripheral circuit contact holes 36a, 36b, 36c and 36d can be further readily opened.

When the cell plate contact hole 30 and the peripheral circuit contact holes 36a, 36b, 36c and 36d are simultaneously formed, a surface of the cell plate 28c is exposed after those of the conductors 35a, 35b, 35c and 35d are exposed. Thus, damage of the cell plate 28c resulting from etching is remarkably reduced, and the cell plate contact hole 30 can be inhibited from passing through the cell plate 28c.

Consequently, electrical connection between an element such as the capacitor 28 formed in a memory cell region 1a and elements such as MOS transistors T2 and T3 formed in the peripheral circuit region 1b is improved.

Embodiment 5

Figure 27:
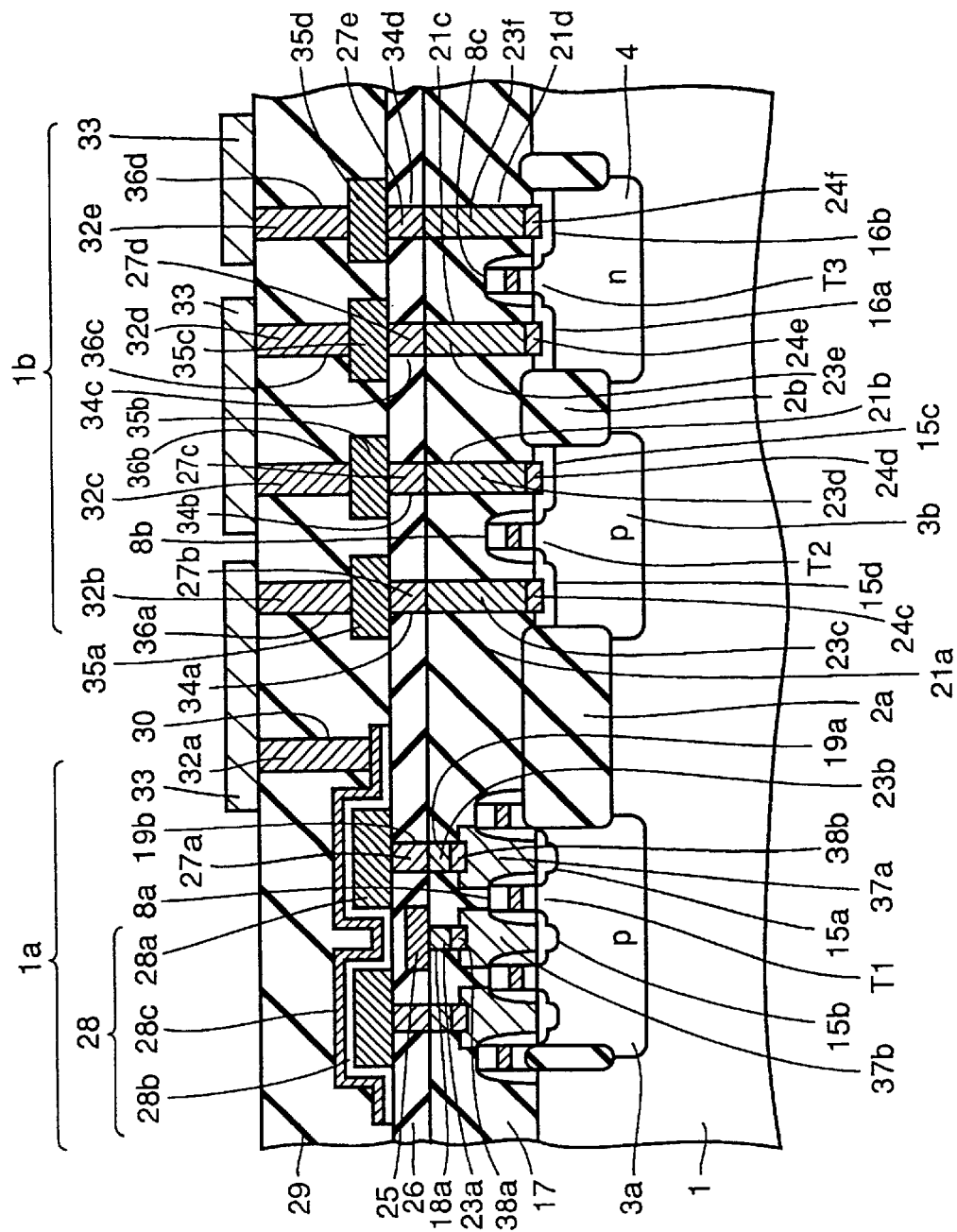
FIG. 27 is a cross sectional view showing a DRAM according to an embodiment 5 of the present invention.

A DRAM according to an embodiment 5 of the present invention is now described with reference to FIG. 27. Referring to FIG. 27, epitaxial silicon growth layers 37a and 37b serving as first and fourth conductor layers are formed on n-type source/drain regions 15a and 15b of a MOS transistor T1 in a memory cell region 1a of the DRAM respectively. Storage node contact holes 19a and 19b serving as second contact holes and a bit line contact hole 18a serving as a first contact hole exposing surfaces of the epitaxial silicon growth layers 37a and 37b respectively are formed in silicon oxide films 17 and 26. Titanium silicide films 38a and 38b and titanium nitride films 23a and 23b are formed in the bit line contact hole 18a and the storage node contact hole 19a respectively. The remaining structure of the DRAM shown in FIG. 27 is identical to that of the DRAM shown in FIG. 18 described with reference to the embodiment 3, and hence members identical to those shown in FIG. 18 are denoted by the same reference numerals, to omit redundant description.

In the aforementioned structure, the titanium silicide films 38a and 38b are formed by reacting titanium films 22a and 22b formed in the bit line contact hole 18a and the storage node contact hole 19a shown in FIG. 35 with the epitaxial silicon growth layers 37b and 37a by heat treatment, as described with reference to an embodiment 6 of the present invention. Therefore, the titanium films 22a and 22b can be prevented from reacting with silicon contained in n-type source/drain regions 15a and 15b. Consequently, leakage currents leaking from the n-type source/drain regions 15a and 15b to a silicon substrate 1 are reduced, as described with reference to the embodiment 2.

While the epitaxial silicon growth layers 37a and 37b are employed in this embodiment, a similar effect can be attained by selectively epitaxially growing layers of a silicon-germanium alloy on the n-type source/drain regions 15a and 15b.

Further, electrical connection between an element such as a capacitor 28 formed in a memory cell region 1a and elements such as MOS transistors T2 and T3 formed in the peripheral circuit region 1b is improved, as described with reference to the embodiment 1.

Embodiment 6

As the embodiment 6 of the present invention, an exemplary method of fabricating the DRAM according to the embodiment 5 is now described with reference to FIGS. 28 to 37.

Figure 28:
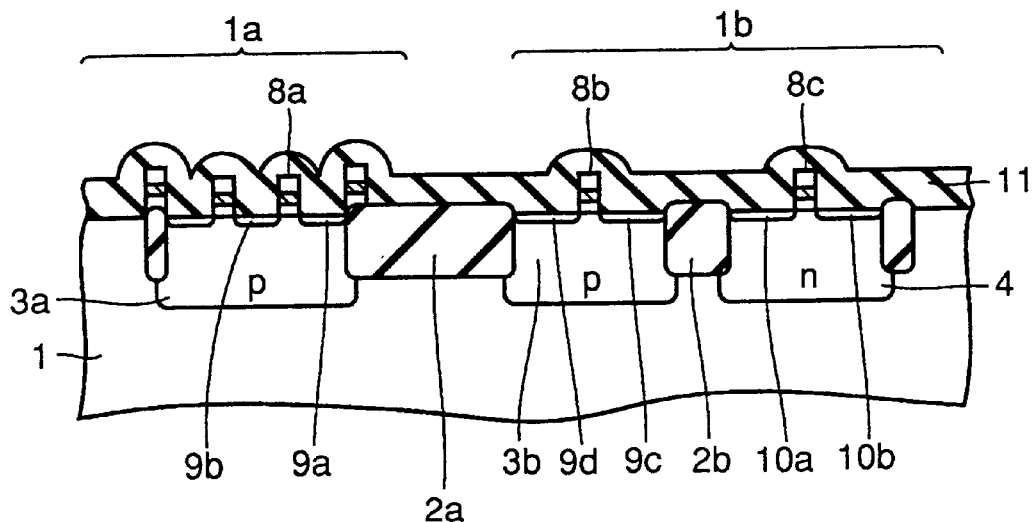
FIG. 28 is a cross sectional view showing a step in a method of fabricating a DRAM according to an embodiment 6 of the present invention.

Steps up to that shown in FIG. 28 are similar to those of the prior art described with reference to FIGS. 54 to 60, and hence redundant description is omitted.

Figure 29:
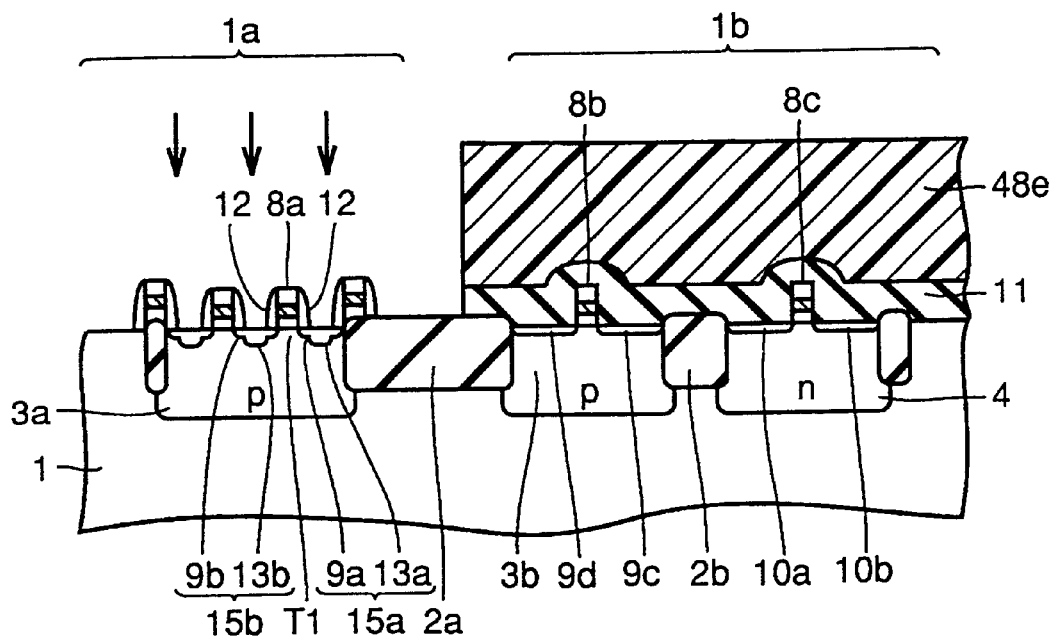
FIG. 29 is a cross sectional view showing a step carried out after that shown in FIG. 28 in the embodiment 6 of the present invention.

Referring to FIG. 29, a photoresist film 48e is formed on a silicon oxide film 11 in a peripheral circuit region 1b. This photoresist film 48e is employed as a mask to anisotropically etch the silicon oxide film 11, thereby forming sidewall oxide films 12 on both side surfaces of a gate electrode portion 8a. Phosphorus is injected into a p-type well 3a through the sidewall oxide films 12 and the gate electrode portion 8a serving as masks, for forming $n^+$ source/drain regions 13a and 13b. The $n^+$ source/drain regions 13a and 13b and $n^-$ source/drain regions 9a and 9b form n-type source/drain regions 15a and 15b.

Figure 30:
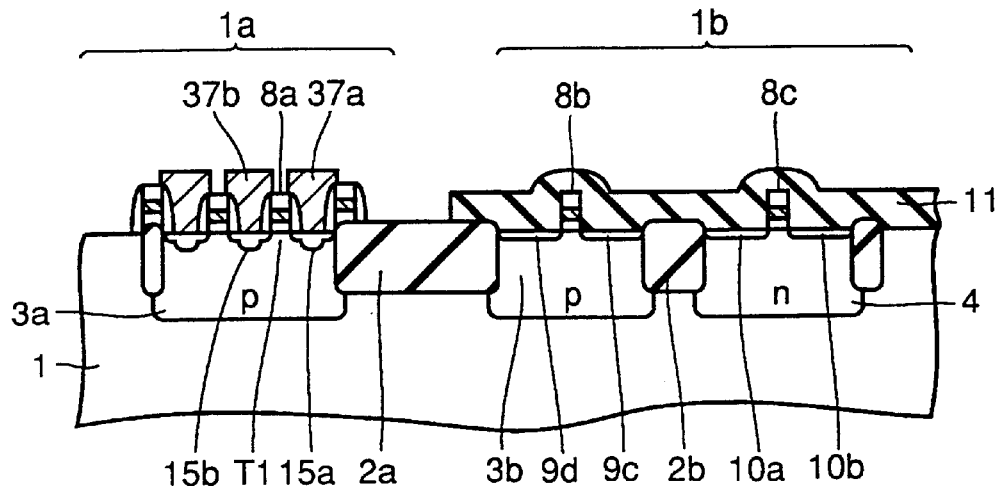
FIG. 30 is a cross sectional view showing a step carried out after that shown in FIG. 29 in the embodiment 6 of the present invention.

Referring to FIG. 30, epitaxial silicon growth layers 37a and 37b are selectively formed on the n-type source/drain regions 15a and 15b by chemical vapor deposition or the like.

The vertical positions of the epitaxial silicon growth layers 37a and 37b, which are higher than that of the gate electrode portion 8a in FIG. 30, are not restricted to those shown in FIG. 30 so far as the epitaxial silicon growth layers 37a and 37b are formed on the n-type source/drain regions 15a and 15b.

Figure 31:
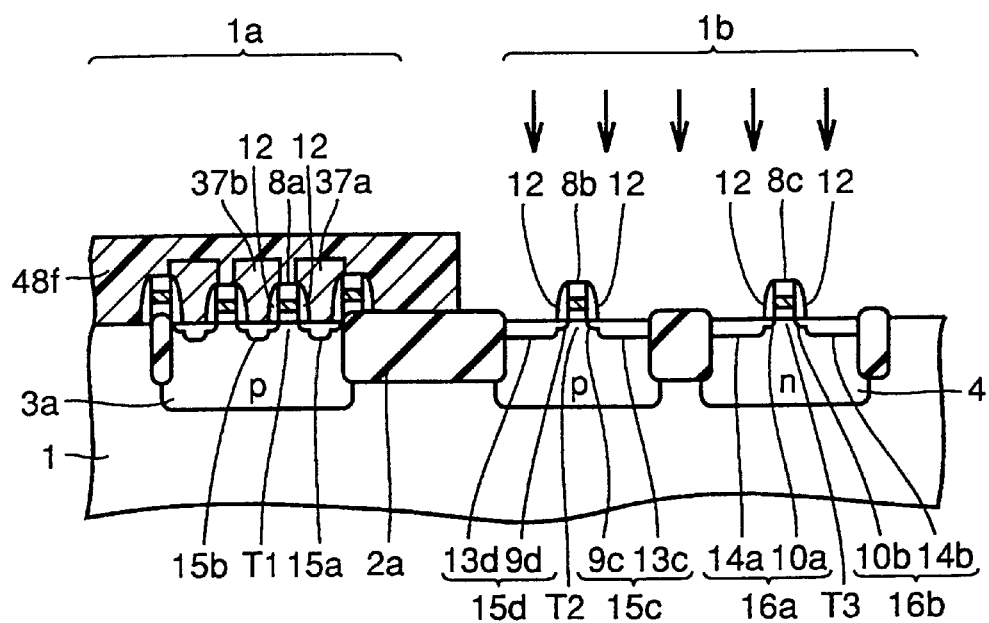
FIG. 31 is a cross sectional view showing a step carried out after that shown in FIG. 30 in the embodiment 6 of the present invention.

Referring to FIG. 31, a photoresist film 48f is formed to cover a memory cell region 1a. This photoresist film 48f is employed as a mask to anisotropically etch the silicon oxide film 11, thereby forming sidewall oxide films 12 on both side surfaces of gate electrode portions 8b and 8c. Thereafter phosphorus is ion-implanted into a p-type well 3b through the gate electrode portion 8b and the sidewall oxide films 12 serving as masks, thereby forming $n^+$ source/drain regions 13c and 13d. The $n^+$ source/drain regions 13c and 13d and $n^-$ source/drain regions 9c and 9d form n-type source/drain regions 15c and 15d.

On the other hand, boron is injected into an n-type well 4 through the gate electrode portion 8c and the sidewall oxide films 12 serving as masks, thereby forming $p^+$ source/drain regions 14a and 14b. The $p^+$ source/drain regions 14a and 14b and $p^-$ source/drain regions 10a and 10b form p-type source/drain regions 16a and 16c.

The n-type well 4 is covered with a resist film when phosphorus is ion-implanted into the p-type well 3b, and the p-type well 3b is covered with a resist film when boron is ion-implanted into the n-type well 4, as a matter of course.

Figure 32:
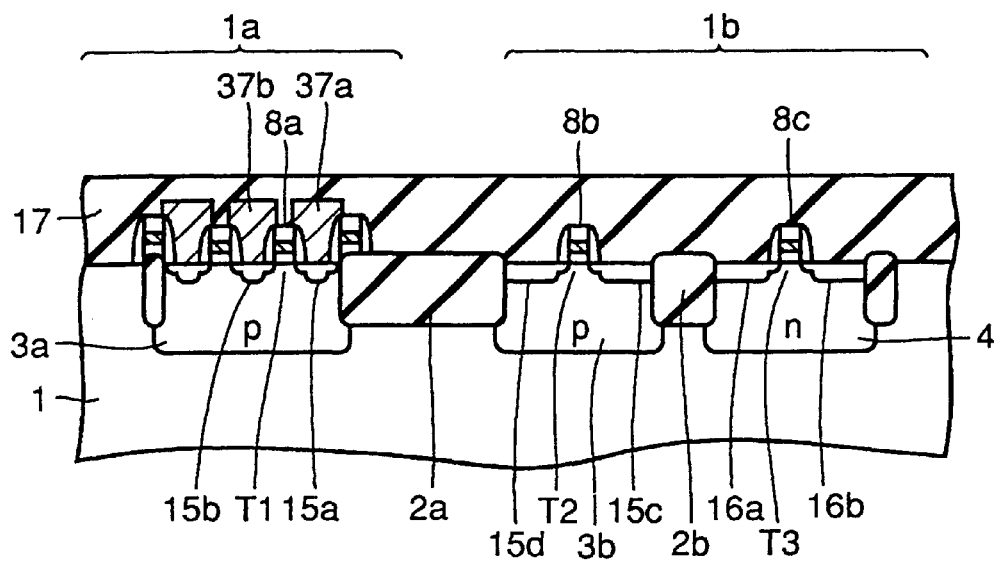
FIG. 32 is a cross sectional view showing a step carried out after that shown in FIG. 31 in the embodiment 6 of the present invention.

Referring to FIG. 32, a silicon oxide film 17 is formed on a silicon substrate 1, to cover the epitaxial silicon growth layers 37a and 37b and the gate electrode portions 8b and 8c.

Figure 33:
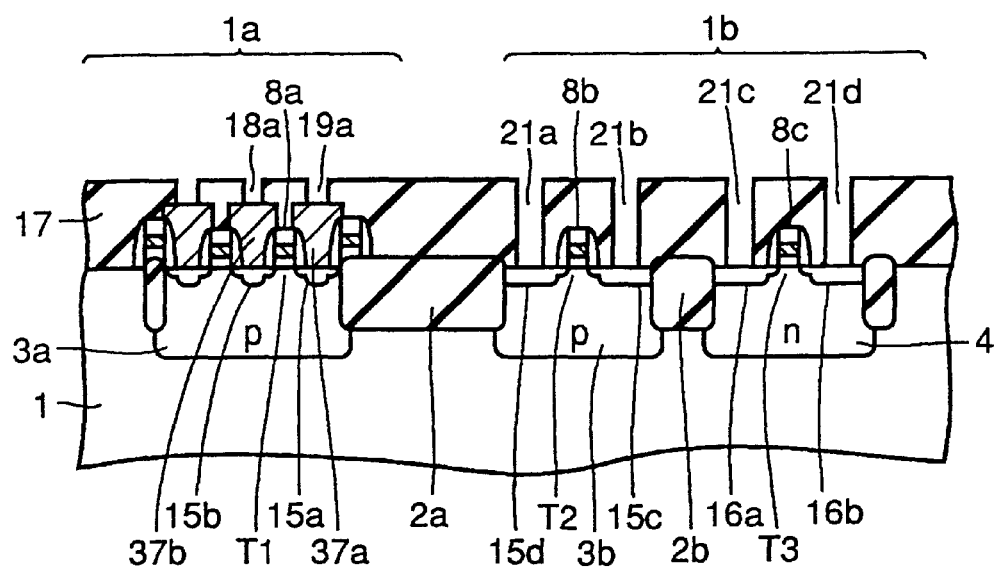
FIG. 33 is a cross sectional view showing a step carried out after that shown in FIG. 32 in the embodiment 6 of the present invention.

Referring to FIG. 33, a bit line contact hole 18a exposing a surface of the epitaxial silicon growth layer 37b is formed in the silicon oxide film 17. A storage node contact hole 19a is formed to expose a surface of the epitaxial silicon growth layer 37a. Further, peripheral circuit contact holes 21a, 21b, 21c and 21d are formed to expose surfaces of the n-type source/drain regions 15c and 15d and the p-type source/drain regions 16a and 16b respectively.

Figure 34:
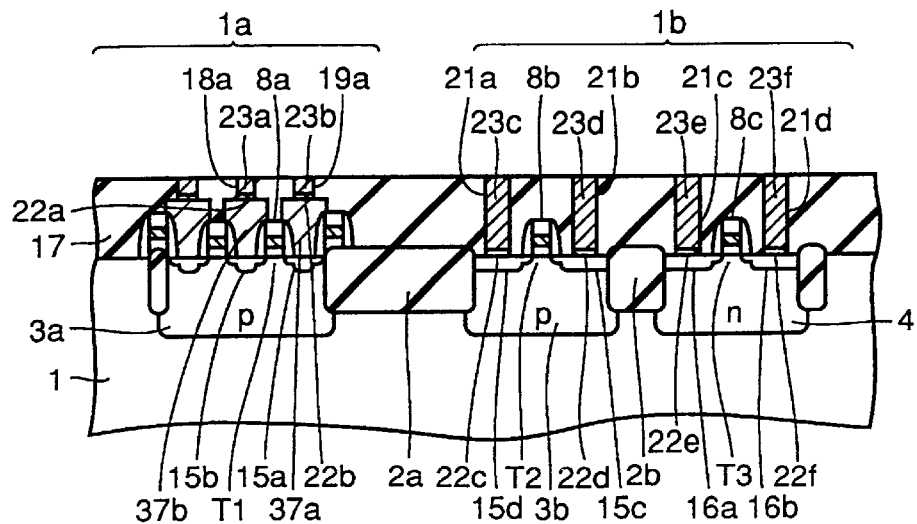
FIG. 34 is a cross sectional view showing a step carried out after that shown in FIG. 33 in the embodiment 6 of the present invention.
Figure 35:
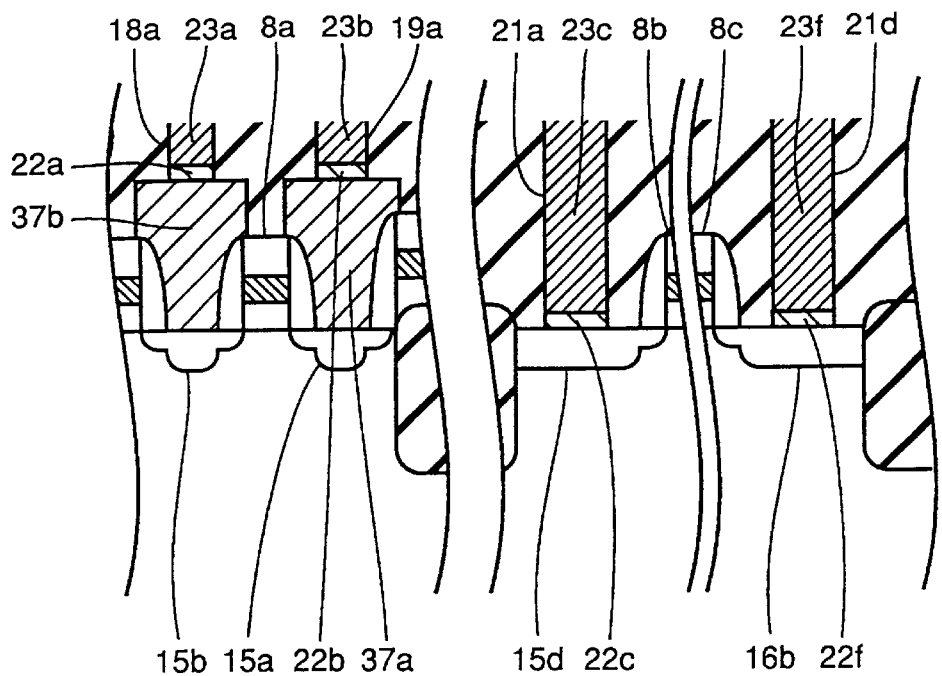
FIG. 35 is a partially enlarged cross sectional view of the step shown in FIG. 34 in the embodiment 6 of the present invention.

Referring to FIGS. 34 and 35, titanium films 22a, 22b, 22c, 22d, 22e and 22f and titanium nitride films 23a, 23b, 23c, 23d, 23e and 23f are successively formed in the bit line contact hole 18a, the storage node contact hole 19a and the peripheral circuit contact holes 21a, 21b, 21c and 21d respectively by sputtering or the like.

Figure 36:
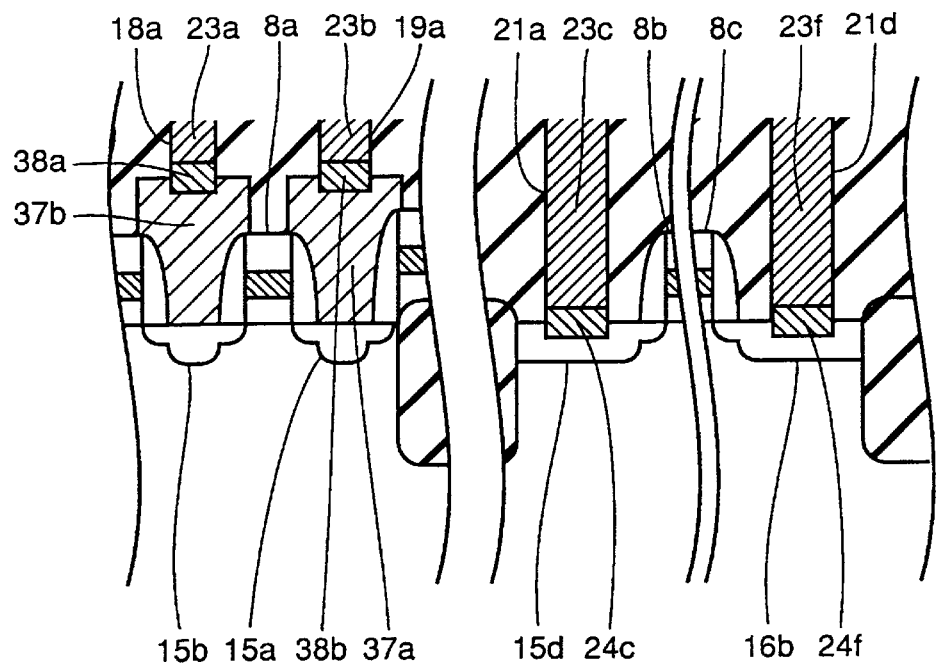
FIG. 36 is a cross sectional view showing a step carried out after that shown in FIG. 34 in the embodiment 6 of the present invention.

Referring to FIG. 36, heat treatment is performed to react the titanium films 22a and 22b with silicon contained in the epitaxial silicon growth layers 37b and 37a, thereby forming titanium silicide films 38a and 38b. Further, the titanium films 22c, 22d, 22e and 22f are reacted with silicon contained in the n-type source/drain regions 15d and 15c and the p-type source/drain regions 16a and 16b, thereby forming titanium silicide films 24c, 24d, 24e and 24f respectively. Conditions for the heat treatment are preferably identical to those described with reference to the embodiment 2.

Figure 37:
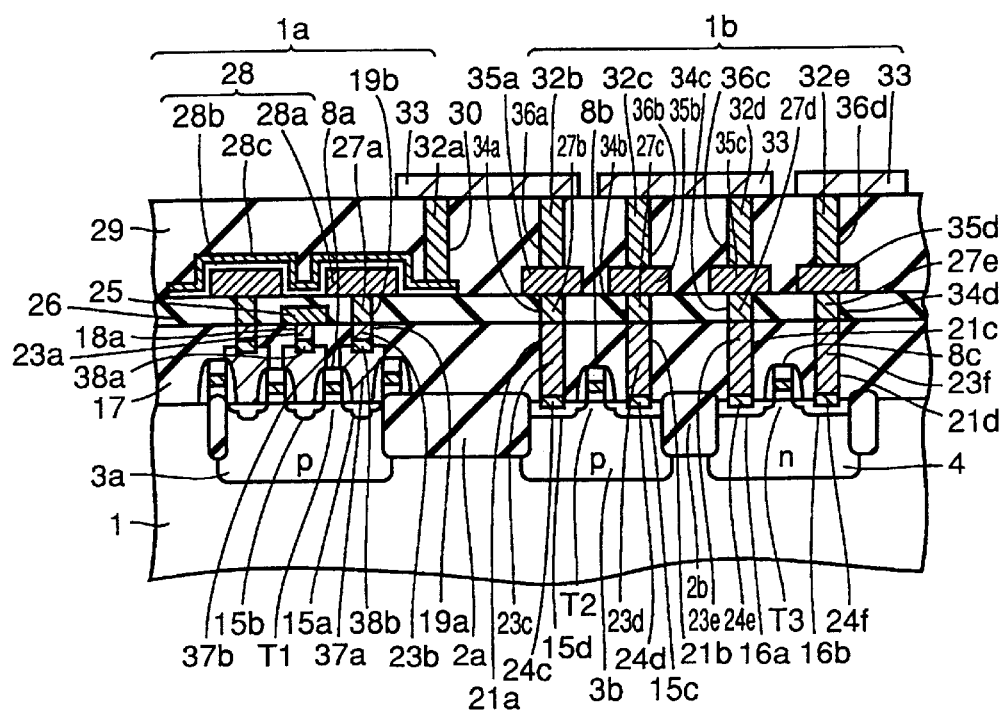
FIG. 37 is a cross sectional view showing a step carried out after that shown in FIG. 36 in the embodiment 6 of the present invention.

Thereafter steps similar to those shown in FIGS. 19 to 26 described with reference to the embodiment 4, thereby obtaining the structure shown in FIG. 37. Thereafter an interlayer insulation film (not shown) and a passivation film (not shown) are formed to cover metal wires 33, thereby completing the DRAM.

In addition to an effect of reducing leakage currents, the aforementioned fabrication method attains an effect of improving electrical connection between an element formed in the memory cell region 1a and those formed in the peripheral circuit region 1b, as described with reference to the embodiments 2 and 4. While the epitaxial silicon growth layers 37a and 37b are formed on the n-type source/drain regions 15a and 15b in this embodiment, layers of a silicon-germanium alloy may alternatively be selectively epitaxially grown.

Embodiment 7

A DRAM according to an embodiment 7 of the present invention is now described with reference to FIG. 38.

Figure 38:
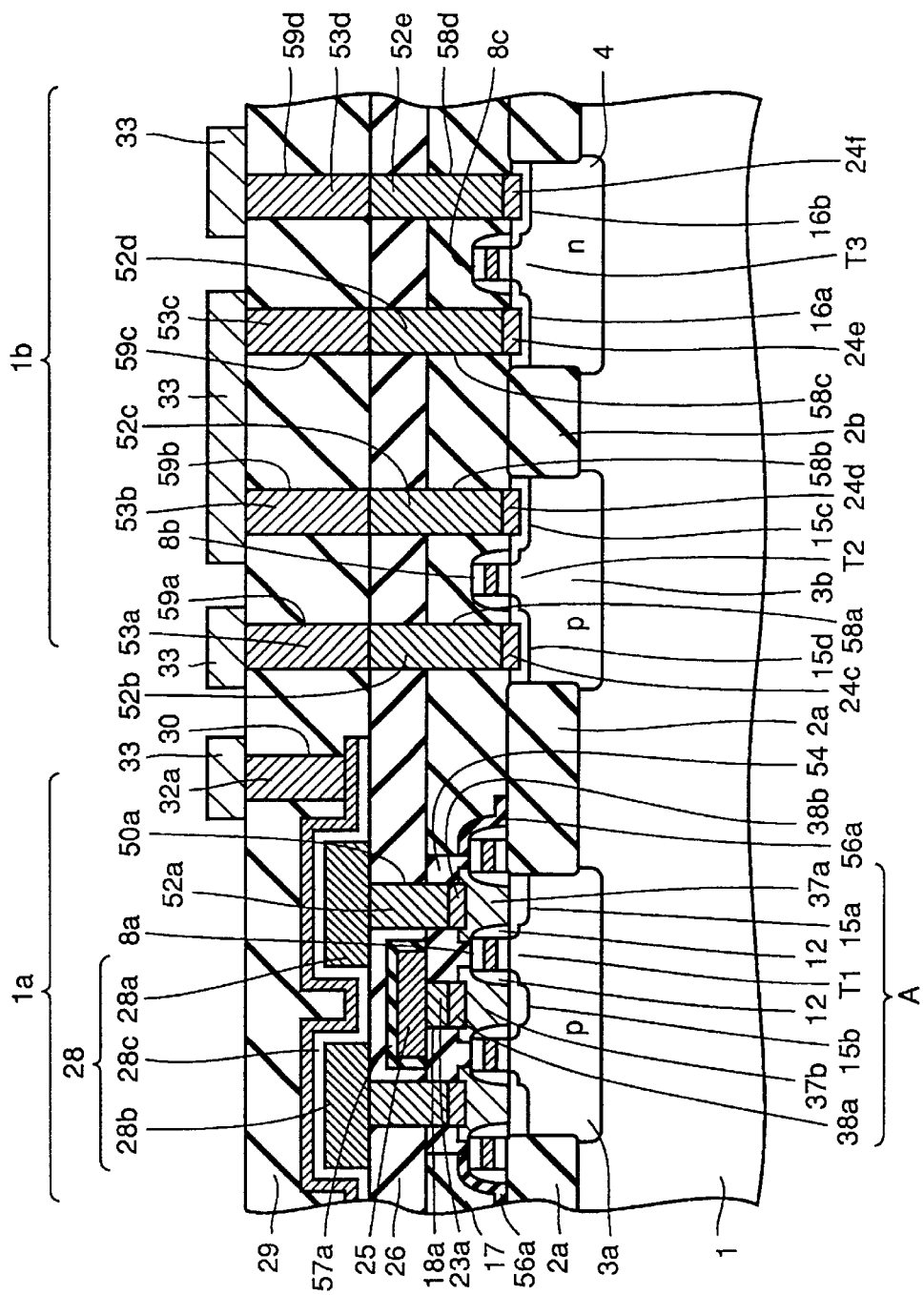
FIG. 38 is a cross sectional view showing a DRAM according to an embodiment 7 of the present invention.

Referring to FIG. 38, epitaxial silicon growth layers 37a and 37b serving as first and fourth conductor layers are formed on n-type source/drain regions 15a and 15b of a MOS transistor T1 in a memory cell region 1a respectively. These epitaxial silicon growth layers 37a and 37b are formed to cover sidewall oxide films 12 which are formed on side surfaces of a gate electrode portion 8a. A silicon nitride film 56a serving as a second protective layer is formed to cover a gate electrode serving as a second gate electrode portion located on an element isolation insulator film 2a. On the other hand, no silicon nitride film is formed on a gate electrode portion serving as a first gate electrode portion in an element forming region A.

A silicon oxide film 54 is formed to cover the epitaxial silicon growth layers 37a and 37b. A bit line contact hole 18a serving as a first contact hole exposing a surface of the epitaxial silicon growth layer 37b is formed in the silicon oxide film 54. A titanium silicide film 38a and a titanium nitride film 23a are formed in the bit line contact hole 18a.

A bit line 25 serving as a first conductor region which is electrically connected with the titanium nitride film 23a is formed on the silicon oxide film 54. A silicon nitride film 57a serving as a first protective layer is formed on the bit line 25. A silicon oxide film 26 is formed on the silicon oxide films 54 and 17, to cover the silicon nitride film 57a. A storage node contact hole 50a serving as a second contact hole exposing a surface of the epitaxial silicon growth layer 37a is formed in the silicon oxide films 26 and 54. A titanium silicide film 38b and a titanium nitride film 52a are formed in the storage node contact hole 50a.

In a peripheral circuit region 1b of the DRAM, on the other hand, peripheral circuit contact holes 58a and 58b exposing surfaces of n-type source/drain regions 15d and 15c respectively are formed in the silicon oxide films 26 and 17. Titanium silicide films 24c and 24d and titanium nitride films 52b and 52c are formed in the peripheral circuit contact holes 58a and 58b respectively. Further, peripheral circuit contact holes 58c and 58d are formed to expose surfaces of p-type source/drain regions 16a and 16b respectively. Titanium silicide films 24e and 24f and titanium nitride films 52d and 52e are formed in the peripheral circuit contact holes 58c and 58d respectively.

Peripheral circuit contact holes 59a, 59b, 59c and 59d exposing surfaces of the titanium nitride films 52b, 52c, 52d and 52e respectively are formed in an interlayer insulation film 29. Titanium nitride films 53a, 53b, 53c and 53d are formed in the peripheral circuit contact holes 59a, 59b, 59c and 59d respectively. The remaining structure of the DRAM shown in FIG. 38 is substantially identical to that of the DRAM shown in FIG. 27 described with reference to the embodiment 5, and hence members identical to those shown in FIG. 27 are denoted by the same reference numerals, to omit redundant description.

In the aforementioned structure, silicon contained in the n-type source/drain regions 15a and 15b is inhibited from being influenced by heat treatment for forming the titanium silicide films 38a and 38b, as described with reference to the embodiment 5. Namely, consumption of the silicon can be suppressed. Thus, currents leaking from the n-type source/drain regions 15a and 15b to a silicon substrate are reduced.

Further, the electrical resistance between the bit line 25 and the n-type source/drain region 15b as well as that between a storage node 28a and the n-type source/drain region 15a are reduced, thereby improving the operating speed of the DRAM.

In addition to these effects, the aforementioned structure attains the following effect: The epitaxial silicon growth layers 37a and 37b are formed to extend over the gate electrode portion 8a and the sidewall oxide films 12. Even if misalignment is caused in formation of the bit line contact hole 18a, therefore, the sidewall oxide films 12 are inhibited from being etched in etching of the silicon oxide film 54. Therefore, no polysilicon film part of the gate electrode portion 8a is exposed and an electrical short between the bit line 25 and the gate electrode portion 8a can be prevented.

The sidewall oxide films 12 are also inhibited from being etched in formation of the storage node contact hole 50a. On the other hand, the silicon nitride film 57a covering the bit line 25 may be exposed in formation of the storage node contact hole 50a due to misregistration of the bit line 25, as described with reference to an embodiment 8 of the present invention. In this case, the exposed part of the silicon nitride film 57a is exposed to etching gas for a time corresponding to that up to exposure of the surface of the epitaxial silicon growth layer 37a. As compared with the case of forming a contact hole exposing the surface of the n-type source/drain region 15a as a storage node contact hole, therefore, the time required for etching is reduced. Thus, the silicon nitride film 57a is inhibited from being etched to expose a surface of the bit line 25. Further, the titanium nitride film 52a formed in the storage node contact hole 50a can prevent the storage node 28c and the bit line 25 from an electrical short.

Further, the peripheral circuit contact holes 58a, 58b, 58c and 58d are formed in the silicon oxide films 26 and 17 and the peripheral circuit contact holes 59a, 59b, 59c and 59d are formed in the interlayer insulation film 29 as contact holes in the peripheral circuit region 1b. As compared with the case of forming contact holes in the interlayer insulation film 29 and the silicon oxide films 17 and 26 through a single step, therefore, the aspect ratios of the peripheral circuit contact holes 58a to 58d and 59a to 59d are further reduced, and the peripheral circuit contact holes 58a to 58d and 59a to 59d can be readily formed.

When a cell plate contact hole 30 and the peripheral circuit contact holes 59a, 59b, 59c and 59d are simultaneously formed, a surface of the cell plate 28c is exposed on the bottom of the cell plate contact hole 30 in advance. The exposed surface of the cell plate 28c is exposed to plasma for a time corresponding to that required for etching up to exposure of surfaces of the titanium nitride films 52b, 52c, 52d and 52e. As compared with the case of forming contact holes exposing surfaces of the n- and p-type source/drain regions 15a, 15b, 16a and 16b, therefore, the time for exposing the cell plate 28c to the plasma is reduced. Thus, the cell plate 28c can be prevented from being damaged by the etching, or the cell plate contact hole 30 can be prevented from passing through the cell plate 28c.

Further, the silicon nitride film 56a is formed to cover the gate electrode portion extending on the element isolation oxide film 2a of the memory cell region 1a, while no silicon nitride film is formed on the gate electrode portion of the element forming region A. This is because a silicon nitride film is formed to cover the gate electrode portions, including the gate electrode portion 8a, formed in the memory cell region 1a at first and a part of this silicon nitride film located on a prescribed opening is removed in formation of the element forming region A, as described in detail with reference to the embodiment 8.

Embodiment 8

Figure 39:
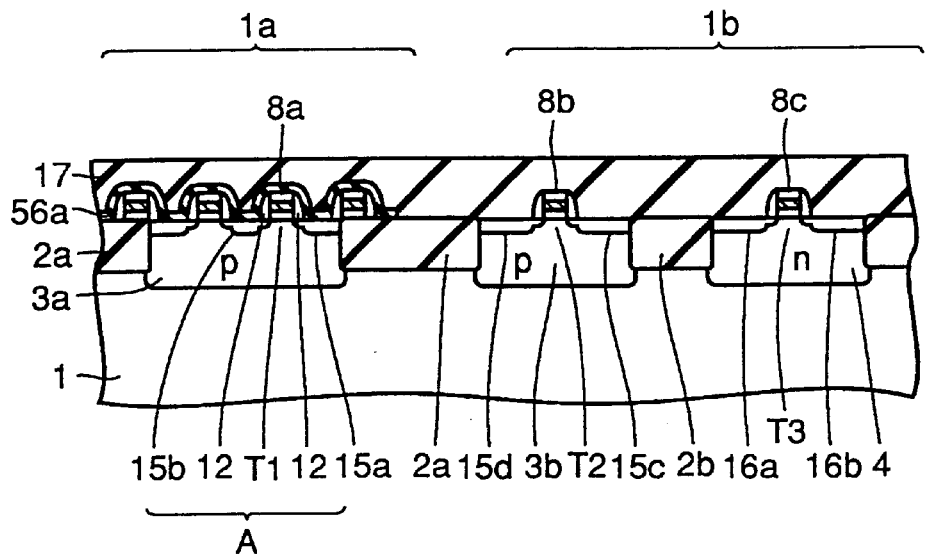
FIG. 39 is a cross sectional view showing a step in a method of fabricating a DRAM according to an embodiment 8 of the present invention.
Figure 40:
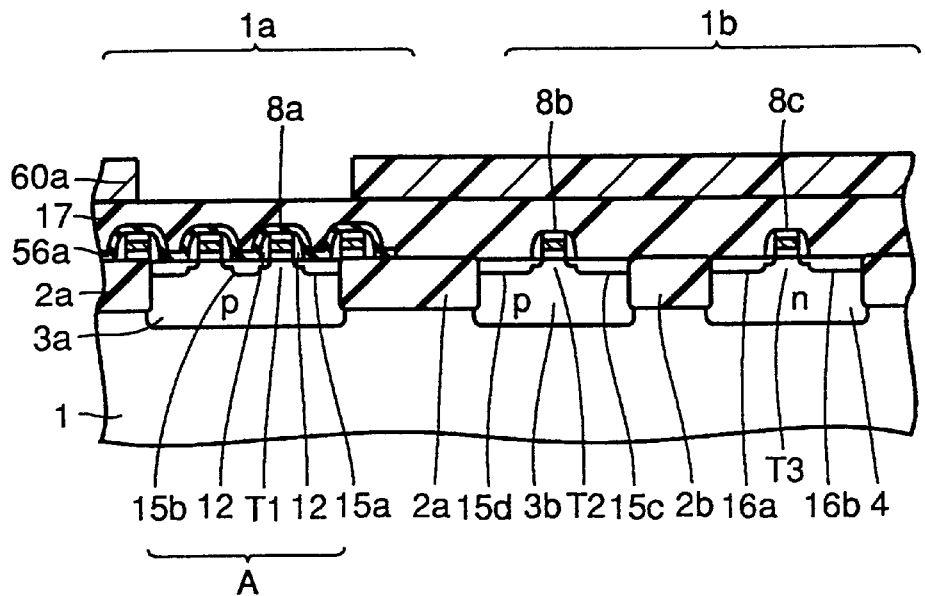
FIG. 40 is a cross sectional view showing a step carried out after that shown in FIG. 39 in the embodiment 8 of the present invention.

As the embodiment 8 of the present invention, an exemplary method of fabricating the DRAM according to the embodiment 7 is now described with reference to FIGS. 39 to 53. Referring to FIGS. 39 and 2, a silicon nitride film (not shown) is formed on a silicon substrate 1 to cover gate electrode portions 8a, 8b and 8c before formation of a silicon oxide film 17, in a step similar to that shown in FIG. 2. Thereafter a photoresist film (not shown) covering a memory cell region 1a is employed as a mask to anisotropically etch the silicon nitride film, for removing a part of the silicon nitride film from a peripheral circuit region 1b while leaving a silicon nitride film 56a only in the memory cell region 1a. The silicon oxide film 17 is formed on the silicon substrate 1, to cover this silicon nitride film 56a. Referring to FIG. 40, a photoresist film 60a is formed on the silicon oxide film 17. The photoresist film 60a has an opening in a region corresponding to an element forming region A of the memory cell region 1a.

Figure 41:
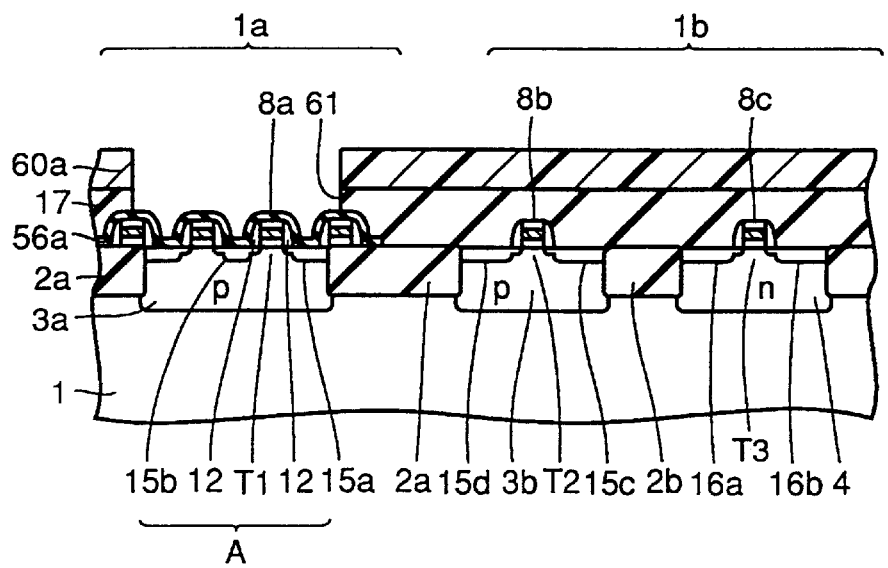
FIG. 41 is a cross sectional view showing a step carried out after that shown in FIG. 40 in the embodiment 8 of the present invention.

Referring to FIG. 41, the photoresist film 60a is employed as a mask to anisotropically etch the silicon oxide film 17, for exposing a part of the silicon nitride film 56a in the region corresponding to the element forming region A. At this time, etching gas is preferably prepared by mixing CO gas into $CHF_3$ gas. According to "$SiO_2/Si_3N_4$ High Selection Ratio in SAC Etching" by Morio, Monthly Semiconductor World, November 1995, pp. 83–85, for example, the silicon oxide film 17 can be etched more quickly than the silicon nitride film 56a by employing this mixed gas. In other words, the etching selection ratio between the silicon nitride film 56a and the silicon oxide film 17 can be set at a relatively large value.

Figure 42:
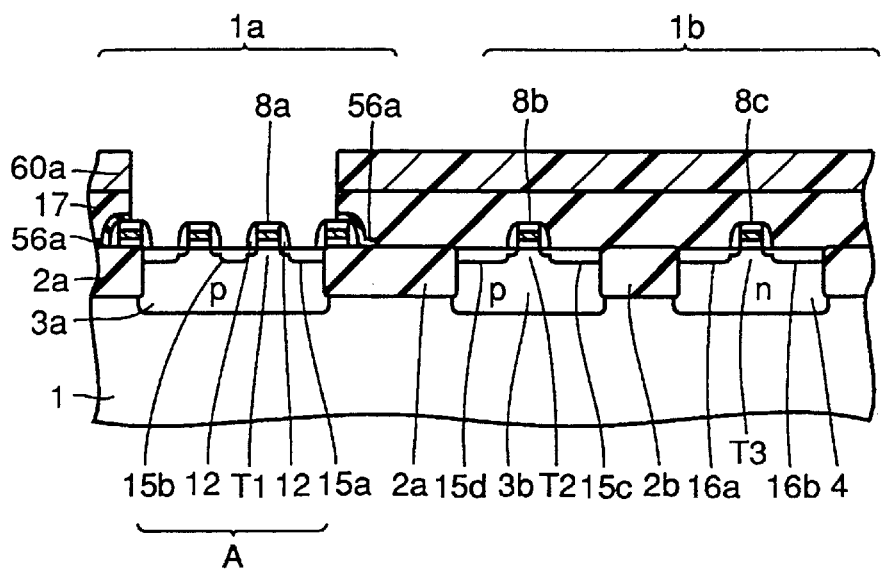
FIG. 42 is a cross sectional view showing a step carried out after that shown in FIG. 41 in the embodiment 8 of the present invention.
Figure 43:
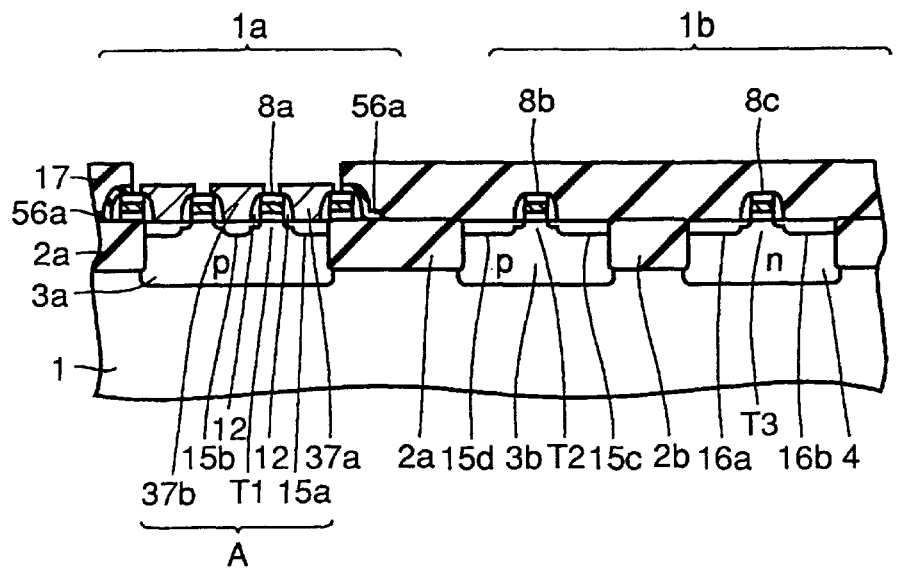
FIG. 43 is a cross sectional view showing a step carried out after that shown in FIG. 42 in the embodiment 8 of the present invention.
Figure 44:
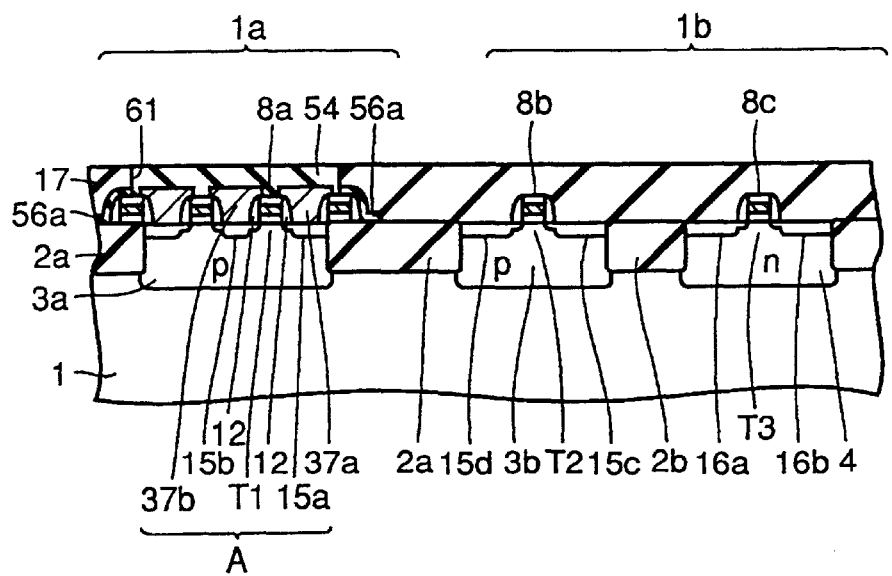
FIG. 44 is a cross sectional view showing a step carried out after that shown in FIG. 43 in the embodiment 8 of the present invention.

An opening 61 formed in this step has a considerably larger opening area as compared with a bit line contact hole and a storage node contact hole. Therefore, the aspect ratio of the opening 61 is substantially reduced. After a part of the silicon nitride film 56a formed on the gate electrode portion 8a is exposed, therefore, the opening 61 can be readily formed without excessively etching this part. Referring to FIG. 42, the exposed part of the silicon nitride film 56a is removed. Referring to FIG. 43, epitaxial silicon growth layers 37a and 37b are selectively formed on n-type source/drain regions 15a and 15b respectively by chemical vapor deposition or the like. Referring to FIG. 44, a silicon oxide film 54 is formed in the opening 61 to cover the epitaxial silicon growth layers 37a and 37b.

Figure 45:
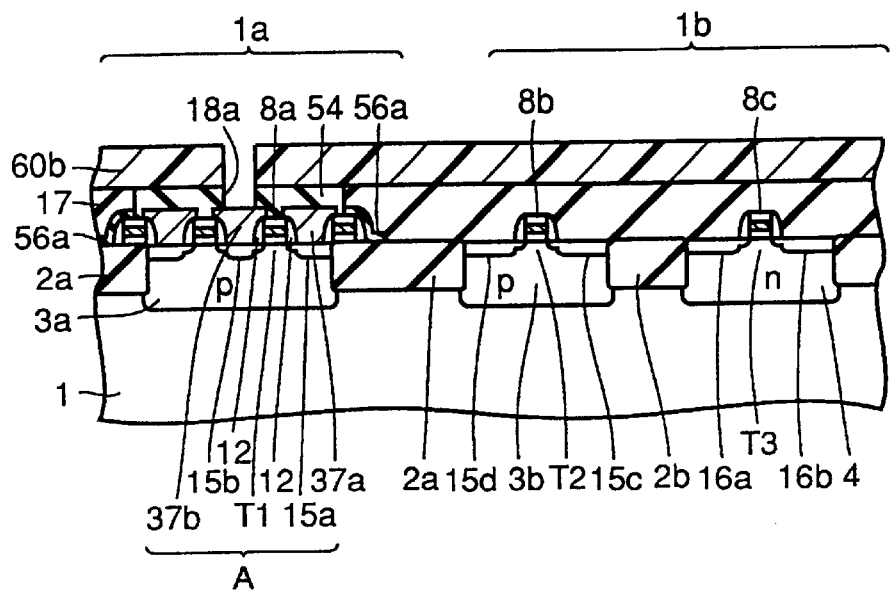
FIG. 45 is a cross sectional view showing a step carried out after that shown in FIG. 44 in the embodiment 8 of the present invention.
Figure 46:
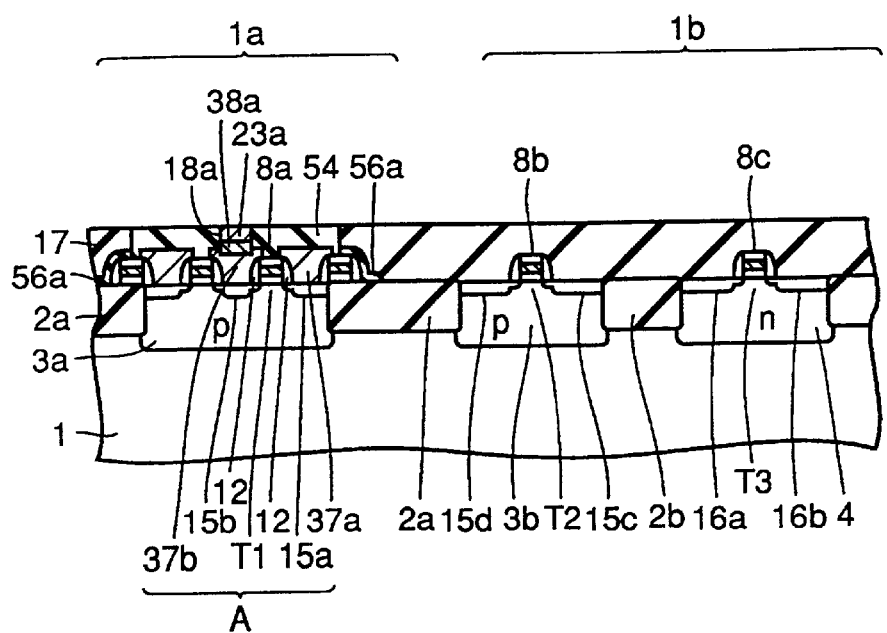
FIG. 46 is a cross sectional view showing a step carried out after that shown in FIG. 45 in the embodiment 8 of the present invention.

Referring to FIG. 45, a photoresist film 60b is formed on the silicon oxide films 17 and 54. This photoresist film 60b is employed as a mask to anisotropically etch the silicon oxide film 54, for forming a bit line contact hole 18a exposing a surface of the epitaxial silicon growth layer 37b. Referring to FIG. 46, a titanium silicide film 38a and a titanium nitride film 23a are formed in the bit line contact hole 18a through a step similar to that described with reference to the embodiment 6.

Figure 47:
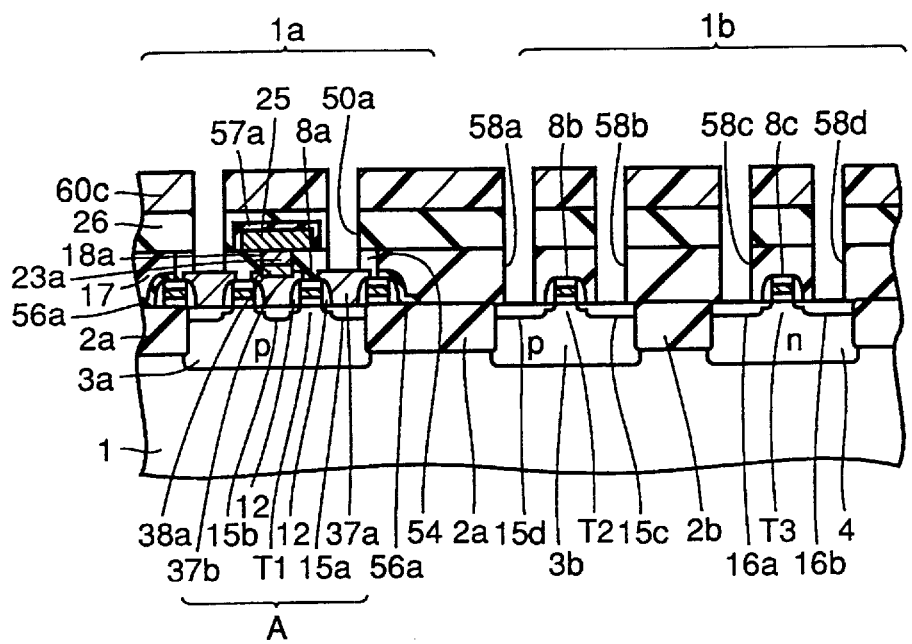
FIG. 47 is a cross sectional view showing a step carried out after that shown in FIG. 46 in the embodiment 8 of the present invention.

Referring to FIG. 47, a bit line 25 which is electrically connected to the titanium nitride film 23a is formed on the silicon oxide film 54. A silicon nitride film 57a is formed to cover the bit line 25. A silicon oxide film 26 is formed on the silicon oxide films 17 and 54, to cover the silicon nitride film 57a. A photoresist film 60c is formed on the silicon oxide film 26. This photoresist film 60c is employed as a mask to anisotropically etch the silicon oxide films 26 and 54 for forming a storage node contact hole 50a exposing a surface of the epitaxial silicon growth layer 37a in the memory cell region 1a. In the peripheral circuit region 1b, on the other hand, peripheral circuit contact holes 58a and 58b are formed to expose surfaces of the n-type source/drain regions 15a and 15c respectively. Further, peripheral circuit contact holes 58c and 58d are formed to expose surfaces of the p-type source/drain regions 16a and 16b respectively.

Figure 48:
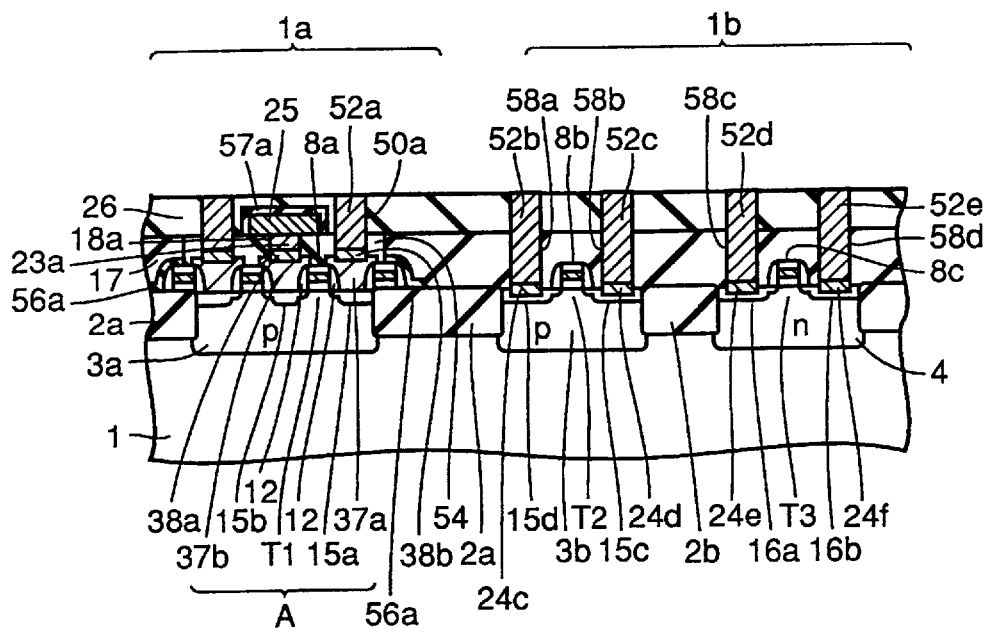
FIG. 48 is a cross sectional view showing a step carried out after that shown in FIG. 47 in the embodiment 8 of the present invention.

Referring to FIG. 48, a titanium silicide film 38b and a titanium nitride film 52a are formed in the bit line contact hole 50a through steps similar to those shown in FIGS. 34, 35 and 36 described with reference to the embodiment 6. Further, titanium silicide films 24c, 24d, 24e and 24f and titanium nitride films 52b, 52c, 52d and 52e are formed in the peripheral circuit contact holes 58a, 58b, 58c and 58d respectively.

Figure 49:
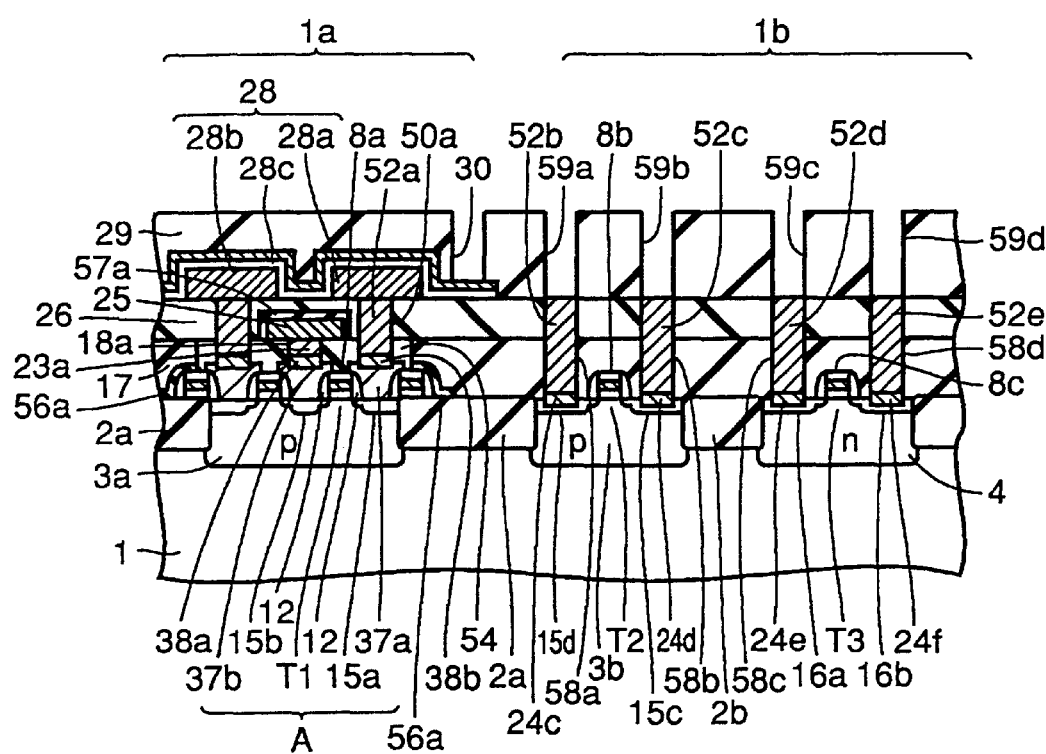
FIG. 49 is a cross sectional view showing a step carried out after that shown in FIG. 48 in the embodiment 8 of the present invention.

Referring to FIG. 49, a storage node 28a which is electrically connected to the titanium nitride film 52a is formed on the silicon oxide film 26. A cell plate 28c is formed on the storage node 28a with a capacitor dielectric film 28b interposed. An interlayer insulation film 29 is formed on the silicon oxide film 26 to cover the cell plate 28c. A photoresist film (not shown) is formed on the interlayer insulation film 29. This photoresist film is employed as a mask to anisotropically etch the interlayer insulation film 29, for forming a cell plate contact hole 30 exposing a surface of the cell plate 28c. Further, peripheral circuit contact holes 59a, 59b, 59c and 59d are formed to expose surfaces of the titanium nitride films 52b, 52c, 52d and 52e respectively.

Thereafter a titanium nitride film 32a is formed in the cell plate contact hole 30. Further, titanium nitride films 53a, 53b, 53c and 53d are formed in the peripheral circuit contact holes 59a, 59b, 59c and 59d respectively. Thereafter prescribed wires 33 are formed on the interlayer insulation film 29. Thus, the DRAM shown in FIG. 38 is completed.

Figure 50:
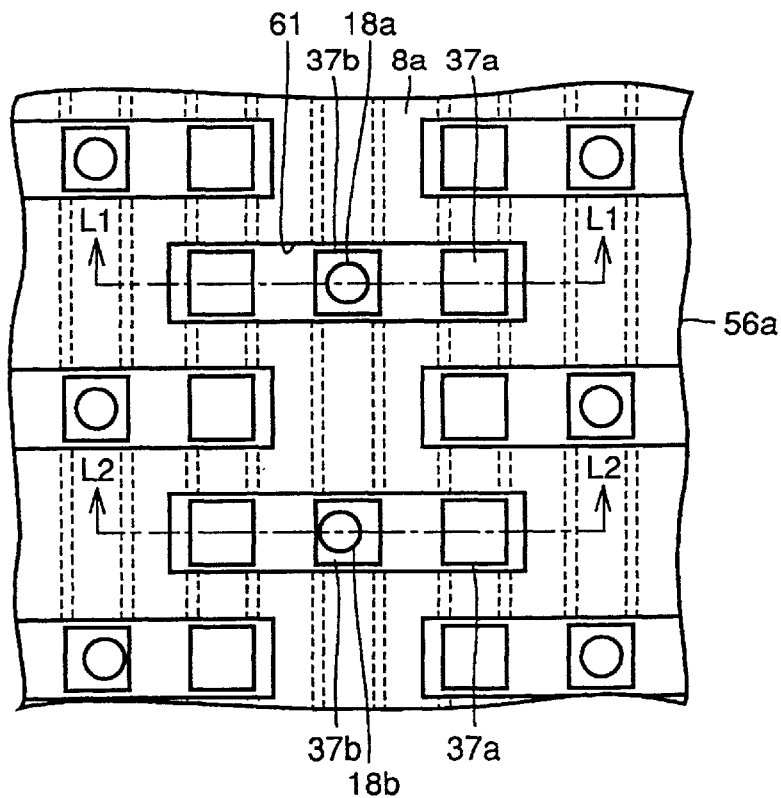
FIG. 50 is a plan view of the step shown in FIG. 42 in the embodiment 8 of the present invention.

In addition to effects of reducing leakage currents and attaining excellent electrical connection between an element of the memory cell region 1a and those of the peripheral circuit region 1b as described with reference to the embodiment 6, the aforementioned fabrication method has the following effects: FIG. 50 shows a plane structure in the step shown in FIG. 40, and the section shown in FIG. 42 is taken along the line L1—L1 in FIG. 50. Referring to FIGS. 41, 42 and 50, the opening 61 formed in the silicon oxide film 17 on the element forming region A of the memory cell region 1a has a sufficiently large opening sectional area as compared with the bit line contact hole 18a. Thus, the aspect ratio of the opening 61 is substantially further reduced, so that the opening 61 can be readily formed in the step shown in FIG. 41.

At this time, the part of the silicon nitride film formed on the gate electrode 8a is exposed in advance. Due to the reduced aspect ratio, however, the part of the silicon nitride film exposed in advance can be inhibited from being excessively etched before those of the silicon nitride film formed on the surfaces of the n-type source/drain regions 15a and 15b are exposed. Therefore, sidewall oxide films 12 located under the part of the silicon nitride film exposed in advance can be prevented from being etched. Thus, electrical insulation between the epitaxial silicon growth layers 37a and 37b and the gate electrode 8a is improved.

Figure 51:
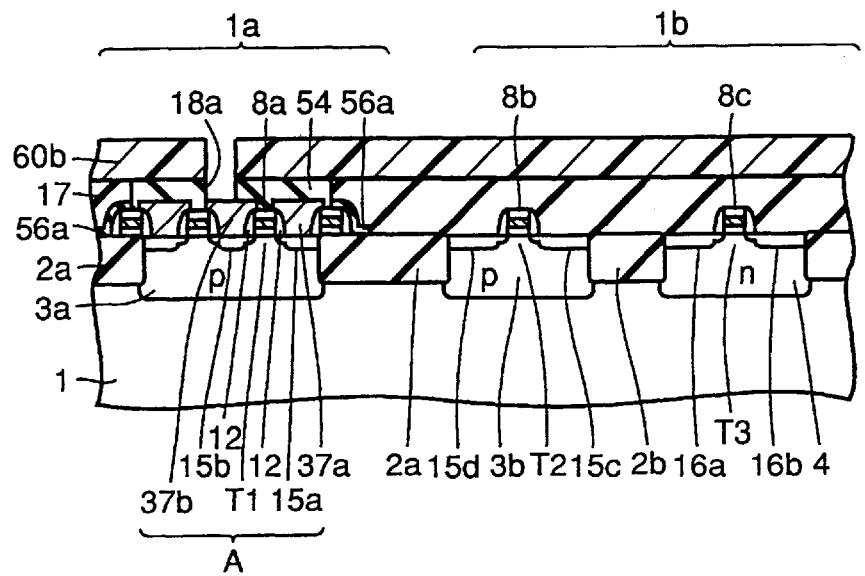
FIG. 51 is a cross sectional view taken along the line L2—L2 in FIG. 50.

Referring to FIGS. 50 and 51, a deviating bit line contact hole 18b may be formed due to misalignment or the like. In this case, an end portion of the upper surface of the epitaxial silicon growth layer 37b is exposed. FIG. 51 is a sectional view taken along the line L2—L2 in FIG. 50. The epitaxial silicon growth layer 37b is formed to extend over the gate electrode portion 8a. Therefore, the gate electrode portion 8a and the sidewall oxide films 12 can be prevented from being etched in formation of the bit line contact hole 18b. Consequently, the bit line 25 thereafter formed and the gate electrode can be prevented from an electrical short.

Figure 52:
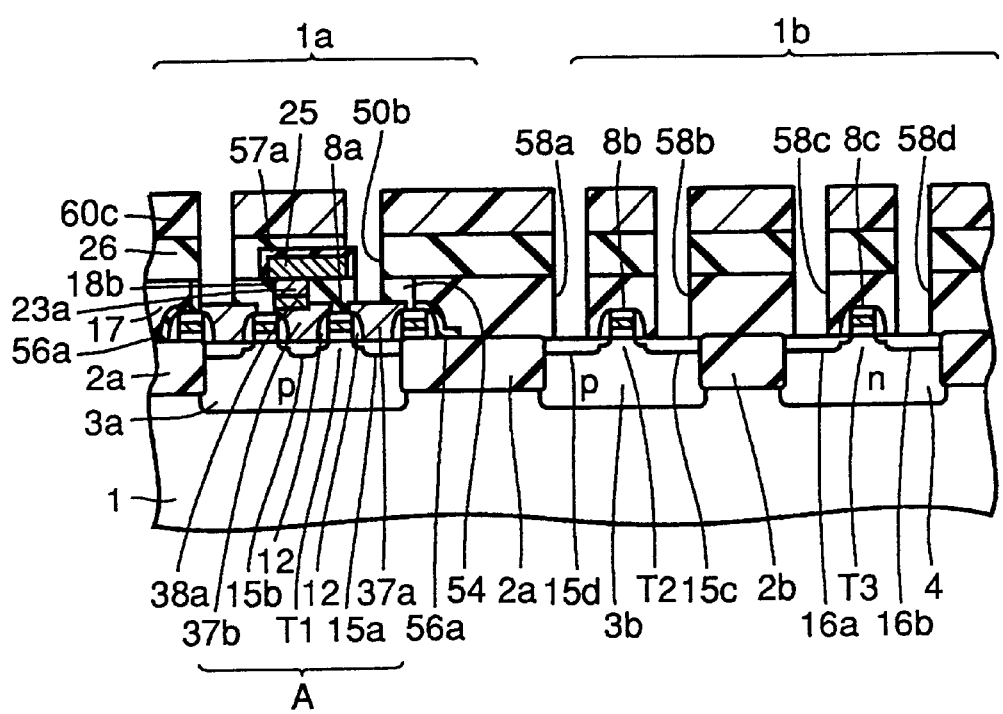
FIG. 52 is a cross sectional view showing a step carried out after that shown in FIG. 51 in the embodiment 8 of the present invention.
Figure 89:
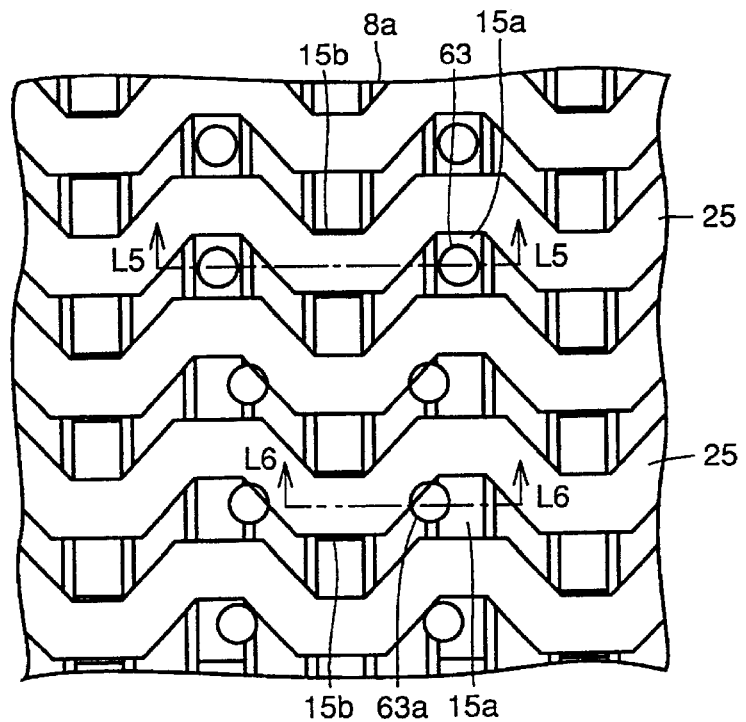
FIG. 89 is a plan view of the step shown in FIG. 84.
Figure 90:
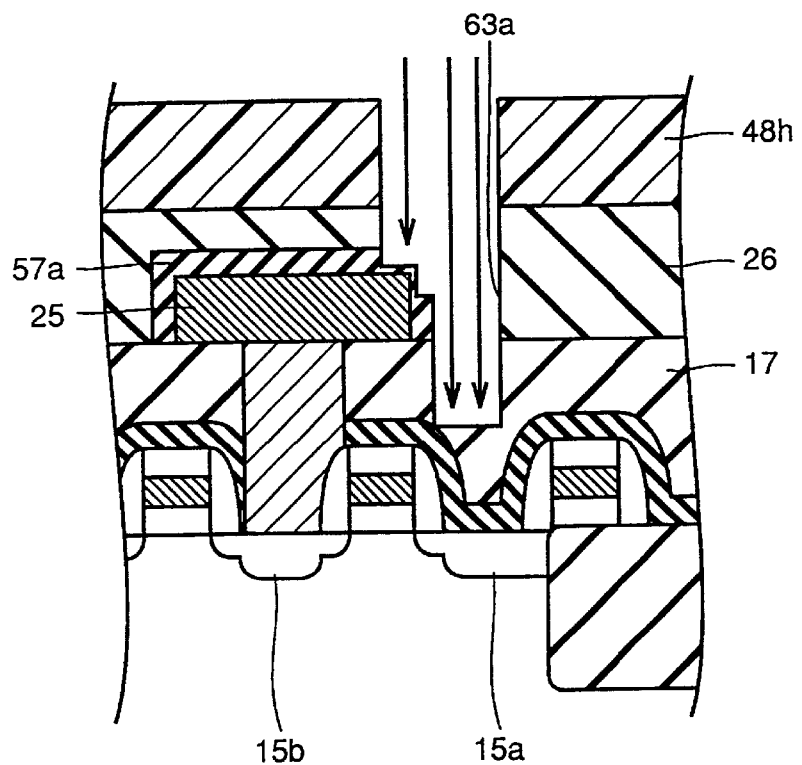
FIG. 90 is a cross sectional view taken along the line L6—L6 in FIG. 89.

As described with reference to FIG. 89 in relation to the prior art, on the other hand, a deviating storage node contact hole 50b may be formed as shown in FIG. 52, due to misalignment or the like. In this case, the exposed surface of the silicon nitride film 57a covering the bit line 25 is exposed to etching gas for a time corresponding to that up to exposure of the surface of the epitaxial silicon growth layer 37a. As compared with the case of forming a storage node contact hole exposing the surface of the n-type source/drain region 15a with no presence of the epitaxial silicon growth layer 37a, therefore, the time for exposing the precedently exposed surface of the silicon nitride film 57a to the etching gas is reduced. Thus, the exposed surface of the silicon nitride film 57a can be inhibited from being excessively etched to expose the bit line 25. Consequently, the storage node 28a thereafter formed and the bit line 25 can be prevented from an electrical short.

Further, the storage node 28a and the gate electrode portion 8a can also be prevented from an electrical short similarly to the case of the bit line 25.

Figure 53:
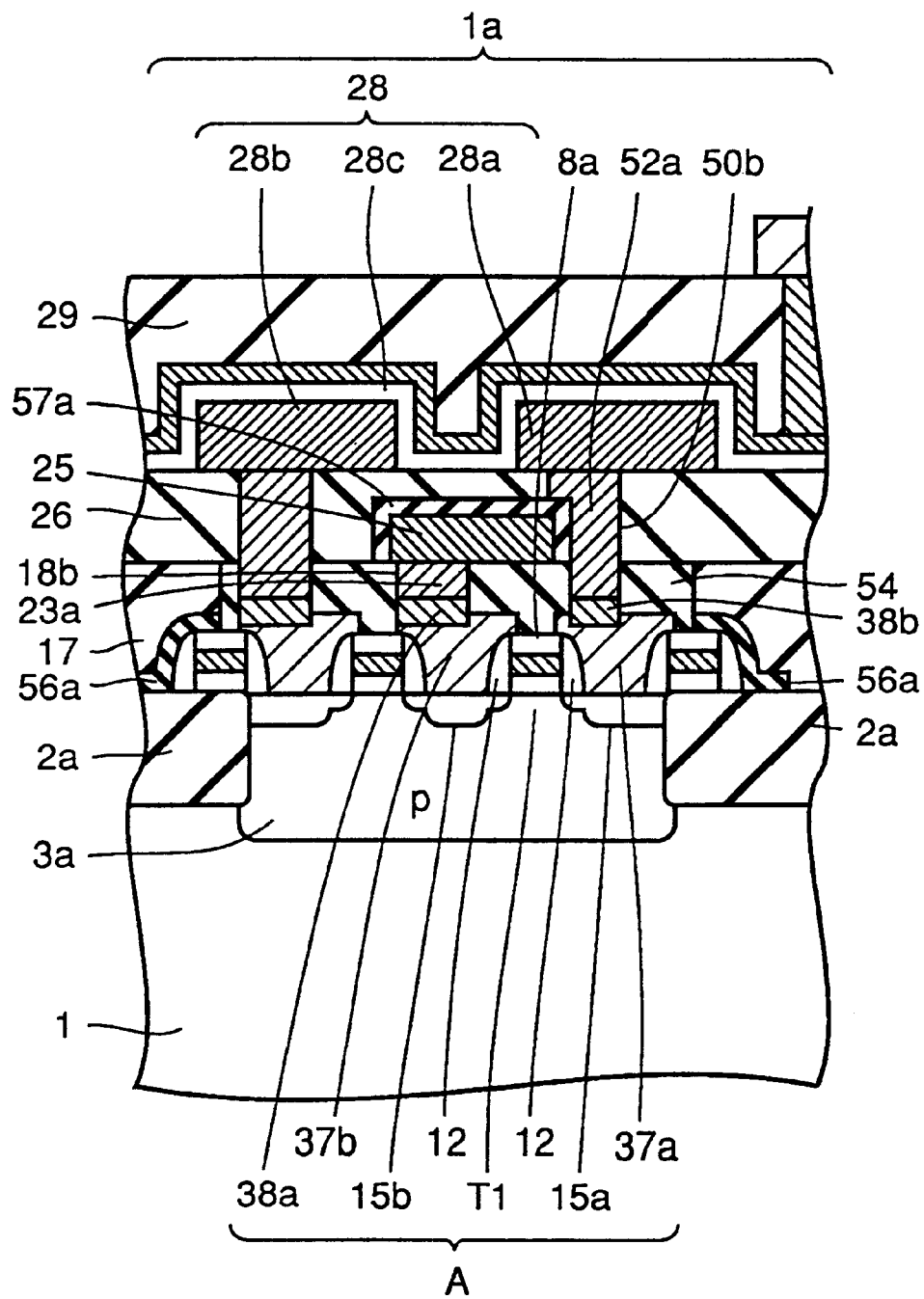
FIG. 53 is a cross sectional view showing a step carried out after that shown in FIG. 52 in the embodiment 8 of the present invention.
Figure 54:
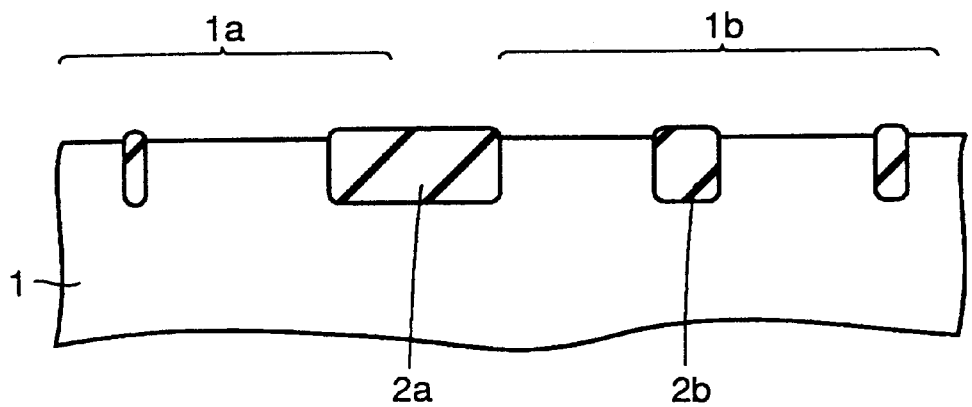
FIG. 54 is a cross sectional view showing a step in a method of fabricating a DRAM according to first prior art.
Figure 55:
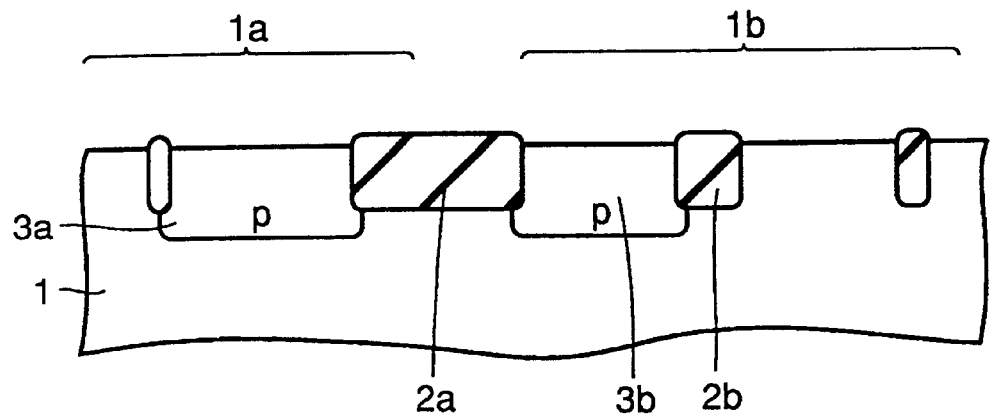
FIG. 55 is a cross sectional view showing a step carried out after that shown in FIG. 54.
Figure 56:
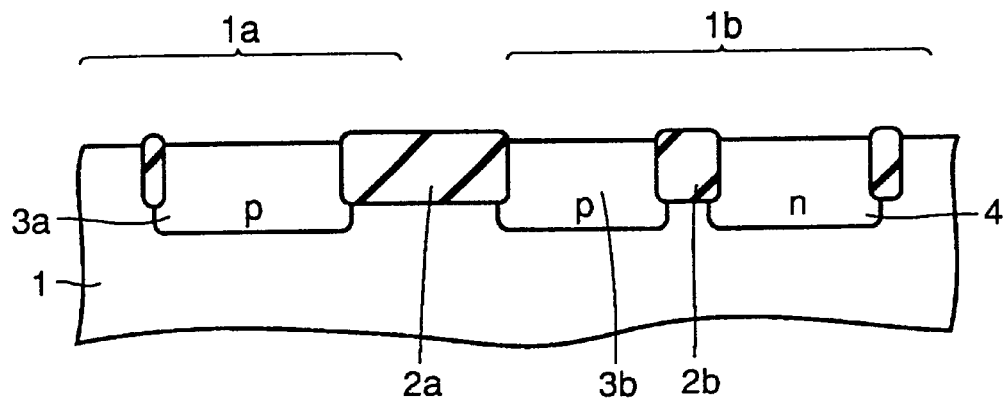
FIG. 56 is a cross sectional view showing a step carried out after that shown in FIG. 55.
Figure 57:
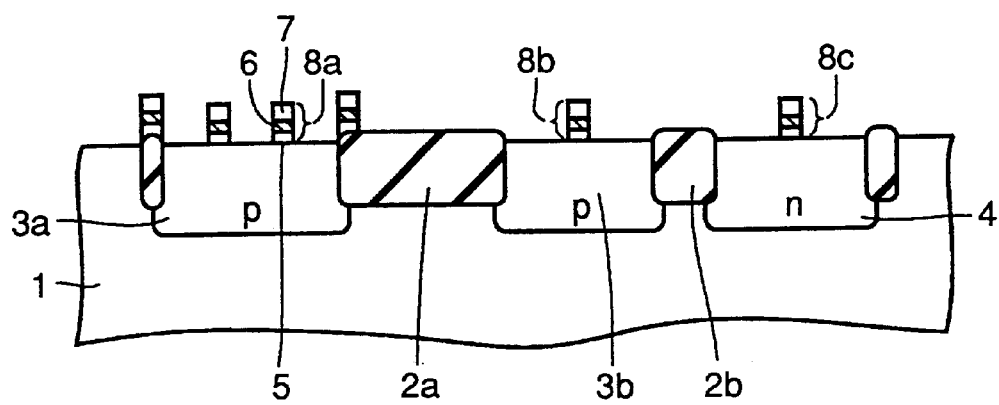
FIG. 57 is a cross sectional view showing a step carried out after that shown in FIG. 56.
Figure 58:
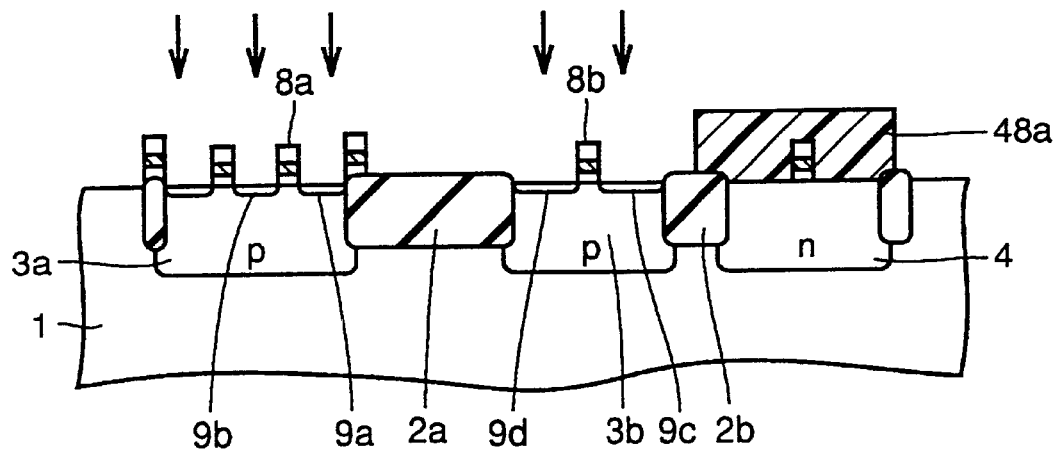
FIG. 58 is a cross sectional view showing a step carried out after that shown in FIG. 57.
Figure 59:
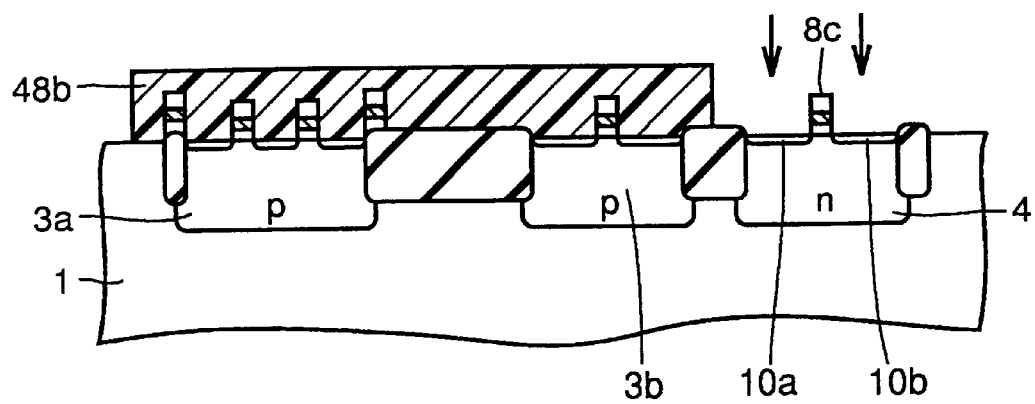
FIG. 59 is a cross sectional view showing a step carried out after that shown in FIG. 58.
Figure 60:
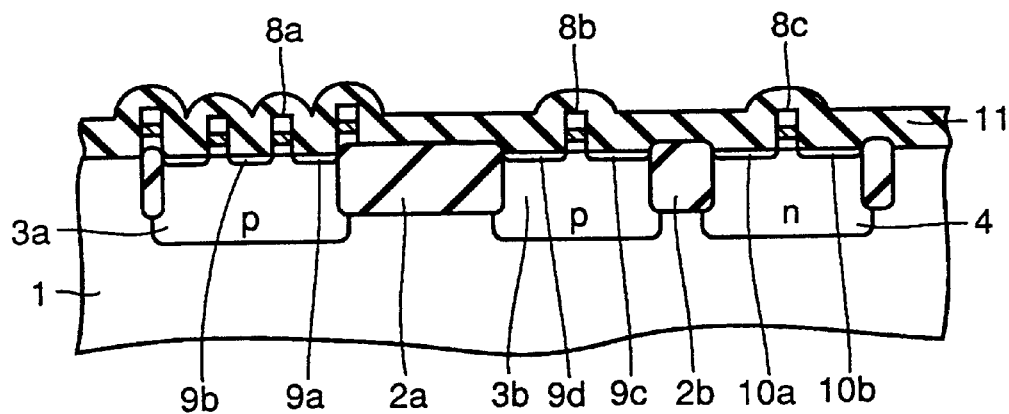
FIG. 60 is a cross sectional view showing a step carried out after that shown in FIG. 59.
Figure 61:
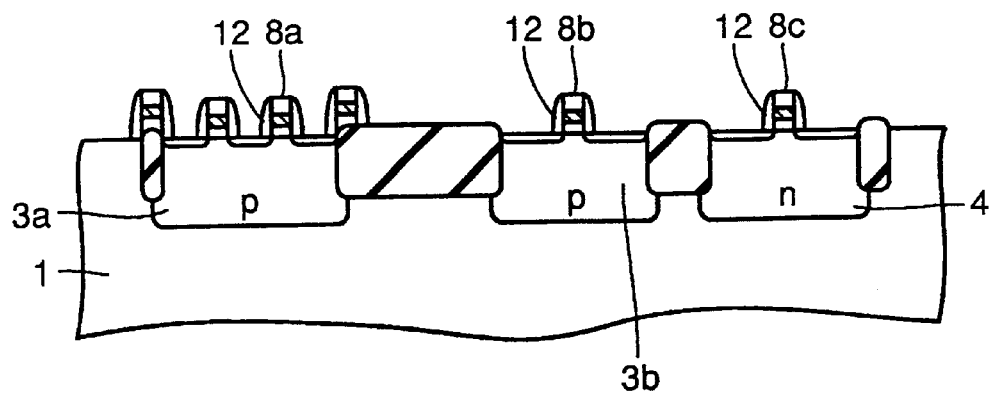
FIG. 61 is a cross sectional view showing a step carried out after that shown in FIG. 60.
Figure 62:
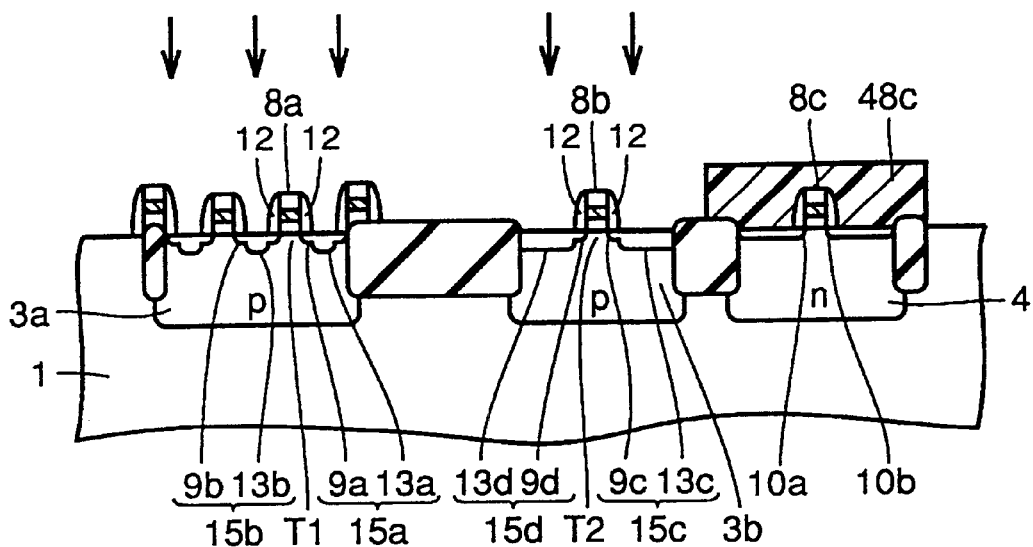
FIG. 62 is a cross sectional view showing a step carried out after that shown in FIG. 61.
Figure 63:
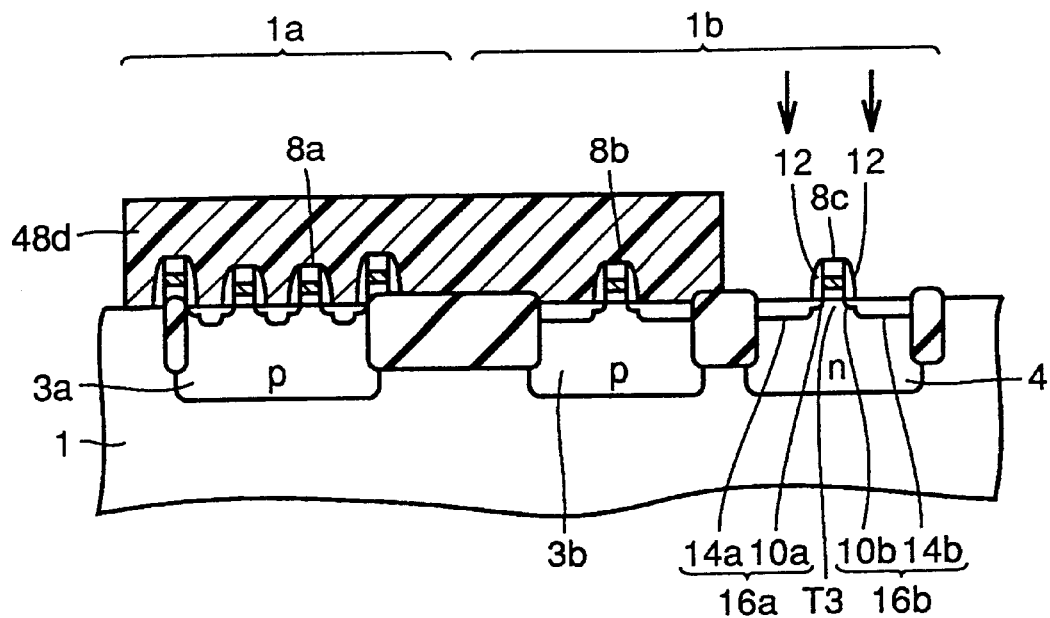
FIG. 63 is a cross sectional view showing a step carried out after that shown in FIG. 62.
Figure 66:
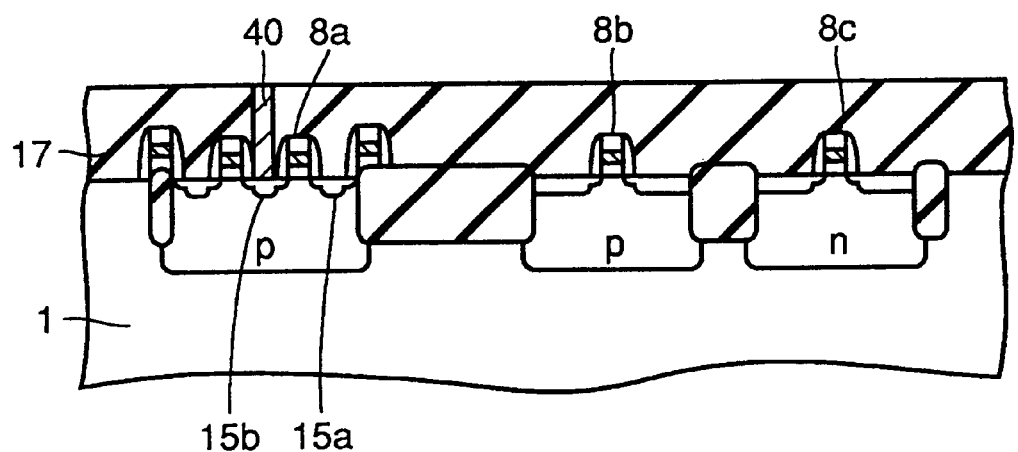
FIG. 66 is a cross sectional view showing a step carried out after that shown in FIG. 65.
Figure 67:
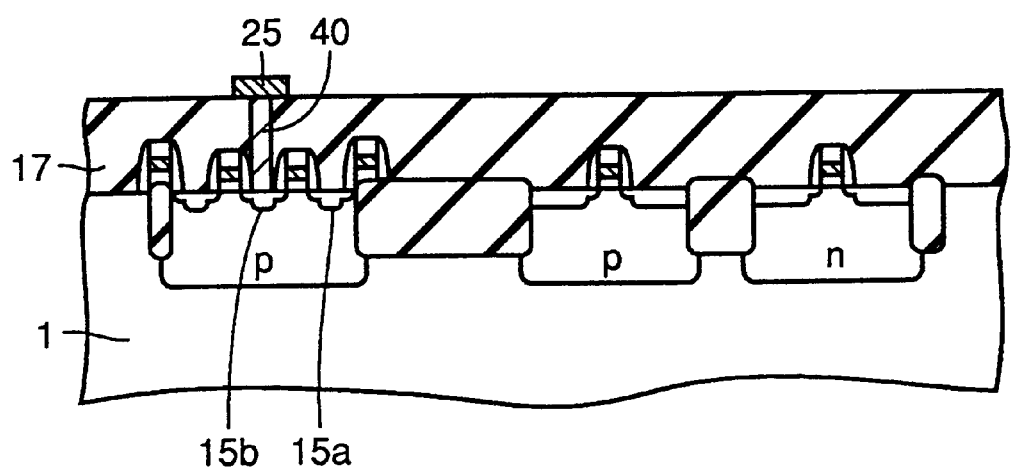
FIG. 67 is a cross sectional view showing a step carried out after that shown in FIG. 66.
Figure 68:
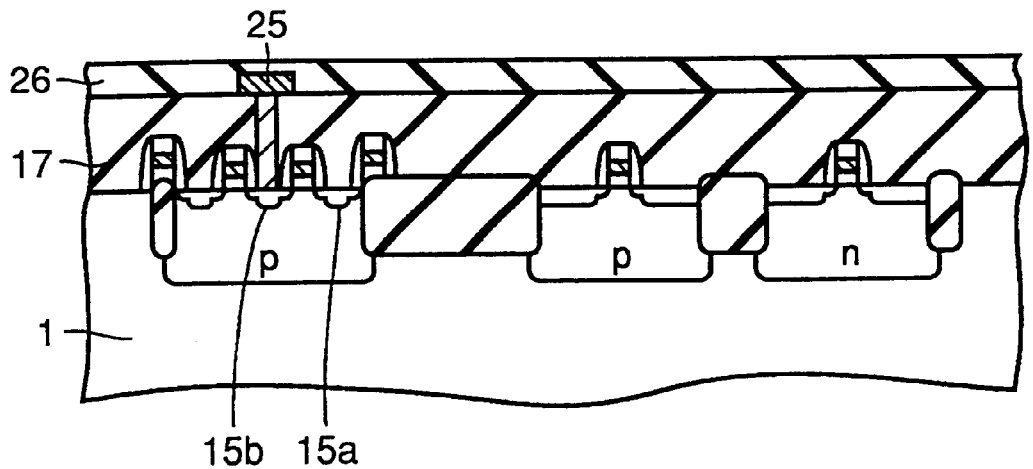
FIG. 68 is a cross sectional view showing a step carried out after that shown in FIG. 67.
Figure 69:
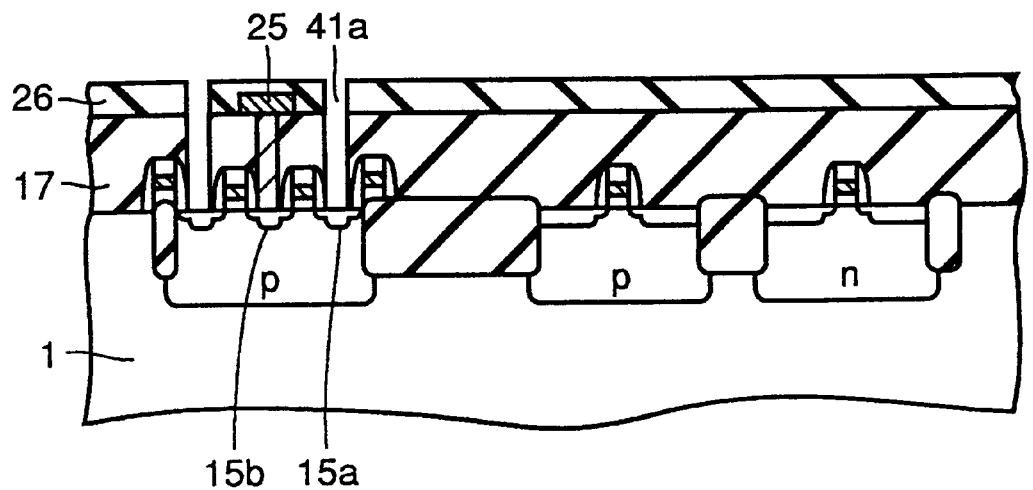
FIG. 69 is a cross sectional view showing a step carried out after that shown in FIG. 68.
Figure 70:
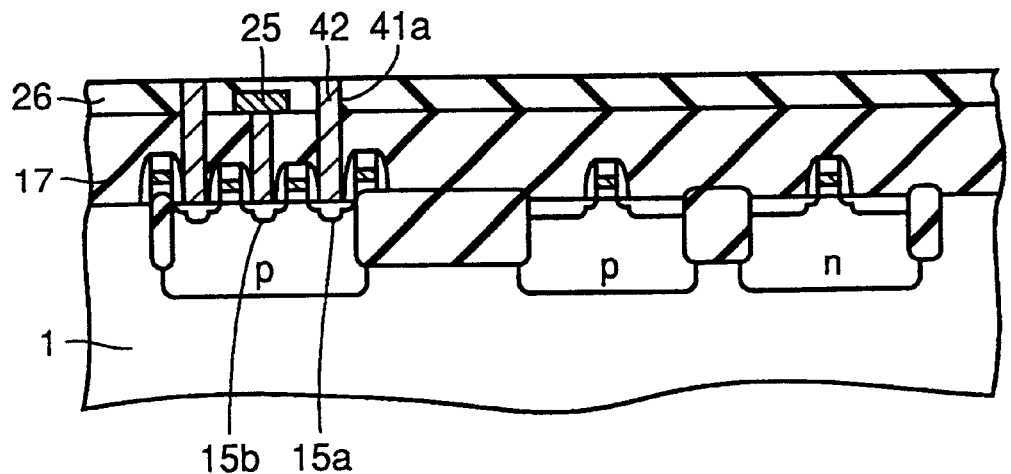
FIG. 70 is a cross sectional view showing a step carried out after that shown in FIG. 69.
Figure 71:
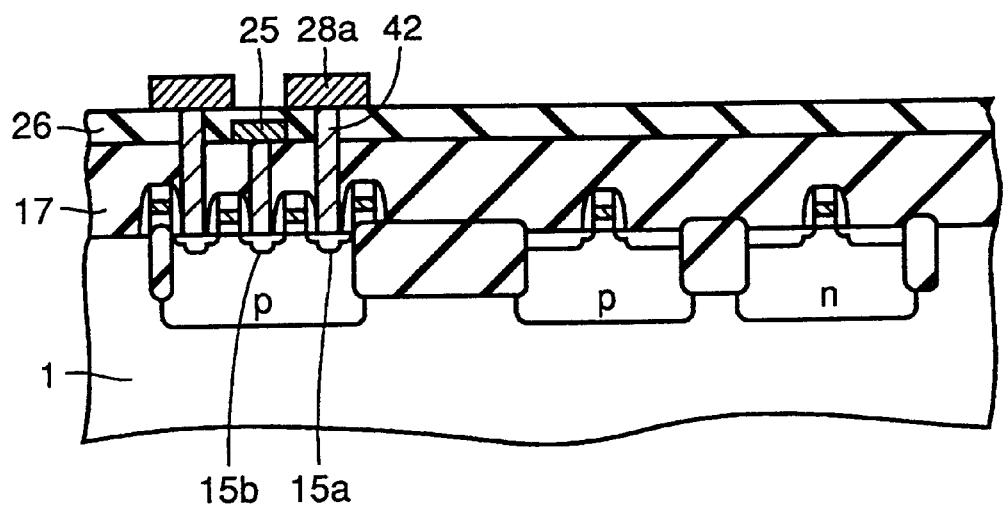
FIG. 71 is a cross sectional view showing a step carried out after that shown in FIG. 70.
Figure 72:
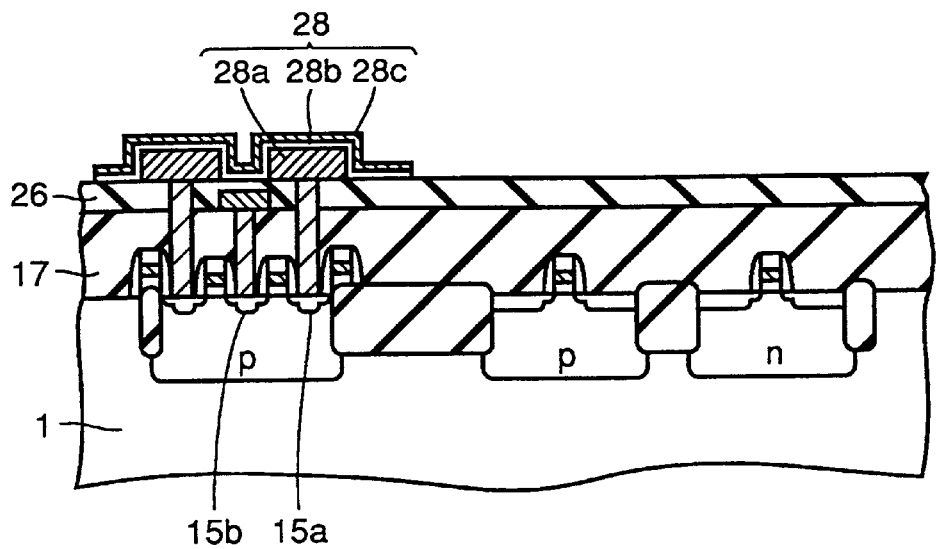
FIG. 72 is a cross sectional view showing a step carried out after that shown in FIG. 71.
Figure 73:
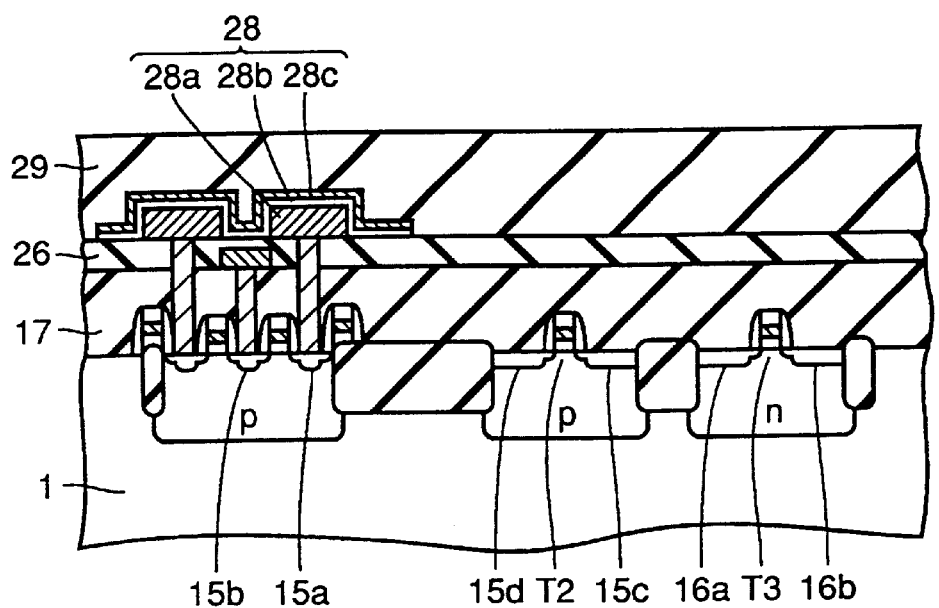
FIG. 73 is a cross sectional view showing a step carried out after that shown in FIG. 72.
Figure 74:
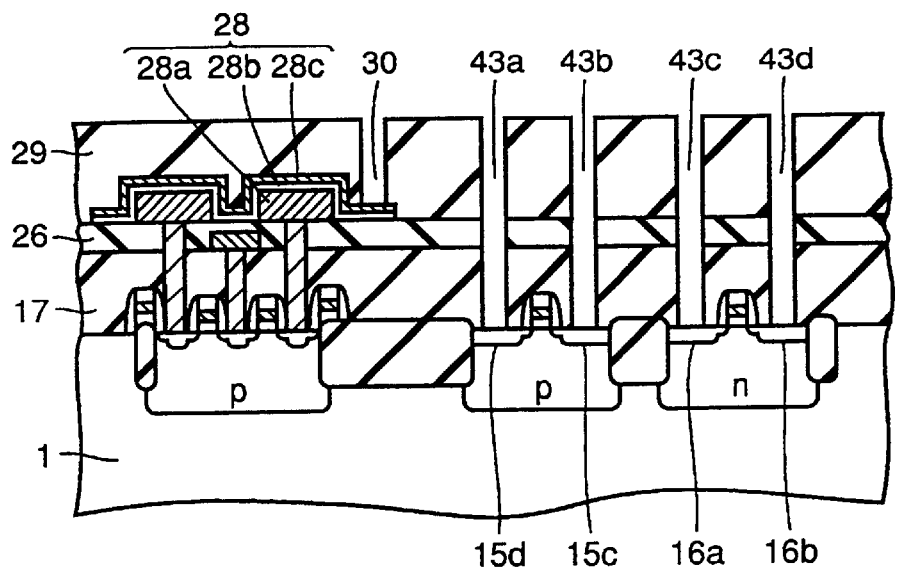
FIG. 74 is a cross sectional view showing a step carried out after that shown in FIG. 73.
Figure 75:
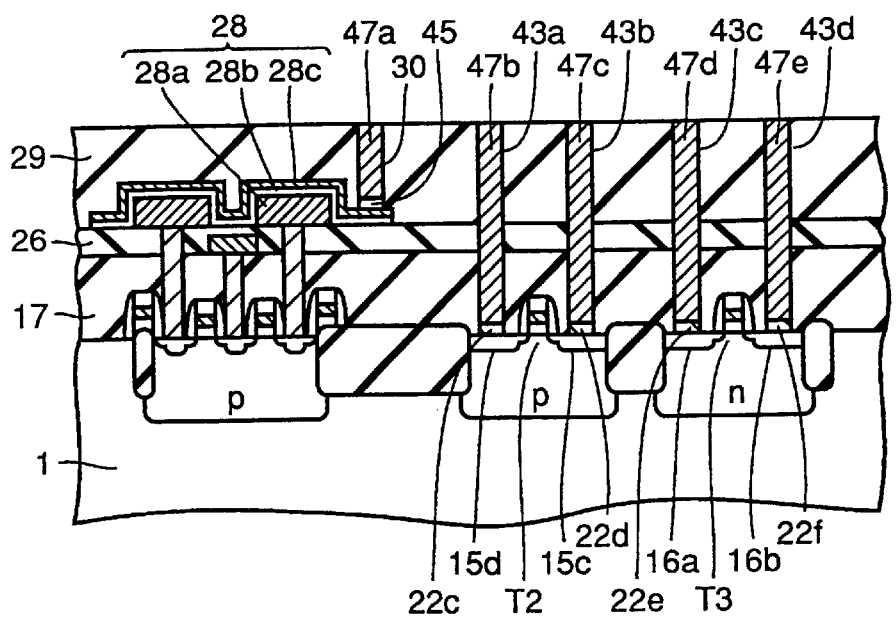
FIG. 75 is a cross sectional view showing a step carried out after that shown in FIG. 74.
Figure 76:
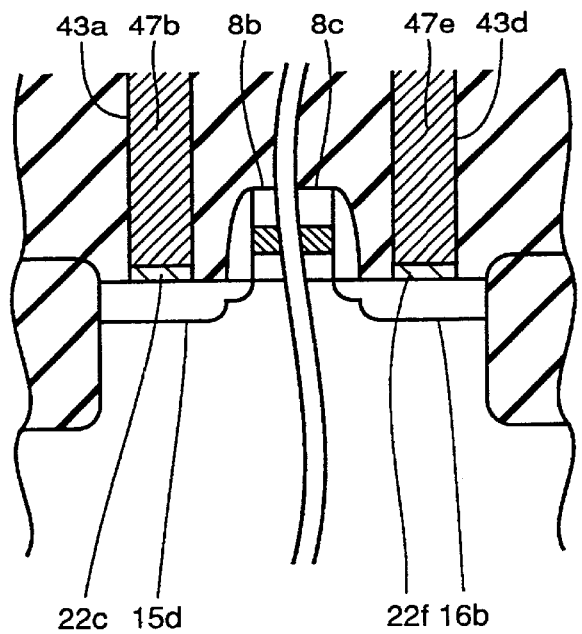
FIG. 76 is a partially enlarged cross sectional view of the step shown in FIG. 75.
Figure 77:
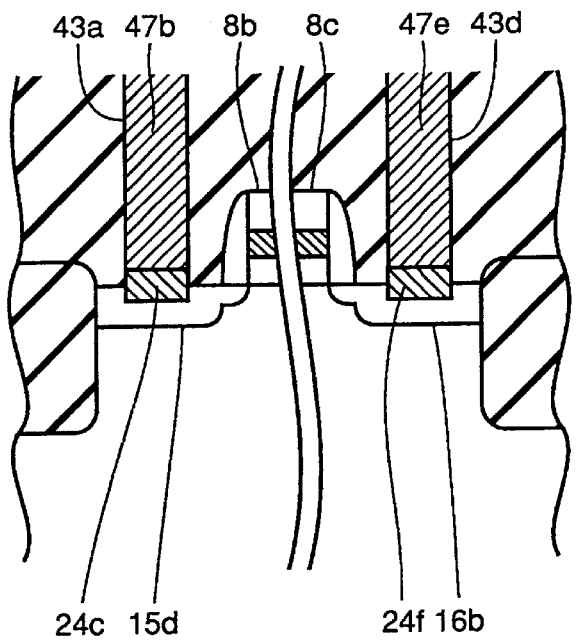
FIG. 77 is a partially enlarged cross sectional view showing a step carried out after that shown in FIG. 76.
Figure 78:
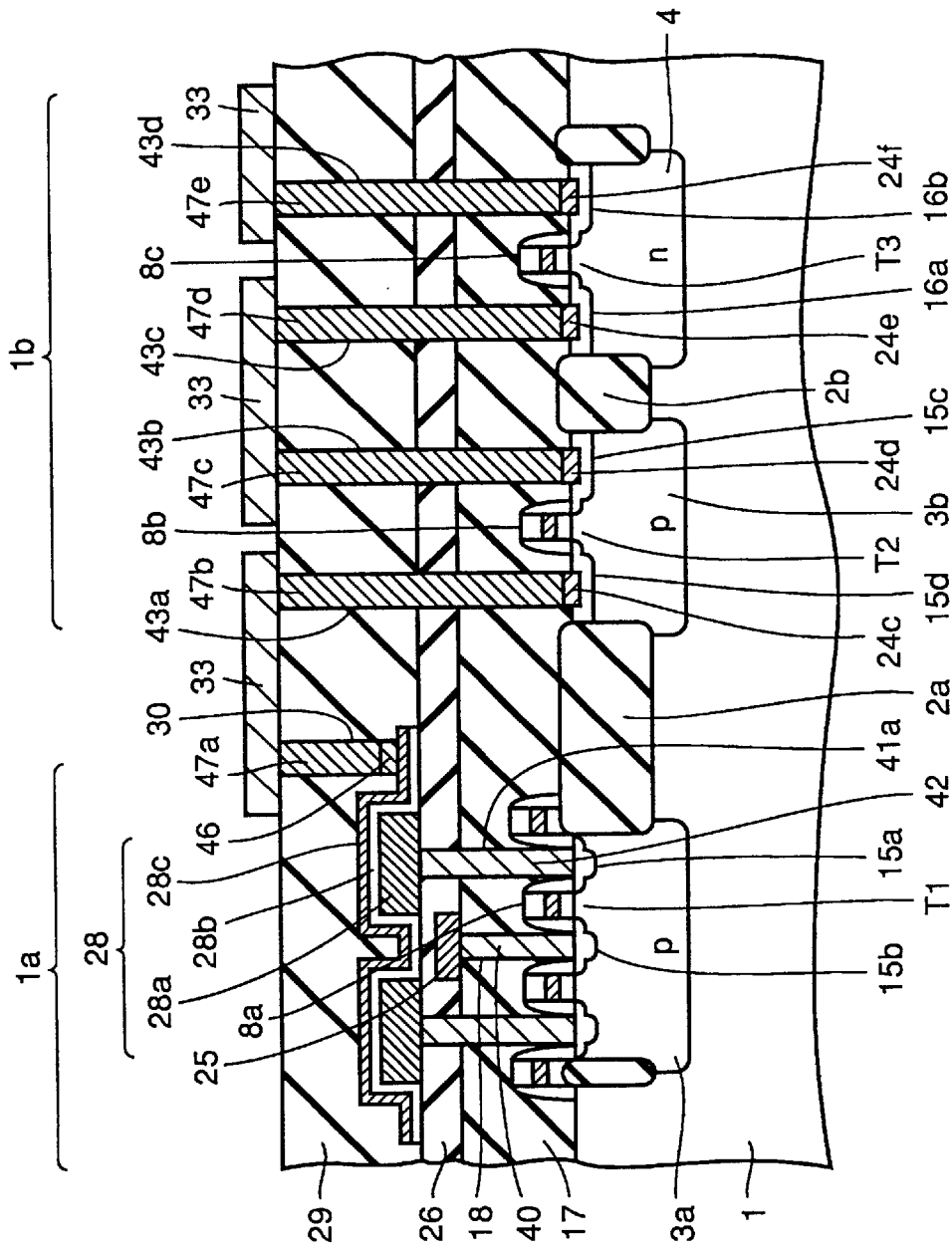
FIG. 78 is a cross sectional view showing the DRAM according to the first prior art.
Figure 79:
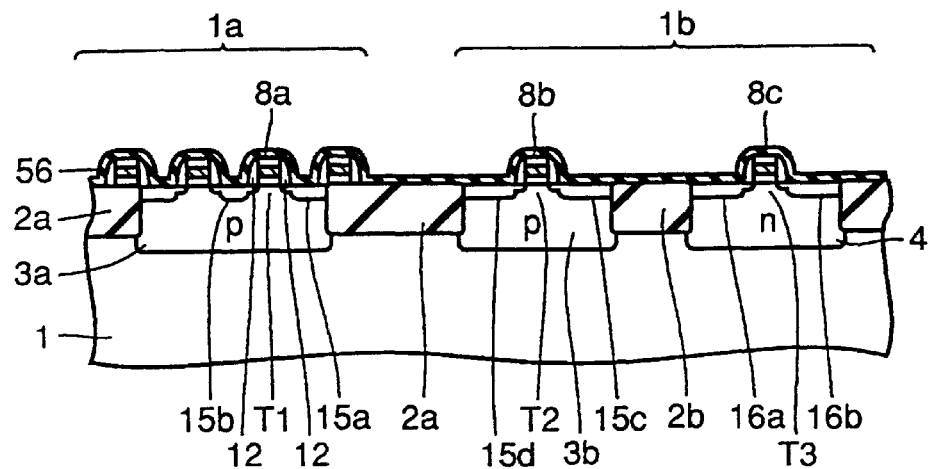
FIG. 79 is a cross sectional view showing a step in a method of fabricating a DRAM according to second prior art.
Figure 80:
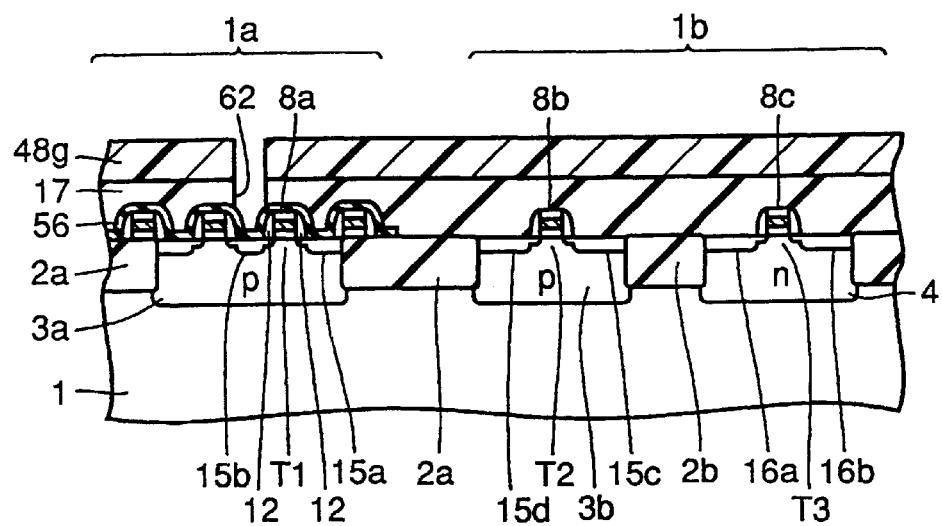
FIG. 80 is a cross sectional view showing a step carried out after that shown in FIG. 79.
Figure 81:
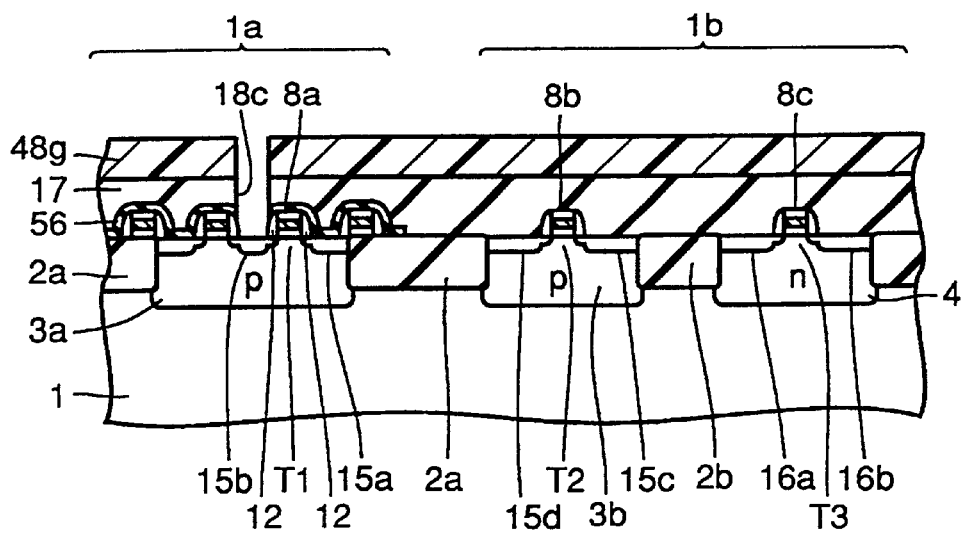
FIG. 81 is a cross sectional view showing a step carried out after that shown in FIG. 80.
Figure 82:
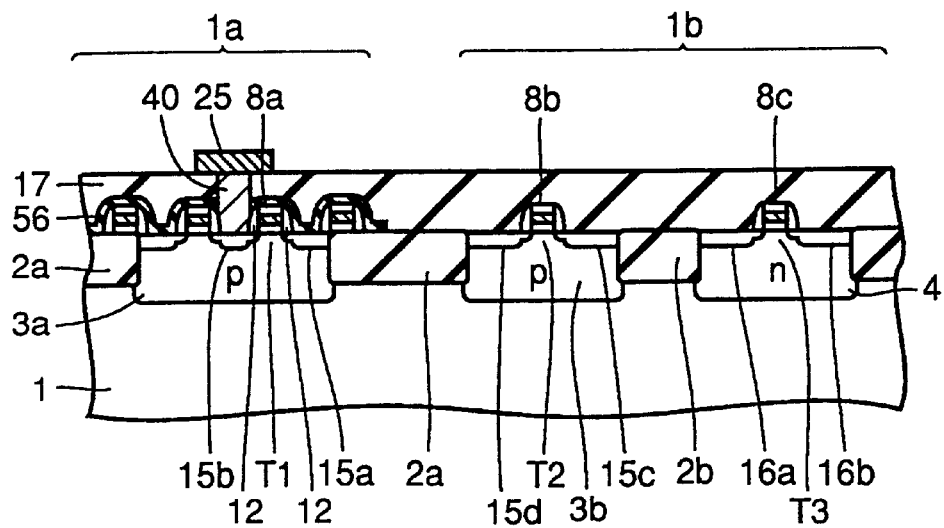
FIG. 82 is a cross sectional view showing a step carried out after that shown in FIG. 81.
Figure 83:
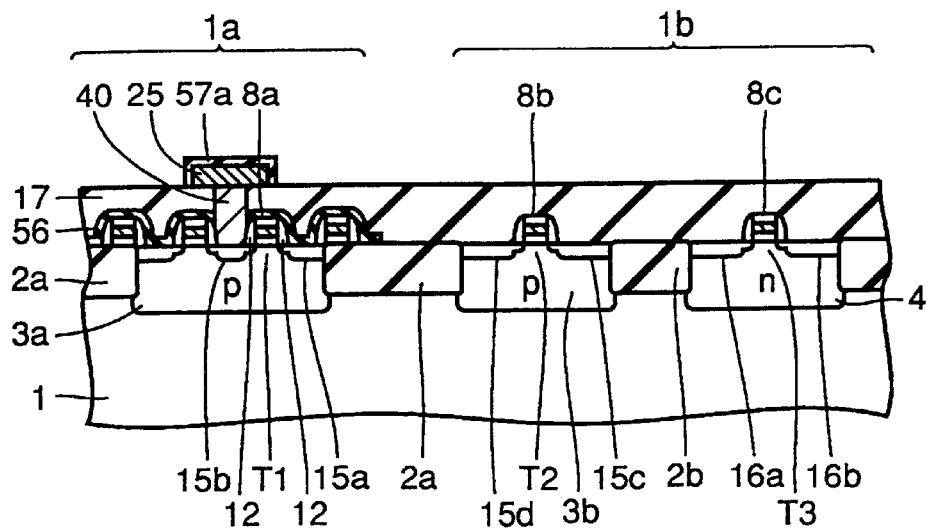
FIG. 83 is a cross sectional view showing a step carried out after that shown in FIG. 82.
Figure 84:
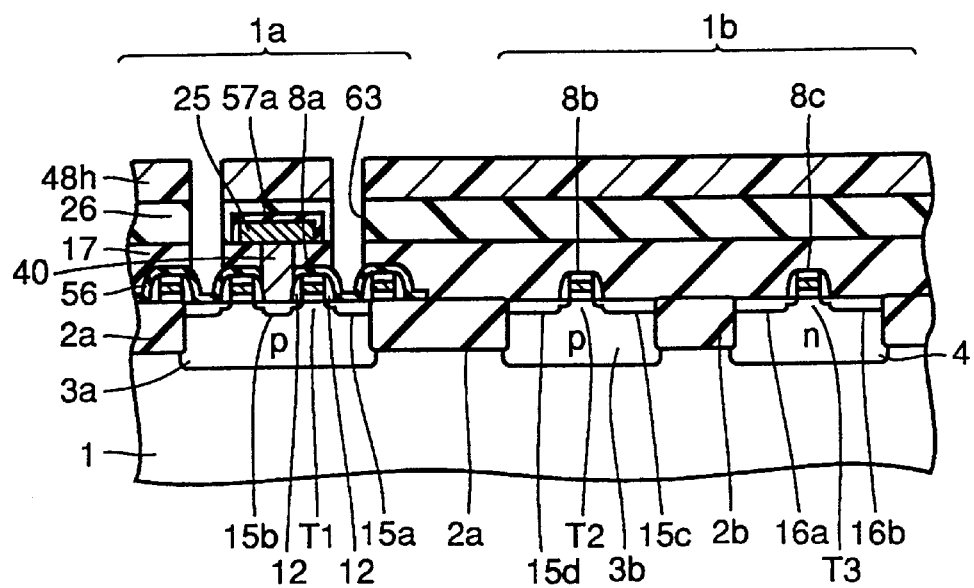
FIG. 84 is a cross sectional view showing a step carried out after that shown in FIG. 83.
Figure 85:
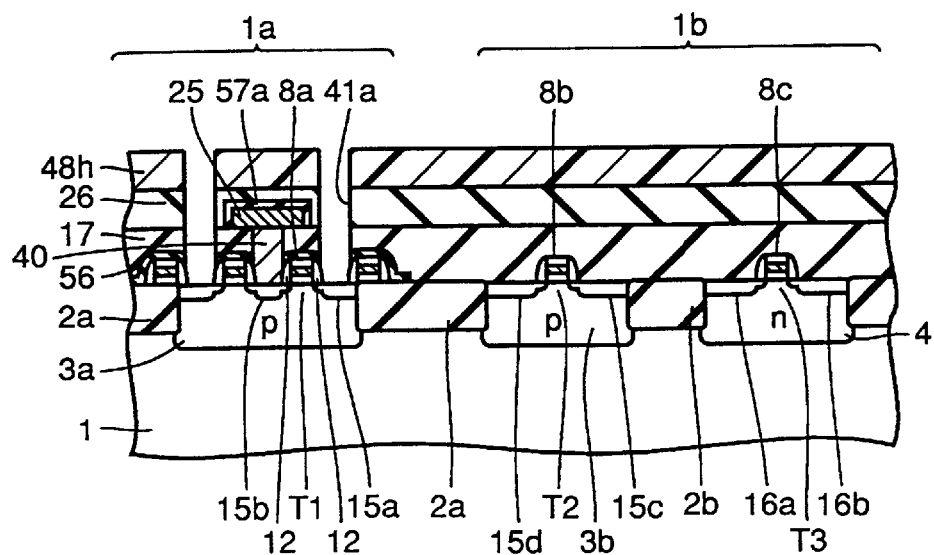
FIG. 85 is a cross sectional view showing a step carried out after that shown in FIG. 84.
Figure 86:
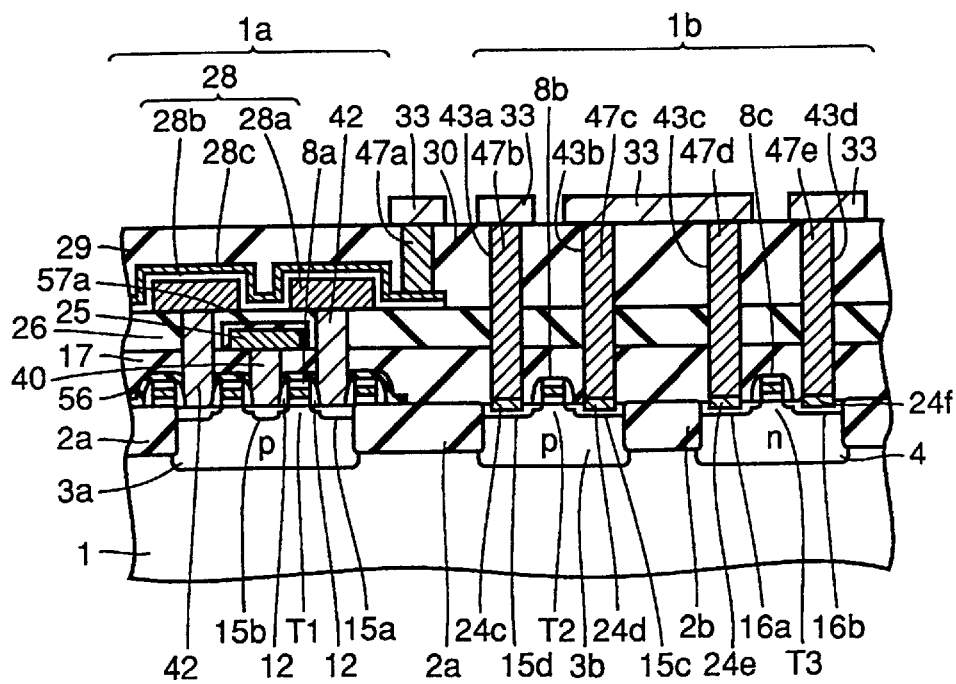
FIG. 86 is a cross sectional view of the DRAM according to the second prior art.
Figure 87:
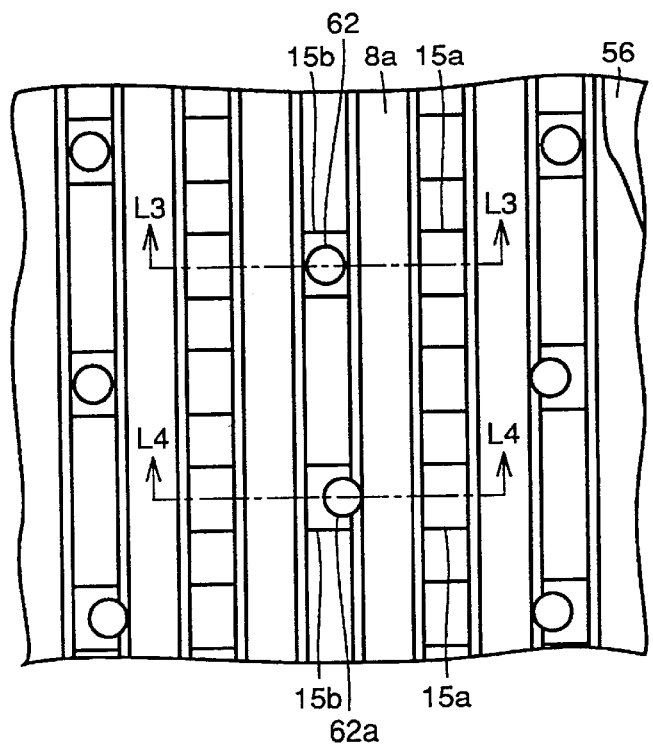
FIG. 87 is a plan view of the step shown in FIG. 80.
Figure 88:
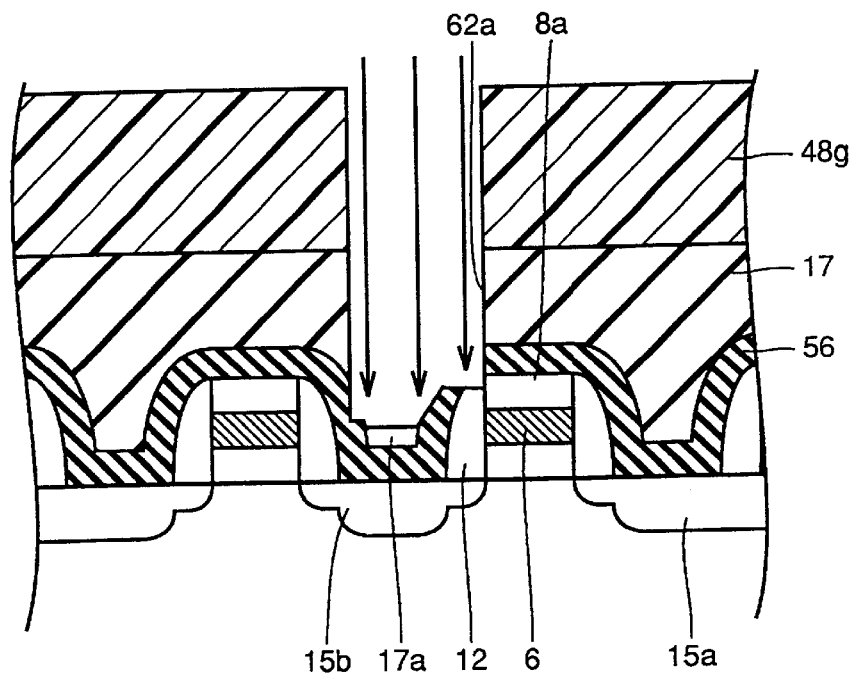
FIG. 88 is a cross sectional view taken along the line L4—L4 in FIG. 84.

Even if any bit line contact hole or storage node contact hole deviates from a prescribed position due to misalignment or the like as described above, a DRAM including a memory cell region la shown in FIG. 53 is formed. Also in such a DRAM, a bit line 25, a storage node 28a and a MOS transistor T1 are electrically connected on prescribed portions respectively, to be prevented from electrical shorts in portions other than the prescribed ones.

Further, the fabrication method according to the embodiment 8 of the present invention attains the following additional effects as compared with that according to the embodiment 6:

As the first effect, the number of the steps can be reduced in this embodiment. According to the embodiment 8, the epitaxial silicon growth layers 37a and 37b can be selectively formed only on the n-type source/drain regions 15a and 15b of the memory cell region 1a. Therefore, the sidewall oxide films 12 may not be independently formed in the memory cell region la and the peripheral circuit region 1b for selectively forming the epitaxial silicon growth layers 37a and 37b only on the n-type source/drain regions 15a and 15b as shown in FIGS. 29 to 31 in relation to the embodiment 6, but can be formed through a single step. Consequently, the number of the steps can be reduced.

As the second effect, the ratio (aspect ratio) of a component (component A) growing in parallel with the surface of the silicon substrate 1 to that (component B) growing perpendicularly to this surface can be more readily controlled in the growing process of the epitaxial silicon growth layers 37a and 37b in the embodiment 8, as compared with the embodiment 6. This effect is now described in detail.

In the embodiment 6 of the present invention, the epitaxial silicon growth layers 37a and 37b are formed in the step shown in FIG. 30. At this time, no insulator film such as a silicon oxide film is formed on the element isolation oxide film 2a of the memory cell region 1a, except a part of the gate electrode portion 8a. In the embodiment 8, on the other hand, the epitaxial silicon growth layers 37a and 37b are formed in the step shown in FIG. 43. At this time, the silicon nitride film 56a and the silicon oxide film 17 are formed on the element isolation oxide film 2a of the memory cell region 1a to cover the gate electrode portion 8a, in addition to the part of the gate electrode portion 8a. When the epitaxial silicon growth layers 37a and 37b are formed in each element forming region A, therefore, the silicon nitride film 56a and the silicon oxide film 17 are present between adjacent ones of the adjacent epitaxial silicon growth layers 37a and 37b located along the longitudinal direction of the gate electrode 8a, as shown in FIG. 50 in particular. Thus, electrical insulation between the adjacent ones of the epitaxial silicon growth layers 37a and 37b is maintained in the growth process, regardless of the component A.

In the embodiment 6, however, no such insulator films are present in formation of the epitaxial silicon growth layers 37a and 37b. Depending on the component A, therefore, the epitaxial silicon growth layer may extend over the element isolation oxide film 2a, to be electrically shorted with the adjacent one. In order to prevent this, the components A and B must be so controlled that such adjacent epitaxial silicon growth layers are not in contact with each other. In the embodiment 8 requiring no particular consideration of the component A, therefore, the aspect ratio can be more readily controlled in formation of the epitaxial silicon growth layers 37a and 37b, as compared with the embodiment 6.

As the third effect, margins for misalignment in photolithography are increased in formation of the bit line contact hole 18a and the storage node contact hole 50a in the embodiment 8, as compared with the embodiment 6. This effect is now described in detail.

If photolithography is misaligned particularly in the longitudinal direction of the gate electrode portion 8a in formation of the bit line contact hole 18a in the silicon oxide film 17 in the embodiment 6 as shown in FIG. 33, for example, the bit line contact hole 18a may expose the element isolation oxide film 2a which is located under the silicon oxide film 17 or a part of the gate electrode portion 8a.

In the embodiment 8, on the other hand, the bit line contact hole 18a is formed in the silicon oxide film 17, as shown in FIG. 51. At this time, the silicon nitride film 56a is formed under the silicon oxide film 17 except the element forming region A. Thus, only the silicon oxide film 17 can be etched while substantially leaving the silicon nitride film 56a. Even if photolithography is misaligned in the longitudinal direction of the gate electrode portion 8a, therefore, the silicon nitride film 56a can serve as a protective film for preventing the bit line contact hole 18a from exposing the element isolation oxide film 2a or a part of the gate electrode portion 8a. This also applies to the storage node contact hole 50a. Thus, the margins for misalignment of the photolithography in formation of the bit line contact hole 18a and the storage node contact hole 50a are increased in the embodiment 8, as compared with the embodiment 6.

While each of the embodiments has been described with reference to a DRAM serving as a semiconductor device, each of the aforementioned structures is also applicable to a semiconductor device other than the DRAM, for obtaining a semiconductor device which reduces leakage currents, attains a high-speed operation and has excellent electrical insulation and connectability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
 a semiconductor substrate having a major surface;
 a first region being formed on said major surface of said semiconductor substrate;
 a first impurity region being formed on a surface of said first region;
 a first conductor layer being formed on a surface of said first impurity region;

a second conductor layer being formed on said first conductor layer;

a third conductor layer being formed on said second conductor layer;

a first insulator layer being formed on said semiconductor substrate to enclose said first to third conductor layers; and a first conductor region being formed on said first insulator layer and electrically connected with said third conductor layer, said first conductor region having a bottom surface substantially parallel to and in contact with a top surface of said first insulator layer;

said first conductor layer containing silicon, said second conductor layer containing a compound of silicon and a prescribed metal, said third conductor layer containing prescribed said metal or a compound of said metal and having an upper surface entirely in contact with said first conductor region;

wherein the first conductor region is formed on the third conductor layer and the whole of the first conductor region is formed above the first insulator layer;

wherein said first insulator layer has a first contact hole exposing a surface of said first conductor layer and said second and third conductor layers are fonned in said first contact hole;

a pair of source/drain regions being provided on a major surface of said first region at a space, and a gate electrode being formed on a region of said semiconductor substrate being held between respective ones of said source/drain regions with a gate insulator film interposed, wherein one of said source/drain regions includes said first impurity region, and said first conductor layer is formed in the vicinity of said gate electrode to partially cover said gate electrode while being electrically insulated from said gate electrode.

2. The semiconductor device in accordance with claim 1, wherein said first region includes a plurality of element forming regions and an clement isolation region electrically insulating said element forming regions from each other, and said gate electrode includes a first gate electrode portion extending on each said element forming region and a second gate electrode portion being connected with said first gate electrode portion and extending on said element isolation region, said semiconductor device further including a second protective layer being formed under said first insulator layer to cover said second gate electrode portion.

3. A semiconductor device comprising:

a semiconductor substrate having a major surface;

a first region being formed on said major surface of said semiconductor substrate;

a first impurity region being formed on a surface of said first region;

a first conductor layer being formed on a surface of said first impurity region;

a second conductor layer being formed on said first conductor layer;

a third conductor layer being formed on said second conductor layer;

a first insulator layer being formed on said semiconductor substrate to enclose said first to third conductor layers; and a first conductor region being formed on said first insulator layer and electrically connected with said third conductor layer, said first conductor region having a bottom surface substantially parallel to and in contact with a top surface of said first insulator layer;

said first conductor layer containing silicon, said second conductor layer containing a compound of silicon and a prescribed metal, said third conductor layer containing prescribed said metal or a compound of said metal and having an upper surface entirely in contact with said first conductor region;

wherein the first conductor region is formed on the third conductor layer and the whole of the first conductor region is formed above the first insulator layer, a second impurity region being formed on a major surface of said first region at a space from said first impurity region, a fourth conductor layer, containing silicon, being formed on a surface of said second impurity region a first protective layer being formed to cover a surface of said first conductor region, and a second insulator layer being formed on said first insulator layer to cover said first protective layer, wherein said first and second insulator layers have a second contact hole exposing a surface of said fourth conductor layer, said semiconductor device further including:

a fifth conductor layer, containing a compound of silicon and prescribed said metal, being formed in said second contact hole and electrically connected with said fourth conductor layer, a sixth conductor layer, containing prescribed said metal or a compound of said metal, being formed on said fifth conductor layer in said second contact hole, and a second conductor region being formed on said second insulator layer and electrically connected with said sixth conductor layer.

4. The semiconductor device in accordance with claim 3, wherein the other one of said pair of source/drain regions includes said second impurity region, and said gate electrode is formed on a region being held between said first and second impurity regions.

5. The semiconductor device in accordance with claim 3, further including:

a second region being formed on said major surface of said semiconductor substrate and electrically insulated from said first region, a third impurity region being formed on a surface of said second region, and a third insulator layer being formed on said second insulator layer to cover said first and second regions, wherein said first and second insulator layers have a third contact hole exposing a surface of said third impurity region, said third insulator layer has a fourth contact hole communicating with said third contact hole, and said third insulator layer has a fifth contact hole exposing a surface of said second conductor region, said semiconductor device further including:

a first columnar conductor being formed in said third contact hole and electrically connected with said third impurity region, a second columnar conductor being formed in said fourth contact hole and electrically connected with said first columnar conductor, a third columnar conductor being formed in said fifth contact hole, a first wiring layer being electrically connected with said second columnar conductor and formed on said third insulator layer, and a second wiring layer being electrically connected with said third columnar conductor and formed on said third insulator layer.

6. The semiconductor device in accordance with claim 5, wherein said first and second wiring layers are formed by the same layer.

7. The semiconductor device in accordance with claim 5, further including a relay conductor, larger in sectional area than said first columnar conductor, being formed on said second insulator layer to intervene between said first and second columnar conductors.

8. The semiconductor device in accordance with claim 7, wherein said relay conductor is formed by the same layer as said second conductor region.

9. A semiconductor device comprising:

a semiconductor substrate having a major surface;

a first region being fotned on said major surface of said semiconductor substrate;

a first impurity region being formed on a surface of said first region;

a first conductor layer being formed on a surface of said first impurity region;

a second conductor layer being formed on said first conductor layer;

a third conductor layer being formed on said second conductor layer;

a first insulator layer being formed on said semiconductor substrate to enclose said first to third conductor layers; and a first conductor region being formed on said first insulator layer and electrically connected with said third conductor layer, said first conductor region having a bottom surface substantially parallel to and in contact with a top surface of said first insulator layer;

said first conductor layer containing silicon, said second conductor layer containing a compound of silicon and a prescribed metal, said third conductor layer containing prescribed said metal or a compound of said metal and having an upper surface entirely in contact with said first conductor region, wherein the first conductor region is formed on the third conductor layer and the whole of the first conductor region is formed above the first insulator layer, a third region being formed on said major surface of said semiconductor substrate and electrically insulated from said first region, a fourth impurity region being formed on a surface of said third region, and a fourth insulator layer being formed on said first insulator layer to cover said first and third regions, wherein said first insulator layer has a sixth contact hole exposing a surface of said fourth impurity region, said fourth insulator layer has a seventh contact hole communicating with said sixth contact hole, and said fourth insulator layer has an eighth contact hole exposing a surface of said first conductor region, said semiconductor device further including:

a fourth columnar conductor being formed in said sixth contact hole and electrically connected with said fourth impurity region, a fifth columnar conductor being formed in said seventh contact hole and electrically connected with said fourth columnar conductor, a sixth columnar conductor being formed in said eighth contact hole, and a third wiring layer being electrically connected with said fifth and sixth columnar conductors and formed on said fourth insulator layer.

10. The semiconductor device in accordance with claim 1, wherein the second conductor layer is in contact with a part of a top surface of the first conductor layer and the third conductor layer is in contact with the entire top surface of the second conductor layer.

11. The semiconductor device in accordance with claim 3, wherein the second conductor layer is in contact with a part of a top surface of the first conductor layer and the third conductor layer is in contact with the entire top surface of the second conductor layer.

12. The semiconductor device in accordance with claim 9, wherein the second conductor layer is in contact with a part of a top surface of the first conductor layer and the third conductor layer is in contact with the entire top surface of the second conductor layer.

* * * * *